United States Patent
Oshiyama et al.

(10) Patent No.: US 10,774,261 B2
(45) Date of Patent: Sep. 15, 2020

(54) ORGANIC ELECTROLUMINESCENCE ELEMENT, ILLUMINATION DEVICE, AND DISPLAY DEVICE

(71) Applicant: Konica Minolta, Inc., Chiyoda-ku, Tokyo (JP)

(72) Inventors: Tomohiro Oshiyama, Hachioji (JP); Shinya Otsu, Musashino (JP); Rie Katakura, Hino (JP); Satoru Inoue, Hino (JP)

(73) Assignee: KONICA MINOLTA, INC., Tokyo (JP)

( * ) Notice: Subject to any disclaimer, the term of this patent is extended or adjusted under 35 U.S.C. 154(b) by 539 days.

(21) Appl. No.: 14/651,023

(22) PCT Filed: Dec. 6, 2013

(86) PCT No.: PCT/JP2013/082802
§ 371 (c)(1),
(2) Date: Jun. 10, 2015

(87) PCT Pub. No.: WO2014/092014
PCT Pub. Date: Jun. 19, 2014

(65) Prior Publication Data
US 2015/0318489 A1    Nov. 5, 2015

(30) Foreign Application Priority Data
Dec. 10, 2012    (JP) .................. 2012-269238

(51) Int. Cl.
*H01L 51/00* (2006.01)
*C09K 11/06* (2006.01)
*H01L 51/50* (2006.01)

(52) U.S. Cl.
CPC ............ *C09K 11/06* (2013.01); *H01L 51/005* (2013.01); *H01L 51/0052* (2013.01);
(Continued)

(58) Field of Classification Search
CPC ............ H01L 51/0065; H01L 51/0067; H01L 51/0068; H01L 51/0072–0074;
(Continued)

(56) References Cited

U.S. PATENT DOCUMENTS

| | | |
|---|---|---|
| 2009/0200925 A1 | 8/2009 | Naito et al. |
| 2011/0006670 A1* | 1/2011 | Katakura ............. C07D 403/10 313/504 |

(Continued)

FOREIGN PATENT DOCUMENTS

| | | |
|---|---|---|
| EP | 2166583 A1 | 3/2010 |
| EP | 2677561 A1 | 12/2013 |

(Continued)

OTHER PUBLICATIONS

Extended European Search Report corresponding to Application No. 13862236.0-1375/2930763, PCT/JP2013/082802; dated Sep. 2, 2016.

(Continued)

*Primary Examiner* — Ruiyun Zhang
(74) *Attorney, Agent, or Firm* — Cantor Colburn LLP

(57) ABSTRACT

An organic electroluminescence element includes: an anode; a cathode; and a luminous layer. The luminous layer includes: a luminescent dopant having a reorganization energy of 0 eV to 0.7 eV in electron transition from a ground state ($S_0$) to a lowest excited triplet state ($T_1$); and a host compound having a reorganization energy of 0 eV to 0.3 eV in electron transfer reaction between a ground state ($S_0$) and an anionic radical state (AR), and having a molecular weight within a range of 500 to 3000.

10 Claims, 4 Drawing Sheets

(52) U.S. Cl.
CPC ...... *H01L 51/0054* (2013.01); *H01L 51/0067* (2013.01); *H01L 51/0068* (2013.01); *H01L 51/0072* (2013.01); *H01L 51/0073* (2013.01); *H01L 51/0074* (2013.01); *H01L 51/0084* (2013.01); *H01L 51/0085* (2013.01); *C09K 2211/1011* (2013.01); *C09K 2211/1029* (2013.01); *C09K 2211/1044* (2013.01); *C09K 2211/1059* (2013.01); *C09K 2211/1074* (2013.01); *C09K 2211/1088* (2013.01); *C09K 2211/1092* (2013.01); *C09K 2211/185* (2013.01); *H01L 51/5016* (2013.01); *H01L 2251/55* (2013.01)

(58) Field of Classification Search
CPC ............. H01L 51/0084; H01L 51/0085; H01L 51/5016; H01L 2251/55; C09K 2211/1011; C09K 2211/1029; C09K 2211/1044; C09K 2211/1059; C09K 2211/1074; C09K 2211/1088; C09K 2211/1092; C09K 2211/185; C09K 11/06
USPC ................... 428/690, 917; 313/504; 257/40, 257/E51.028; 548/440; 564/429
See application file for complete search history.

(56) References Cited

U.S. PATENT DOCUMENTS

| | | | |
|---|---|---|---|
| 2012/0086329 | A1 | 4/2012 | Dyatkin |
| 2013/0049576 | A1* | 2/2013 | Katakura ............... C09K 11/06 313/504 |

FOREIGN PATENT DOCUMENTS

| | | | |
|---|---|---|---|
| JP | 2004273389 | A | 9/2004 |
| JP | 2005023071 | A | 1/2005 |
| JP | 2007035678 | A | 2/2007 |
| JP | 2007091719 | A | 4/2007 |
| JP | 2008159741 | A | 7/2008 |
| JP | 2010135467 | A | 6/2010 |
| WO | 2004085450 | A2 | 10/2004 |
| WO | 2009008099 | A1 | 1/2009 |
| WO | 2009008100 | A1 | 1/2009 |
| WO | 2012098996 | A1 | 7/2012 |
| WO | 2012111548 | A1 | 8/2012 |

OTHER PUBLICATIONS

Korean Notice of Preliminary Rejection corresponding to 10-2015-7014992, dated Jan. 25, 2017, with english translation.
International Preliminary Report on Patentability and Written Opinion of the International Searching Authority corresponding to Application No. PCT/JP2013/082802; dated Jun. 16, 2015, with English translation.
Hisahiro Sasabe et al., "High-Efficiency Blue and White Organic Light-Emitting Devices Incorporating a Blue Iridium Carbene Complex," Advanced Materials, vol. 22, 2010, pp. 5003-5007.
International Search Report corresponding to Application No. PCT/JP2013/082802; dated Mar. 11, 2014, with English translation.
W.Q. Deng et al., "Predictions of Hole Mobilities in Oligoacene Organic Semiconductors from Quantum Mechanical Calculations," J. Phys. Chem. B, vol. 108, No. 25, 2004, pp. 8614-8621.
Y. Sakurai et al., "Development of Novel Phosphorescent Pt (II) Complexes with Extended pi-conjugation Ligands for Red Electroluminescence," The 71st Annual Meeting; The Japan Society of Applied Physics (Autumn 2010, Nagasaki University).
European Office Action for corresponding Application No. 13862236.0-1375; dated Jul. 25, 2017.
Japanese Office Action for corresponding Application No. 2014-552018; dated Jul. 4, 2017.
European Office Action corresponding to Application No. 13862236.0-1105/2930763; dated Aug. 30, 2019.

* cited by examiner

L

L

ORGANIC ELECTROLUMINESCENCE ELEMENT, ILLUMINATION DEVICE, AND DISPLAY DEVICE

CROSS REFERENCE TO RELATED APPLICATIONS

This is the U.S. national stage of application No. PCT/JP2013/082802 filed on Dec. 6, 2013. Priority under 35 U.S.C. § 119(a) and 35 U.S.C. § 365(b) is claimed from Japanese Application No. 2012-269238 filed on Dec. 10, 2012; the disclosure of which is also incorporated herein by reference.

TECHNICAL FIELD

The present invention relates to an organic electroluminescence element, an illumination device, and a display device, particularly to an organic electroluminescence element, an illumination device, and a display device which have a low driving voltage, high luminous efficiency, long-term durability, reduced dark spots, and high retention of coating solution.

BACKGROUND ART

Electroluminescent displays (ELDs) are conventional light-emitting electronic display devices ELDs include components such as inorganic electroluminescence elements and organic electroluminescence elements (hereinafter, also referred to as organic EL elements). Inorganic electroluminescence elements, which have been used as planar light source, require high AC voltage to be driven.

An organic EL element usually has a luminous layer containing a luminescent compound disposed between a cathode and an anode. In the organic EL element, electrons and holes are injected into the luminous layer to recombine therein, which generates excitons. The excitons are deactivated while emitting light. The organic EL element emits light (fluorescence or phosphorescence) in such a manner. Organic EL elements can emit light at a low voltage in the range of several volts to several tens of volts. Organic EL elements also provide a wide viewing angle and high visibility due to their self-luminescent characteristics. Organic EL elements are also attracting attention from the viewpoints of space saving and portability because they are full solid state thin-film element.

Since an organic EL element based on phosphorescence from the excited triplet had been reported by Princeton University, phosphorescent materials emitting at room temperature (25° C.) have been intensively studied toward practical use of organic EL elements.

The recently discovered organic EL elements based on phosphorescence have luminous efficiency theoretically raised by approximately four times in comparison with a conventional element based on fluorescence. Therefore, materials, layer structures and electrodes for light-emitting elements are researched and developed worldwide.

For example, many compounds, primarily heavy metal complexes such as iridium complexes, have been synthesized and used for luminous layers of organic electroluminescence elements (also referred to as organic EL elements).

Although an organic EL element based on phosphorescence is a system of great potential, major technical issues for the element are the way of controlling the position of the emissive center, particularly stable recombination inside the luminous layer and stable emission of light, as well as enhancement of the luminescent property of a phosphorescent dopant itself, from the viewpoints of efficiency and lifetime of the element.

In order to enhance the luminescent property of a phosphorescent dopant, there are two possible approaches: (1) an increase in the radiative rate constant (kr) and (2) a decrease in the non-radiative rate constant (knr), when the lowest excited triplet state ($T_1$) is deactivated to the ground state ($S_0$).

A possible specific measure for decreasing the non-radiative rate constant (knr) is steric control of the structure of a ligand of the phosphorescent dopant to reduce the structural change between the ground state and the excited state. With regard to the iridium complex, which is a typical phosphorescent dopant, one of examples of such a measure is control of the steric structure by a combined ligand of dibenzofuran and pyridine as disclosed in PTL 1, for example.

Similar applications are found on iridium complexes formed with phenylpyrazole derivatives (see PTL 2), phenylimidazole derivatives (see PTL 3), and derivatives containing a carbene moiety as a ligand (see NPL 1), and on a platinum complex (NPL 2). These complexes have a low reorganization energy, due to decreased structural changes between the ground state and the excited triplet state.

From the viewpoint of decreasing the reorganization energy to decrease the non-radiative rate constant (knr), extension of the conjugated system from naphthalene ring to pentacene ring is known to decrease a reorganization energy (see NPL 3). Such a method is based on the effect of delocalized electrons.

Regarding the reorganization energy of luminescent hosts, disclosed is the use of a host compound having a reorganization energy level of 0 eV to 0.50 eV when the host compound is converted into anionic radicals, which provides organic EL elements with improved properties, such as an increased luminance and a prolonged lifetime (PTLs 6 and 7).

Durability of a phosphorescent dopant varies widely depending not only on the luminescent dopant but also on a host compound used in combination with the luminescent dopant. Since the interaction between the host compound and the luminescent dopant in a film influences significantly on carrier mobility and the durability, the combination of the host compound and luminescent dopant may be an important factor for improved durability. Disclosed is a technique of enhancing luminous efficiency and heat resistance of elements with a host compound having a specific heterocyclic structure in combination with a luminescent dopant (PTLs 4 and 5).

Regarding the luminescent dopant, disclosed is use of a compound having a difference of 0 nm or more and 5 nm or less between a maximum emission wavelength on a shortest wavelength side in an emission spectrum measured at 300 K and that measured at 77 K, which provides organic EL elements with improved properties, such as enhanced luminous efficiency and a prolonged lifetime (PTL 8).

Unfortunately, these techniques are not satisfactory in terms of providing an organic EL element that has high luminous efficiency and low driving voltage, excels in heat resistance and raw storability, and has a long lifetime. A further solution is therefore being sought for a lower non-radiative rate constant (knr) of the luminescent dopant to enhance the luminous efficiency of the element, for combination of optimal host compound and luminescent compound to increase the durability of the element, and for achieving such improvements at the same time.

CITATION LIST

Patent Literature

PTL 1: Japanese Patent Application Laid-Open Publication No. 2005-23071
PTL 2: WO2004/085450
PTL 3: Japanese Patent Application Laid-Open Publication No. 2010-135467
PTL 4: WO2009/008099
PTL 5: WO2009/008100
PTL 6: Japanese Patent Application Laid-Open Publication No. 2004-273389
PTL 7: Japanese Patent Application Laid-Open Publication No. 2007-35678
PTL 8: WO2012/111548

Non Patent Literature

NPL 1: Hisahiro Sasabe et al., Advanced Materials, Vol. 22, pp. 5003-5007 (2010)
NPL 2: Yoshiaki Sakurai et al., The 71th Annual Meeting; The Japan Society of Applied Physics (Autumn 2010, Nagasaki University, 17p-ZK-5)
NPL 3: Wei-Qiao Deng and William A Goddard III, The Journal of Physical Chemistry, B, Vol. 108, pp. 8614-8621 (2004)

SUMMARY OF INVENTION

Problems to be Solved by Invention

The present invention has been accomplished under such a circumference, and an object of the invention is to provide an organic electroluminescence element, an illumination device and a display device which have a low driving voltage, high luminous efficiency, long-term durability, reduced dark spots, and high retention of coating solution.

Means for Solving Problems

The present inventors have been studying the source and solution of the problems described above, and have completed an organic electroluminescence element including a luminous layer, the luminous layer containing a luminescent dopant having a reorganization energy of 0 eV to 0.7 eV in the electron transition from the ground state ($S_0$) to the lowest excited triplet state ($T_1$), and a host compound having a reorganization energy of 0 eV to 0.3 eV in the electron transfer reaction between the ground state ($S_0$) and the anionic radical state (AR) and a molecular weight within a range of 500 to 3000. The inventors also have completed an organic electroluminescence element including a luminous layer, the luminous layer containing a luminescent dopant having a reorganization energy of 0 eV to 0.7 eV in the electron transition from the ground state ($S_0$) to the lowest excited triplet state ($T_1$) and a host compound represented by Formula (1), wherein the host compound has a molecular weight within a range of 500 to 3000. Such an organic electroluminescence element has a low driving voltage, high luminous efficiency, long-term durability, a low chromatic variation of light, reduced dark spots, and high retention of coating solution.

Concretely, the object of the present invention is achieved by the following means.

Embodiment 1: An organic electroluminescence element including: an anode; a cathode; and a luminous layer, wherein the luminous layer includes: a luminescent dopant having a reorganization energy of 0 eV to 0.7 eV in electron transition from a ground state ($S_0$) to a lowest excited triplet state ($T_1$); and a host compound having a reorganization energy of 0 eV to 0.3 eV in electron transfer reaction between a ground state ($S_0$) and an anionic radical state (AR), and having a molecular weight within a range of 500 to 3000.

Embodiment 2: The organic electroluminescence element of embodiment 1, wherein the luminescent dopant has the reorganization energy of 0 eV to 0.5 eV in the electron transition from the ground state ($S_0$) to the lowest excited triplet state ($T_1$).

Embodiment 3: The organic electroluminescence element of embodiments 1 or 2, wherein the host compound has the reorganization energy of 0 eV to 0.15 eV in the electron transfer reaction between the ground state ($S_0$) and the anionic radical state (AR).

Embodiment 4: An organic electroluminescence element including: an anode; a cathode; and a luminous layer, wherein the luminous layer includes: a luminescent dopant having a reorganization energy of 0 eV to 0.7 eV in electron transition from a ground state ($S_0$) to a lowest excited triplet state ($T_1$); and a host compound represented by Formula (1):

[Chemical Formula 1]

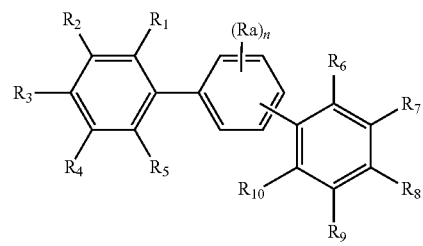

Formula (1)

when $R_1$ to $R_7$, $R_9$, $R_{10}$ and Ra each represent a hydrogen atom or a substituent group; $R_8$ represents a hydrogen atom; and n represents an integer of 0 to 4, the host compound having a molecular weight within a range of 500 to 3000.

Embodiment 5: The organic electroluminescence element of embodiment 4, wherein the luminescent dopant has the reorganization energy of 0 eV to 0.5 eV in the electron transition from the ground state ($S_0$) to the lowest excited triplet state ($T_1$).

Embodiment 6: The organic electroluminescence element of any one of embodiments 1 to 5, wherein the host compound is represented by Formula (2):

[Chemical Formula 2]

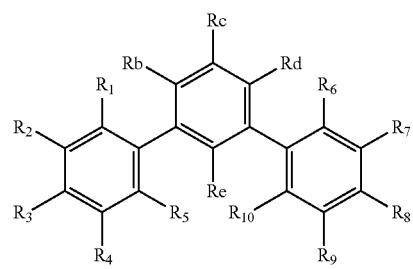

Formula (2)

when $R_1$ to $R_7$, $R_9$, $R_{10}$ and Rb to Re each represent a hydrogen atom or a substituent group; and $R_8$ represents a hydrogen atom.

Embodiment 7: The organic electroluminescence element of any one of embodiments 4 to 6, wherein at least one of $R_1$ to $R_7$, $R_9$, and $R_{10}$ in Formulae (1) and (2) is a carbazole ring group which optionally has a substituent.

Embodiment 8: The organic electroluminescence element of any one of embodiments 4 to 6, wherein only one of $R_1$ to $R_7$, $R_9$, and $R_{10}$ in Formulae (1) and (2) is a carbazole ring group which optionally has a substituent group.

Embodiment 9: The organic electroluminescence element of any one of embodiments 4 to 6, wherein at least one of $R_1$ to $R_7$, $R_9$, and $R_{10}$ in Formulae (1) and (2) is a dibenzofuran ring group which optionally has a substituent group.

Embodiment 10: The organic electroluminescence element of any one of embodiments 4 to 6, wherein only one of $R_1$ to $R_7$, $R_9$, and $R_{10}$ in Formulae (1) and (2) is a dibenzofuran ring group which optionally has a substituent group.

Embodiment 11: The organic electroluminescence element of any one of embodiments 4 to 6, wherein only one of $R_1$ to $R_7$, $R_9$, and $R_{10}$ in Formulae (1) and (2) is a dibenzofuran ring group which optionally has a substituent group, and only one of $R_1$ to $R_7$, $R_9$, and $R_{10}$ in Formulae (1) and (2) is a carbazole ring group which optionally has a substituent group.

Embodiment 12. The organic electroluminescence element of any one of embodiments 1 to 11, wherein the luminescent dopant is a phosphorescent compound.

Embodiment 13. The organic electroluminescence element of embodiment 12, wherein the phosphorescent compound is represented by Formula (A1):

[Chemical Formula 3]

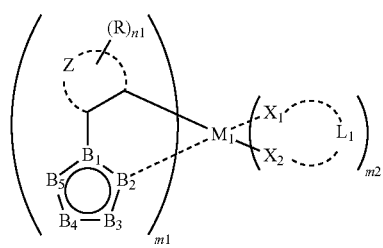

Formula (A1)

when R represents a substituent group; Z represents a nonmetallic atomic group necessary for formation of a five- to seven-member ring; n1 represents an integer of 0 to 5; $B_1$ to $B_5$ each represent a carbon atom, CRa, a nitrogen atom, NRb, an oxygen atom, or a sulfur atom, with the proviso that at least one of $B_1$ to $B_5$ represents a nitrogen atom; Ra and Rb each represent a hydrogen atom or a substituent group; $B_1$ to $B_5$ are five atoms forming an aromatic nitrogen-containing heterocycle; $B_5$ and Z may be bonded to each other to form a ring; $M_1$ represents a metal belonging to any one of Groups 8 to 10 in the periodic table; $X_1$ and $X_2$ each represent a carbon atom, a nitrogen atom, or an oxygen atom; $L_1$ represents an atomic group forming a bidentate ligand together with $X_1$ and $X_2$; and m1 represents an integer of 1 to 3 and m2 represents an integer of 0 to 2, with the proviso that m1+m2 is 2 or 3.

Embodiment 14. The organic electroluminescence element of any one of embodiments 1 to 13, wherein the luminous layer is formed with a coating solution.

Embodiment 15. The organic electroluminescence element of any one of embodiments 1 to 14, wherein the luminous layer emits white light.

Embodiment 16. An illumination device comprising the organic electroluminescence element of any one of embodiments 1 to 15.

Embodiment 17. A display device comprising the organic electroluminescence element of any one of embodiments 1 to 15.

Effects of Invention

According to the above means, the present invention provides an organic electroluminescence element having a low driving voltage, high luminous efficiency, long-term durability, a low chromatic variation of light, reduced dark spots and high retention of coating solution, and an illumination device and a display device provided with such an organic electroluminescence element.

Although not clear, the inducement/operation mechanism on the effects of the present invention is presumed as described below.

Regarding one of disadvantages of conventional metal complexes, the inventors have assumed that the significant change between the ground state ($S_0$) and the lowest excited triplet state ($T_1$) in the molecular structure of a phosphorescent dopant at the time of emission of light induces increased non-radiative deactivation, resulting in failure for obtaining an organic EL element having long lifetime and high luminous efficiency to ensure practical use. Thus, the inventors have extensively studied the disadvantageous phenomenon.

As a result, the inventors have found that prolonged element lifetime and enhanced luminous efficiency can be achieved by an element including a luminous layer, the luminous layer containing a luminescent dopant having a reorganization energy of 0 eV to 0.7 eV in the electron transition from the ground state ($S_0$) to the lowest excited triplet state ($T_1$), and a host compound having a reorganization energy of 0 eV to 0.3 eV in the electron transfer reaction between the ground state ($S_0$) and the anionic radical state (AR) and a molecular weight within the range of 500 to 3000. Such effects are probably achieved by the host compound having a function of carrier transfer in the luminous layer and a structural change dominant in anionic radicals rather than in cationic radicals.

The inventors have also found that a similar effect can be achieved with a host compound represented by Formula (1) and having a molecular weight within a range of 500 to 3000, even though the host compound has a reorganization energy greater than 0.3 eV.

Regarding the combination of the luminescent dopant and the host compound in the present invention, the inventors have assumed that improvement of properties is significantly influenced by a decreased structural change between $S_0$ and $T_1$ of a luminescent dopant that has a function of light emission, and by a decreased structural change between $S_0$ and the anionic radical state of a host compound that has a function of carrier transfer. As a result of synthesizing and studying various compounds, the inventors have found that properties of elements are improved by employing the combination which satisfies such a condition.

As a measure for decreasing the reorganization energy, the present inventors have introduced compounds obtained by molecular design based on the steric effects by a bulky substituent group and electronic effects by delocalization of electrons into a luminous layer as a host compound and a luminescent dopant, thereby accomplishing the present invention.

Such a low reorganization energy of host compounds containing terphenylene, quarterphenylene or pentaphenylene groups results from the delocalization of electrons.

Thus, the inventors have found that the effects of the present invention can be attained by combining a host compound and a luminescent dopant, the two different materials for a luminous layer.

Luminous layers of organic ELs are preferably composed of two main components, a host and a dopant, which are dispersed uniformly. In particular, the host contained in a larger amount is required to be dispersed uniformly and remain dispersed uniformly for a long time after the film formation. For hopping conduction of holes and electrons to the luminous layer, the structural change of the host is preferably small between the ground state and the cationic radical state ($\Delta Sc$) or between the ground state and the anionic radical state ($\Delta Sa$). As a result of the extensive study, the inventors have found that decreased $\Delta Sa$ is more effective for improving the properties of organic ELs. This is probably because $\Delta Sa$ is greater than $\Delta Sc$, as described above.

Meanwhile, the waveform of light emission is different between luminous layers containing the dopant alone and in combination with a host, in parameters such as $\lambda$max and half width. In many cases, luminous layers containing the same dopant and mutually different host compounds have different shapes of the waveform of light emission. Since it is known that a large structural change results in a broad waveform of light emission while a small structural change results in a sharp waveform of light emission, use of different hosts in the binary system of a host and a dopant significantly affects the structural change. The waveform also varies over time as a result of deterioration of the host or dopant, or interaction between the host and the dopant.

In view of these points, the inventors have found that the reorganization energy of the host and that of the dopant should be predetermined at a level higher than the conventionally recognized level for improving and maintaining the waveform of light emission while maintaining the high mobility in the luminous layer (PTLs 1 and 2 state the reorganization energy to be 0 to 0.5 eV, while the present invention defines it to be 0 to 0.3 eV).

Specifically, it is presumed that both the luminous efficiency and the durability of the element are improved by a combination of a luminescent dopant and a host compound such that the luminescent dopant has a reorganization energy of 0 eV to 0.7 eV in the electron transition between the ground state ($S_0$) and the lowest excited triplet state ($T_1$), the host compound has a reorganization energy of 0 eV to 0.3 eV in the electron transfer reaction between the ground state ($S_0$) and the anionic radical state (AR), and the host compound has a molecular weight within the range of 500 to 3000. The inventors have also found that the waveform of light emission is improved and maintained while high mobility in the luminous layer is maintained, which results in decreased chromatic variation over time. Although it is difficult to measure such an inhibitory effect, the inventors have found that the effect can be quantitated by calculating parameters. The inventors have also found that the host serves as an index of luminous efficiency and the dopant serves as an index of the waveform of light emission and that an appropriate combination contributes to compatibility between high luminous efficiency and high durability. The retention of coating solution has also been improved. The energy of the dopant has a wider range than that of the host. The inventors presume that this is because the contents of the host and the dopant is different, which results in a difference in allowable range of energy.

The inventors also have found that a host compound with a molecular weight of less than 500 results in low thermal stability and significantly affects the element lifetime, but a host compound having a molecular weight of 500 or more can be used to improve both luminous efficiency and durability by a combination with the reorganization energy within the range determined in the present invention.

MODES FOR CARRYING OUT THE INVENTION

Figure 1:
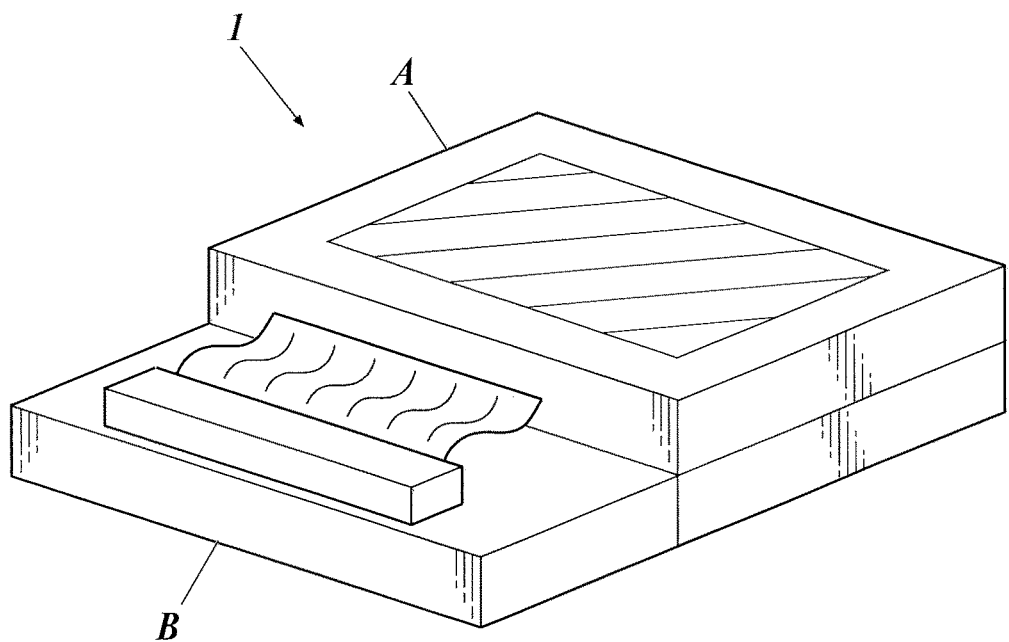
FIG. 1 is a schematic view illustrating an example of a display device provided with an organic EL element.

The organic electroluminescence element of the present invention includes an anode, a cathode, and a luminous layer. The luminous layer includes a luminescent dopant having a reorganization energy of 0 eV to 0.7 eV in the electron transition from the ground state ($S_0$) to the lowest excited triplet state ($T_1$) and a host compound having a reorganization energy of 0 eV to 0.3 eV in the electron transfer reaction between the ground state ($S_0$) and the anionic radical state (AR). The host compound has a molecular weight within a range of 500 to 3000. These technical features are characterized by Embodiments 1 to 17.

In an embodiment of the present invention, the luminescent dopant preferably has a reorganization energy of 0 eV to 0.5 eV in the electron transition from the ground state ($S_0$) to the lowest excited triplet state ($T_1$), and the host compound preferably has a reorganization energy of 0 eV to 0.15 eV in the electron transfer reaction between the ground state ($S_0$) and the anionic radical state (AR), from the viewpoint of the effects of the present invention.

The luminous layer preferably includes a luminescent dopant having a reorganization energy of 0 eV to 0.7 eV in the electron transition from the ground state ($S_0$) to the lowest excited triplet state ($T_1$) and a host compound represented by Formula (1) and having a molecular weight within a range of 500 to 3000. In particular, the luminescent dopant preferably has a reorganization energy of 0 eV to 0.5 eV in the electron transition from the ground state ($S_0$) to the lowest excited triplet state ($T_1$) for achieving a low driving voltage, high luminous efficiency, long-term durability, reduced dark spots, and high retention of coating solution.

The host compound is preferably represented by Formula (2).

In Formulae (1) and (2), preferably at least one of $R_1$ to $R_{10}$ is a carbazole ring group which optionally has a substituent group.

In Formulae (1) and (2), preferably only one of $R_1$ to $R_{10}$ is a carbazole ring group which optionally has a substituent group.

In Formulae (1) and (2), preferably at least one of $R_1$ to $R_{10}$ is a dibenzofuran ring group which optionally has a substituent group.

In Formulae (1) and (2), preferably only one of $R_1$ to $R_{10}$ is a dibenzofuran ring group which optionally has a substituent group.

In Formulae (1) and (2), preferably only one of $R_1$ to $R_{10}$ is a dibenzofuran ring group which optionally has a substituent group and only one of $R_1$ to $R_{10}$ is a carbazole ring group which optionally has a substituent group.

The luminescent dopant is preferably a phosphorescent compound from the viewpoint of high luminous efficiency.

The phosphorescent compound is preferably represented by Formula (A1) from the viewpoints of long-term durability and reduced dark spots of the element.

The luminous layer is preferably formed with a coating solution, which allows a uniform film layer with fewer pinholes.

The luminous layer preferably emits white light, which ensures high stability of the element over time.

The illumination device of the present invention preferably includes the organic electroluminescence element. Such an illumination device is of a high grade.

The display device of the present invention preferably includes the organic electroluminescence element. Such a display device is of a high grade.

The components and embodiments of the present invention will now be described in detail. As used herein, the expression "to" indicating a numerical range is meant to be inclusive of the boundary values.

[Outline of the Organic Electroluminescence Element of the Present Invention]

The present invention provides an organic electroluminescence element including a luminous layer. The luminous layer includes a luminescent dopant having a reorganization energy of 0 eV to 0.7 eV in the electron transition from the ground state ($S_0$) to the lowest excited triplet state ($T_1$) and a host compound having a reorganization energy of 0 eV to 0.3 eV in the electron transfer reaction between the ground state ($S_0$) and the anionic radical state (AR).

In particular, the luminescent dopant preferably has a reorganization energy of 0 eV to 0.5 eV in the electron transition from the ground state ($S_0$) to the lowest excited triplet state ($T_1$), and the host compound preferably has a reorganization energy of 0 eV to 0.15 eV in the electron transfer reaction between the ground state ($S_0$) and the anionic radical state (AR).

Preferably, the host compound is represented by Formula (1) and has a molecular weight within a range of 500 to 3000. The luminescent dopant is preferably represented by Formula (A1).

The reorganization energy will be now explained. Formulae (1) and (A1) will be described in detail below.

[Reorganization Energy]

As used herein, the reorganization energy of a dopant compound is a parameter 2 of energy which expresses a change in a molecular structure when a neutral molecule in the ground state ($S_0$) is excited to the lowest excited triplet state ($T_1$), and is defined by the following expressions:

$$\lambda_1 = Ea - Eb; \quad \text{Expression (1):}$$

$$\lambda_2 = Ec - Ed; \quad \text{Expression (2):}$$

$$\lambda = \lambda_1 + \lambda_2; \quad \text{Expression (3):}$$

where Ea represents the energy of the molecule in the state $T_1$ calculated based on the structure of the molecule in the state $S_0$, Eb represents the energy of the molecule in the state $T_1$ with the optimized structure, Ec represents the energy of the molecule in the ground state calculated based on the structure of the molecule in the state $T_1$, and Ed represents the energy of the molecule in the state $S_0$ with the optimized structure. As used herein, the reorganization energy of the dopant compound is defined as $\lambda_D (=\lambda_1 + \lambda_2)$.

In the case of a host compound, "state $T_1$" in the above description is replaced with "anionic radical state". The reorganization energy of a host compound is thus defined by the following Expressions:

$$\lambda_3 = Fe - Ef; \quad \text{Expression (4):}$$

$$\lambda_4 = Eg - Eh; \quad \text{Expression (5):}$$

$$\lambda = \lambda_3 + \lambda_4; \quad \text{Expression (6):}$$

when Ee represents the energy of the molecule in the anionic radical state calculated based on the structure of the molecule in the state $S_0$, Ef represents the energy of the molecule in the anionic radical state with the optimized structure, Eg represents the energy of the molecule in the ground state calculated based on the structure of the molecule in the anionic radical state, and Eh represents the energy of the molecule in the state $S_0$ with the optimized structure. As used herein, the reorganization energy of the host compound is defined as $\lambda_H (=\lambda_3 + \lambda_4)$.

The reorganization energy in the present invention is calculated based on Gaussian 03 (Revision D.02, M. J. Frisch, G. W. Trucks, H. B. Schlegel, G. E. Scuseria, M. A. Robb, J. R. Cheeseman, J. A. Montgomery, Jr., T. Vreven, K. N. Kudin, J. C. Burant, J. M. Millam, S. S. Iyengar, J. Tomasi, V. Barone, B. Mennucci, M. Cossi, G. Scalmani, N. Rega, G. A. Petersson, H. Nakatsuji, M. Hada, M. Ehara, K. Toyota, R. Fukuda, J. Hasegawa, M. Ishida, T. Nakajima, Y. Honda, O. Kitao, H. Nakai, M. Klene, X. Li, J. E. Knox, H. P. Hratchian, J. B. Cross, V. Bakken, C. Adamo, J. Jaramillo, R. Gomperts, R. E. Stratmann, O. Yazyev, A. J. Austin, R. Cammi, C. Pomelli, J. W. Ochterski, P. Y. Ayala, K. Morokuma, G. A. Voth, P. Salvador, J. J. Dannenberg, V. G. Zakrzewski, S. Dapprich, A. D. Daniels, M. C. Strain, O. Farkas, D. K. Malick, A. D. Rabuck, K. Raghavachari, J. B. Foresman, J. V. Ortiz, Q. Cui, A. G. Baboul, S. Clifford, J. Cioslowski, B. B. Stefanov, G. Liu, A. Liashenko, P. Piskorz, I. Komaromi, R. L. Martin, D. J. Fox, T. Keith, M. A. Al-Laham, C. Y. Peng, A. Nanayakkara, M. Challacombe, P. M. W. Gill, B. Johnson, W. Chen, M. W. Wong, C. Gonzalez, and J. A. Pople, Gaussian, Inc., Wallingford Conn., 2004.).

The reorganization energy is calculated based on a B3LYP functional both for a dopant and a host, and a LanL2DZ basis function and a 6-31G* basis function for the dopant and the host, respectively.

The reorganization energy is described in documents, for example, "K. Sakanoue, et al., J. Phys. Chem., A 1999, 103, 5551-5556" and "M. Malagoli, et al., Chem. Phys. Letters., 327 (2000)13-17".

According to the present invention, the host compound contained in the luminous layer preferably has a molecular weight within a range of 500 to 3000, and is preferably a compound represented by Formula (1). According to the present invention, the host compound contained in the luminous layer has a reorganization energy of 0 eV to 0.3 eV, preferably 0 eV to 0.15 eV, and a molecular weight within a range of 500 to 3000. The advantageous effect of the present invention can be achieved with a compound represented by Formula (1) and having a molecular weight within a range of 500 to 3000 even though its reorganization energy is greater than 0.3 eV The most preferred host compound in the present invention is a compound represented by Formula (1) and having a reorganization energy of 0 eV to 0.3 eV, preferably 0 eV to 0.15 eV, and having a molecular weight within a range of 500 to 3000.

[Chemical Formula 4]

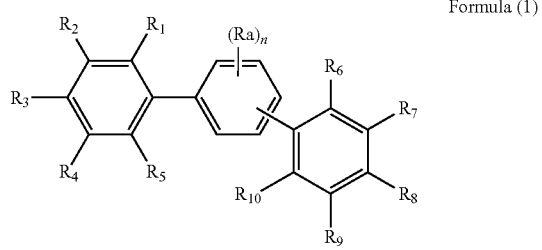

Formula (1)

[Compound Represented by Formula (1)]

In Formula (1), $R_1$ to $R_7$, $R_9$, $R_{10}$ and Ra each represent a hydrogen atom or a substituent group, and $R_8$ represents a hydrogen atom.

If $R_1$ to $R_7$, $R_9$, $R_{10}$ and Ra in Formula (1) each represent a substituent group, examples of the substituent group include alkyl groups, such as methyl, ethyl, propyl, isopropyl, tert-butyl, pentyl, hexyl, octyl, dodecyl, tridecyl, tetradecyl, and pentadecyl groups; cycloalkyl groups, such as cyclopentyl and cyclohexyl groups; alkenyl groups, such as vinyl and allyl groups; alkynyl groups, such as ethynyl and propargyl groups; aromatic hydrocarbon groups (also referred to as aromatic hydrocarbon ring groups, aromatic carbocyclic groups, or aryl groups), such as phenyl, p-chlorophenyl, mesityl, tolyl, xylyl, naphthyl, anthryl, azulenyl, acenaphthenyl, fluorenyl, phenanthryl, indenyl, pyrenyl and biphenylyl groups; heterocyclic aromatic ring groups, such as pyridyl, pyrimidinyl, furyl, pyrrolyl, imidazolyl, benzimidazolyl, pyrazolyl, pyrazinyl, triazolyl (such as 1,2,4-triazole-1-yl and 1,2,3-triazole-1-yl groups), oxazolyl, benzoxazolyl, thiazolyl, isoxazolyl, isothiazolyl, furazanyl, thienyl, quinolyl, benzofuryl, dibenzofuryl, benzothienyl, dibenzothienyl, indolyl, carbazolyl, carbolinyl, diazacarbazolyl (i.e., a group in which one of the carbon atoms in the carboline ring of the carbolinyl group is replaced with a nitrogen atom), quinoxalinyl, pyridazinyl, triazinyl, quinazolinyl, and phthalazinyl groups; heterocyclic ring groups, such as pyrrolidyl, imidazolidyl, morpholyl, and oxazolidyl groups; alkoxy groups, such as methoxy, ethoxy, propyloxy, pentyloxy, hexyloxy, octyloxy, and dodecyloxy groups; cycloalkoxy groups, such as cyclopentyloxy and cyclohexyloxy groups; aryloxy groups, such as phenoxy and naphthyloxy groups; alkylthio groups, such as methylthio, ethylthio, propylthio, pentylthio, hexylthio, octylthio, and dodecylthio groups; cycloalkylthio groups, such as cyclopentylthio and cyclohexylthio groups; arylthio groups, such as phenylthio and naphthylthio groups; alkoxycarbonyl groups, such as methyloxycarbonyl, ethyloxycarbonyl, butyloxycarbonyl, octyloxycarbonyl, and dodecyloxycarbonyl groups; aryloxycarbonyl groups, such as phenyloxycarbonyl, and naphthyloxycarbonyl groups; sulfamoyl groups, such as aminosulfonyl, methylaminosulfonyl, dimethylaminosulfonyl, butylaminosulfonyl, hexylaminosulfonyl, cyclohexylaminosulfonyl, octylaminosulfonyl, dodecylaminosulfonyl, phenylaminosulfonyl, naphthylaminosulfonyl, and 2-pyridylaminosulfonyl groups; acyl groups, such as acetyl, ethylcarbonyl, propylcarbonyl, pentylcarbonyl, cyclohexylcarbonyl, octylcarbonyl, 2-ethylhexylcarbonyl, dodecylcarbonyl, phenylcarbonyl, naphthylcarbonyl, and pyridylcarbonyl groups; acyloxy groups, such as acetyloxy, ethylcarbonyloxy, butylcarbonyloxy, octylcarbonyloxy, dodecylcarbonyloxy, and phenylcarbonyloxy groups; amide groups, such as methylcarbonylamino, ethylcarbonylamino, dimethylcarbonylamino, propylcarbonylamino, pentylcarbonylamino, cyclohexylcarbonylamino, 2-ethylhexylcarbonylamino, octylcarbonylamino, dodecylcarbonylamino, phenylcarbonylamino, and naphthylcarbonylamino groups; carbamoyl groups, such as aminocarbonyl, methylaminocarbonyl, dimethylaminocarbonyl, propylaminocarbonyl, pentylaminocarbonyl, cyclohexylaminocarbonyl, octylaminocarbonyl, 2-ethylhexylaminocarbonyl, dodecylaminocarbonyl, phenylaminocarbonyl, naphthylaminocarbonyl, and 2-pyridylaminocarbonyl groups; ureido groups, such as methylureido, ethylureido, pentylureido, cyclohexylureido, octylureido, dodecylureido, phenylureido, naphthylureido, and 2-pyridylaminoureido groups; sulfinyl groups such as methylsulfinyl, ethylsulfinyl, butylsulfinyl, cyclohexylsulfinyl, 2-ethylhexylsulfinyl, dodecylsulfinyl, phenylsulfinyl, naphthylsulfinyl, and 2-pyridylsulfinyl groups; alkylsulfonyl groups, such as methylsulfonyl, ethylsulfonyl, butylsulfonyl, cyclohexylsulfonyl, 2-ethylhexylsulfonyl, and dodecylsulfonyl groups; arylsulfonyl or heteroarylsulfonyl groups, such as phenylsulfonyl, naphthylsulfonyl, and 2-pyridylsulfonyl groups; amino groups, such as amino, ethylamino, dimethylamino, diphenylamino, butylamino, cyclopentylamino, 2-ethylhexylamino, dodecylamino, anilino, naphthylamino, and 2-pyridylamino groups; halogen atoms, such as fluorine, chlorine, and bromine atoms; fluorohydrocarbon groups, such as fluoromethyl, trifluoromethyl, pentafluoroethyl, and pentafluorophenyl groups; cyano groups; nitro groups; hydroxy groups; mercapto groups; silyl groups, such as trimethylsilyl, triisopropylsilyl, triphenylsilyl, and phenyldiethylsilyl groups; and phosphono groups. Among these examples, preferred are alkyl groups, aromatic hydrocarbon groups, heterocyclic aromatic ring groups, alkoxy groups, amino groups, and cyano groups.

These substituent groups may further be substituted by the above substituent groups.

Two or more of these substituent groups may be bonded to each other to form a ring.

In Formula (1), n represents an integer of 0 to 4.

The compound represented by Formula (1) is preferably represented by Formula (2):

[Chemical Formula 5]

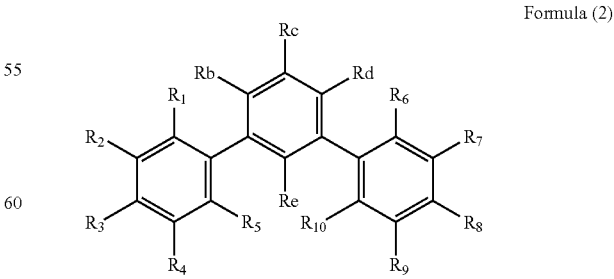

Formula (2)

In Formula (2), $R_1$ to $R_7$, $R_9$, $R_{10}$, and Rb to Re each represent a hydrogen atom or a substituent group, and $R_8$ represents a hydrogen atom.

If $R_1$ to $R_7$, $R_9$, $R_{10}$, Rb, Rc, Rd, and Re in Formula (2) each represent a substituent group, the substituent group has the same definition as that of the substituent group in Formula (1).

In Formulae (1) and (2), the substituent groups are preferably alkyl groups, alkoxy groups, amino groups, cyano groups, aromatic hydrocarbon ring groups, or heterocyclic aromatic ring groups.

In Formulae (1) and (2), two or more groups among $R_1$ to $R_5$ or among $R_6$, $R_7$, $R_9$ and $R_{10}$ may be bonded to each other to form a ring.

In Formulae (1) and (2), $R_7$ may be represented by Formula (PA1) or (PA2).

[Chemical Formula 6]

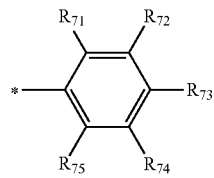

Formula (PA1)

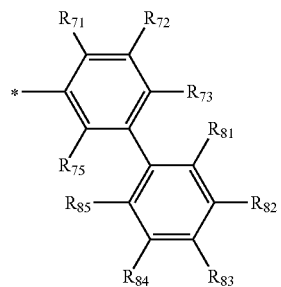

Formula (PA2)

In Formula (PA1), $R_{71}$ to $R_{75}$ each represent a hydrogen atom or a substituent group.

If $R_{71}$ to $R_{75}$ in Formula (PA1) each represent a substituent group, the substituent group has the same definition as that of the substituent group in Formula (1).

In Formula (PA2), $R_{71}$ to $R_{73}$, $R_{75}$, and $R_{81}$ to $R_{85}$ each represent a hydrogen atom or a substituent group.

If $R_{71}$ to $R_{73}$, $R_{75}$, and $R_{81}$ to $R_{85}$ in Formula (PA2) each represent a substituent group, the substituent group has the same definition as that of the substituent group in Formula (1).

In Formulae (PA1) and (PA2), * represents a binding site to $R_7$.

In Formulae (1) and (2), preferably at least one or only one of $R_1$ to $R_7$, $R_9$ and $R_{10}$ is a carbazole ring group which optionally has a substituent group, or at least one or only one of $R_1$ to $R_7$, $R_9$, and $R_{10}$ is a dibenzofuran ring group which optionally has a substituent group. Preferably, only one of $R_1$ to $R_7$, $R_9$, and $R_{10}$ is a dibenzofuran ring group which optionally has a substituent group and only one of $R_1$ to $R_7$, $R_9$, and $R_{10}$ is a carbazole ring group which optionally has a substituent group.

The compound represented by Formulae (1) and (2) is preferably represented by Formula (1-A), (1-B), (2-A) or (2-B).

[Chemical Formula 7]

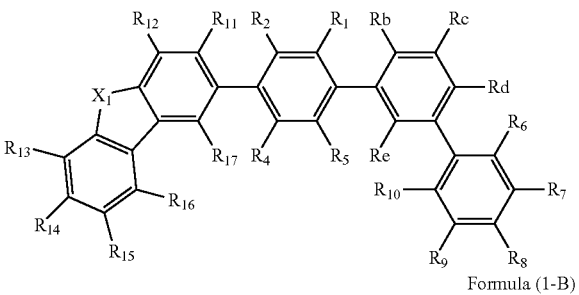

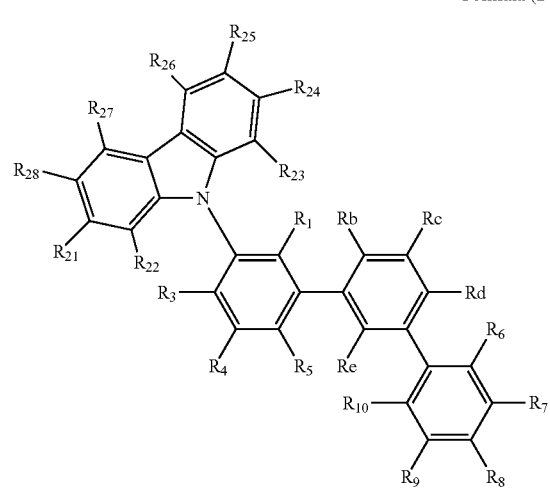

In Formula (1-A), $R_1$, $R_2$, $R_4$ to $R_7$, $R_9$ to $R_{17}$, and Rb to Re each represent a hydrogen atom or a substituent group, and $R_8$ represents a hydrogen atom. In Formula (1-A), if $R_1$, $R_2$, $R_4$ to $R_7$, $R_9$ to $R_{17}$, and Rb to Re each represent a substituent group, the substituent group has the same definition as that of $R_1$ to $R_7$, $R_9$, $R_{10}$ and Ra in Formula (1).

In Formula (1-A), $X_1$ represents an oxygen atom, a sulfur atom, or NRx. Rx represents a hydrogen atom or a substituent group. If Rx represents a substituent group, the substituent group has the same definition as that of $R_1$ to $R_7$, $R_9$, $R_{10}$ and Ra in Formula (1).

In Formula (1-B), $R_1$, $R_2$, $R_4$ to $R_7$, $R_9$, $R_{10}$, $R_{21}$ to $R_{28}$, and Rb to Re each represent a hydrogen atom or a substituent group, and $R_8$ represents a hydrogen atom. In Formula (1-B), if $R_1$, $R_2$, $R_4$ to $R_7$, $R_9$, $R_{10}$, $R_{21}$ to $R_{28}$, and Rb to Re each represent a substituent group, the substituent group has the same definition as that of $R_1$ to $R_7$, $R_9$, $R_{10}$ and Ra in Formula (1).

In Formula (2-A), $R_1$, $R_3$ to $R_7$, $R_9$ to $R_{17}$, and Rb to Re each represent a hydrogen atom or a substituent group, and $R_8$ represents a hydrogen atom. If $R_1$, $R_3$ to $R_7$, $R_9$ to $R_{17}$, and Rb to Re each represent a substituent group, the substituent group has the same definition as that of $R_1$ to $R_7$, $R_9$, $R_{10}$ and Ra in Formula (1). In Formula (2-A), $X_1$ has the same definition as that of $X_1$ in Formula (1-A).

In Formula (2-B), $R_1$, $R_3$ to $R_7$, $R_9$, $R_{10}$, $R_{21}$ to $R_{28}$, and Rb to Re each represent a hydrogen atom or a substituent group, and $R_8$ represents a hydrogen atom. If $R_1$, $R_3$ to $R_7$, $R_9$, $R_{10}$, $R_{21}$ to $R_{28}$, and Rb to Re each represent a substituent group, the substituent group has the same definition as that of $R_1$ to $R_7$, $R_9$, $R_{10}$ and Ra in Formula (1).

In Formulae (1-A), (1-B), (2-A) and (2-B), preferably only one of $R_1$ to $R_7$, $R_9$, and $R_{10}$ is a dibenzofuran ring group which optionally has a substituent group.

The compound represented by Formulae (1) and (2) is preferably represented by Formula (3-A), (3-B) or (3-C):

[Chemical Formula 8]

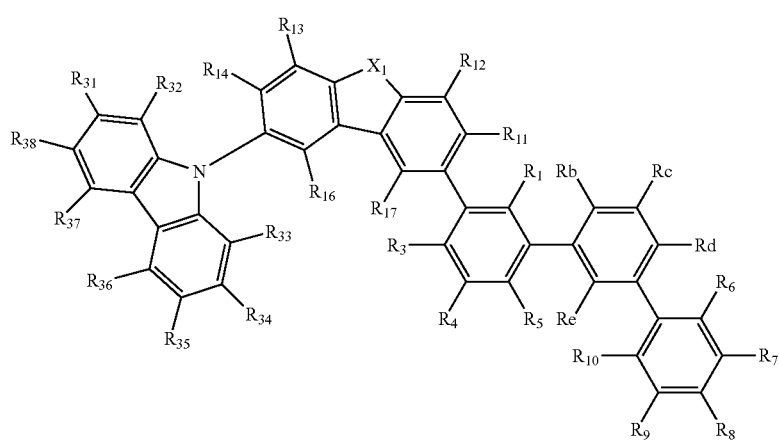

Formula (3-A)

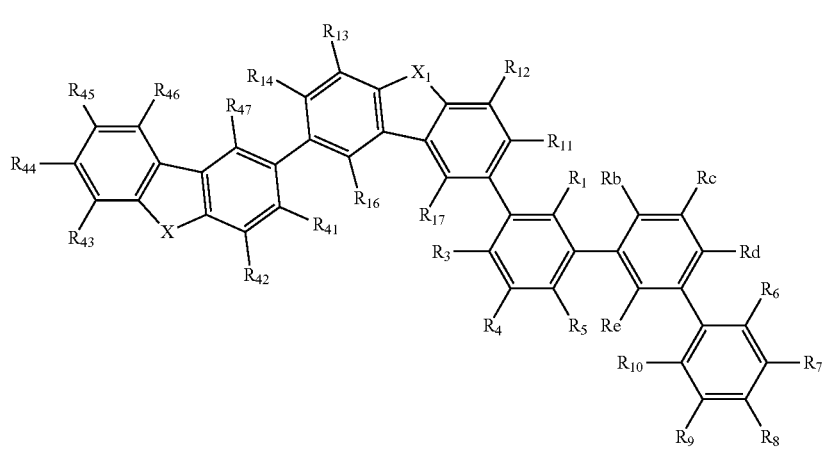

Formula (3-B)

-continued

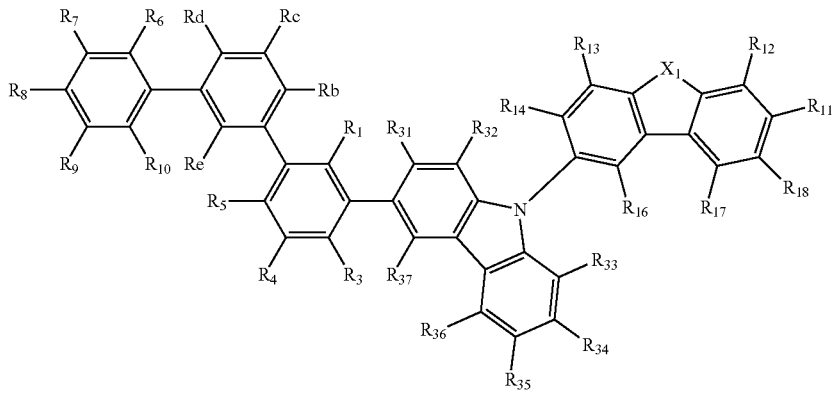

Formula (3-C)

In Formula (3-A), $R_1$, $R_3$ to $R_7$, $R_9$ to $R_{14}$, $R_{16}$, $R_{17}$, $R_{31}$ to $R_{38}$, and Rb to Re each represent a hydrogen atom or a substituent group, and $R_8$ represents a hydrogen atom. If $R_1$, $R_3$ to $R_7$, $R_9$ to $R_{14}$, $R_{16}$, $R_{17}$, $R_{31}$ to $R_{38}$, and Rb to Re each represent a substituent group, the substituent group has the same definition as that of $R_1$ to $R_7$, $R_9$, $R_{10}$ and Ra in Formula (1). In Formula (3-A), $X_1$ has the same definition as that of $X_1$ in Formula (1-A).

In Formula (3-B), $R_1$, $R_3$ to $R_7$, $R_9$ to $R_{14}$, $R_{16}$, $R_{17}$, $R_{41}$ to $R_{47}$, and Rb to Re each represent a hydrogen atom or a substituent group, and $R_8$ represents a hydrogen atom. If $R_1$, $R_3$ to $R_7$, $R_9$ to $R_{14}$, $R_{16}$, $R_{17}$, $R_{41}$ to $R_{47}$, and Rb to Re each represent a substituent group, the substituent group has the same definition as that of $R_1$ to $R_7$, $R_9$, $R_{10}$ and Ra in Formula (1). In Formula (3-B), $X_1$ and X have the same definition as that of $X_1$ in Formula (1-A).

In Formula (3-C), $R_1$, $R_3$ to $R_7$, $R_9$ to $R_{14}$, $R_{16}$ to $R_{18}$, $R_{31}$ to $R_{37}$, and Rb to Re each represent a hydrogen atom or a substituent group, and $R_8$ represents a hydrogen atom. If $R_1$, $R_3$ to $R_7$, $R_9$ to $R_{14}$, $R_{16}$ to $R_{18}$, $R_{31}$ to $R_{37}$, and Rb to Re each represent a substituent group, the substituent group has the same definition as that of $R_1$ to $R_7$, $R_9$, $R_{10}$ and Ra in Formula (1). In Formula (3-C), $X_1$ has the same definition as that of $X_1$ in Formula (1-A).

In one embodiment, $R_7$ in Formulae (1-A), (1-B), (2-A), (2-B), (3-A), (3-B), and (3-C) may be represented by Formula (PA1) or (PA2).

Non-limiting specific examples of the host compound of the present invention are as follows:

[Chemical Formula 9]

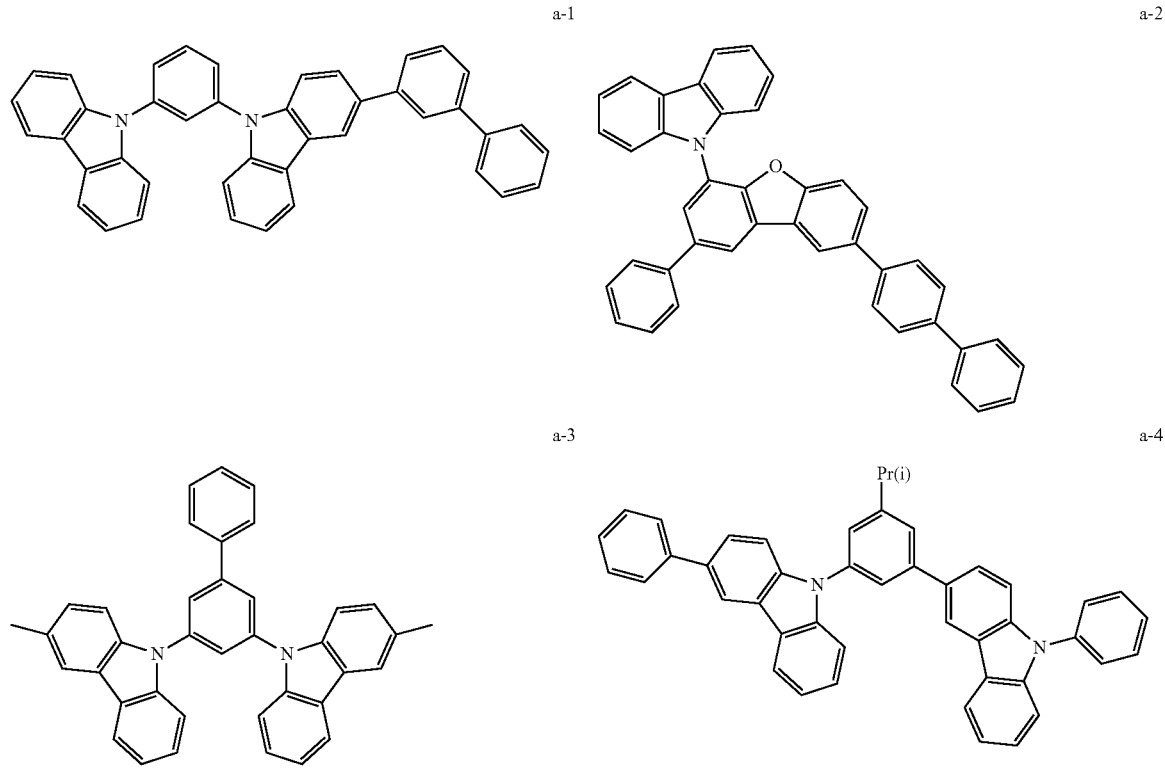

a-5
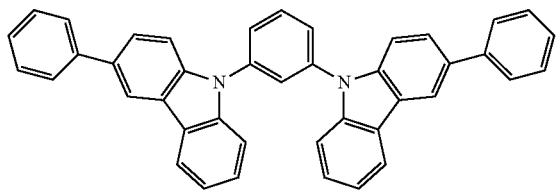
a-6
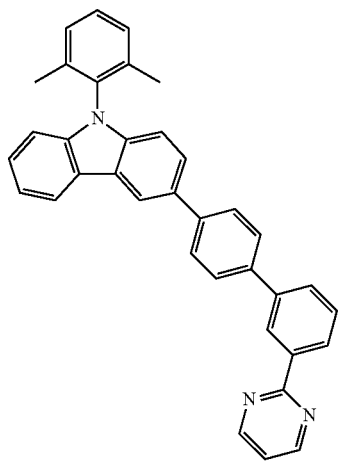
a-7
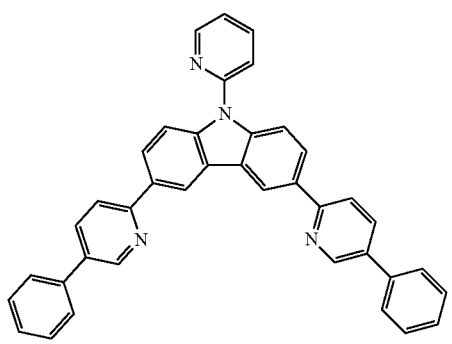
a-8
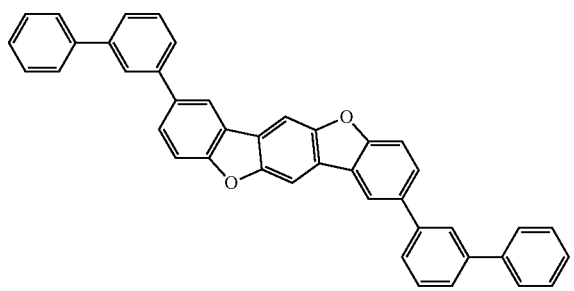
[Chemical Formula 10]
a-9
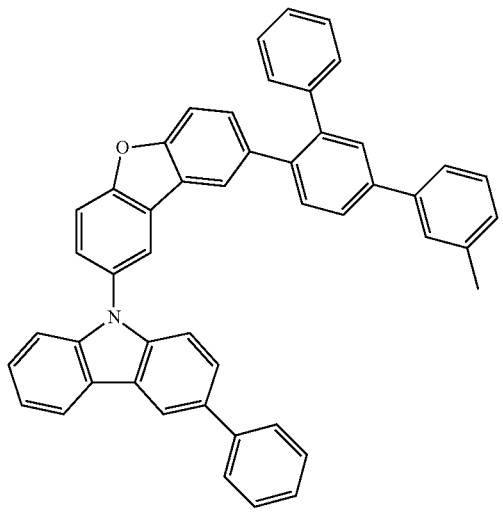
a-10
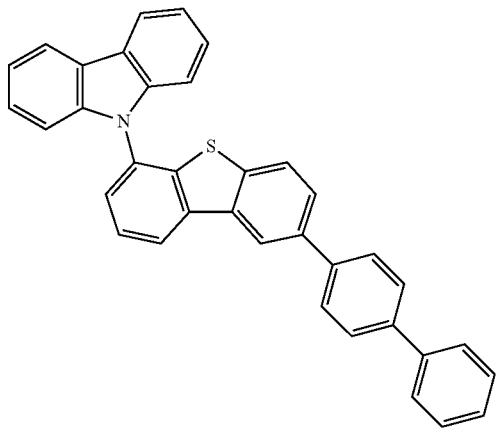

-continued
a-11
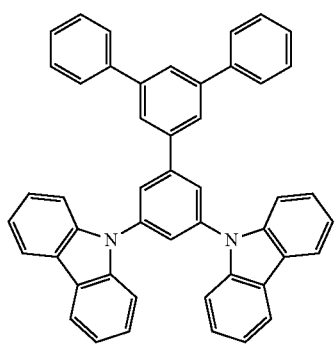
a-12
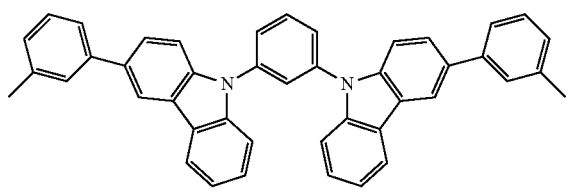
a-13
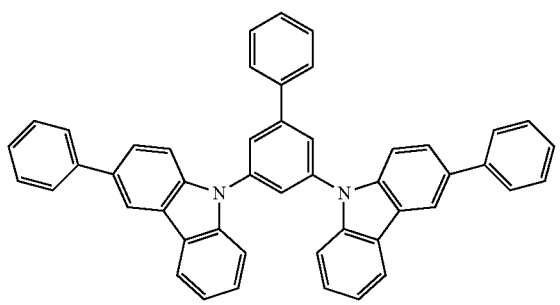
a-14
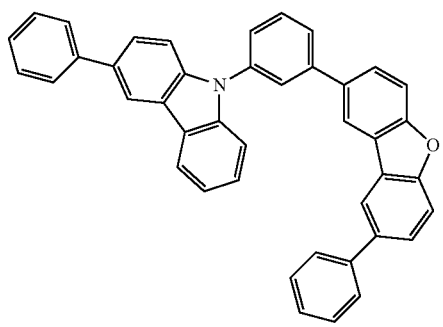
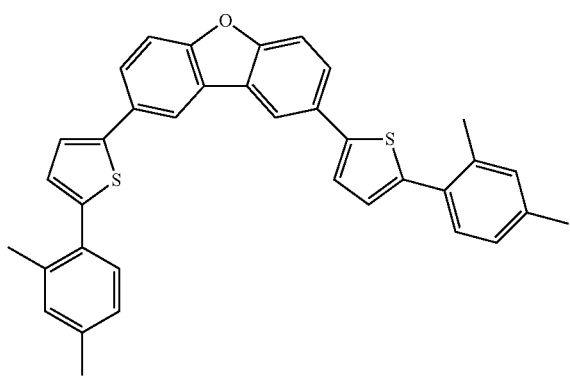
[Chemical Formula 11]
a-16
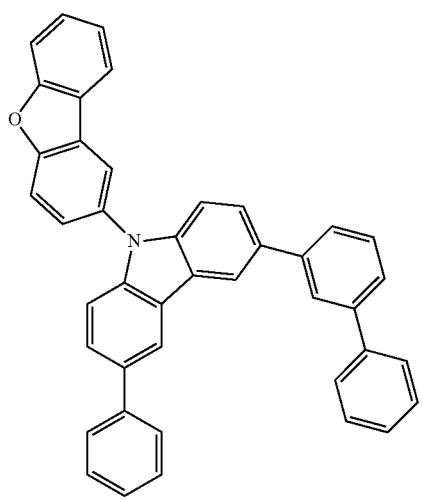
a-17
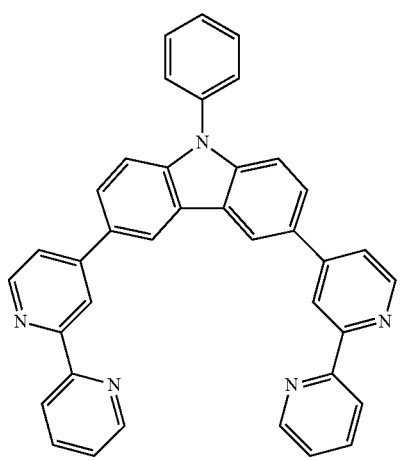

-continued
a-18
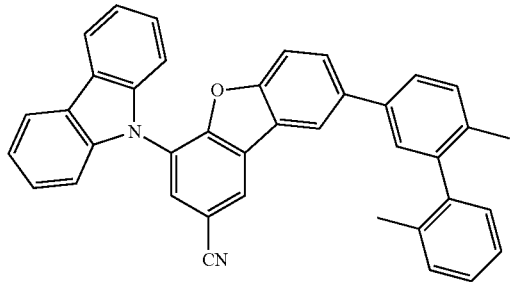
a-19
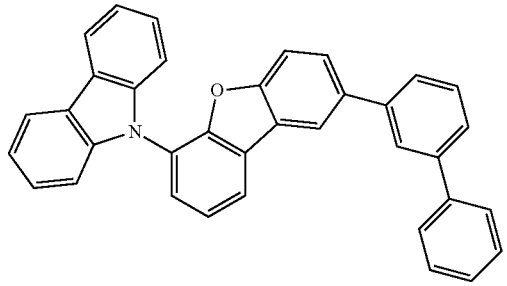
a-20
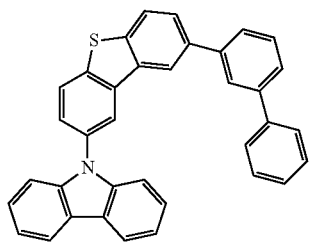
a-21
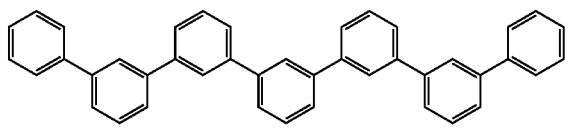
[Chemical Formula 12]
1-1
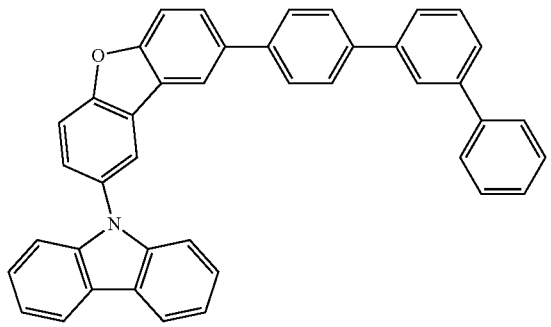
1-2
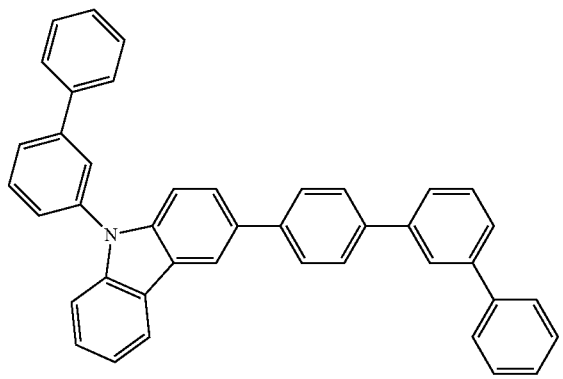
1-3
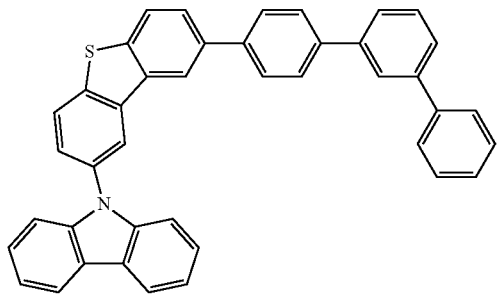
1-4
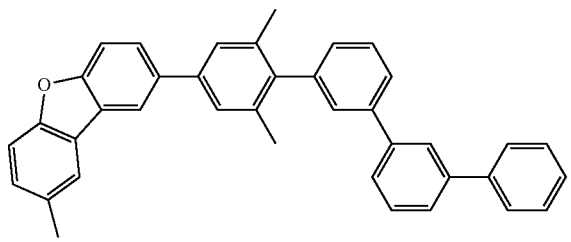

-continued
1-5
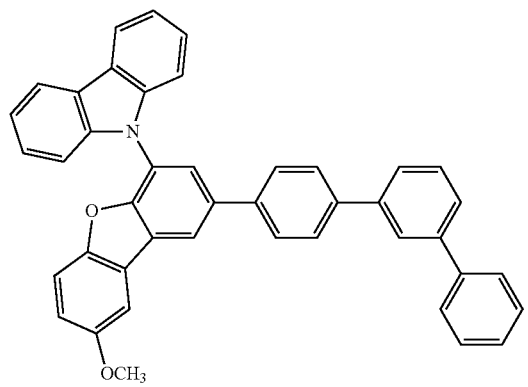
1-6
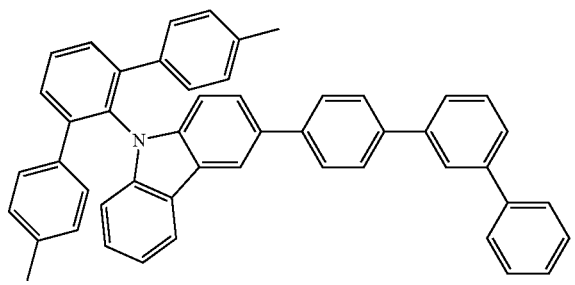
[Chemical Formula 13]
1-7
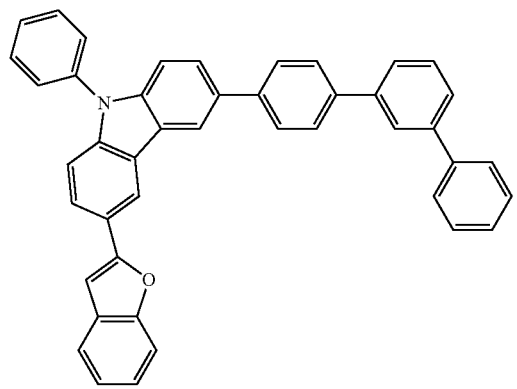
1-8
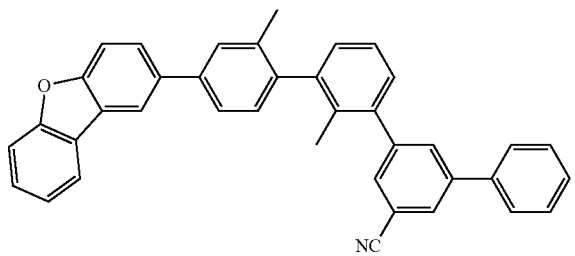
1-9
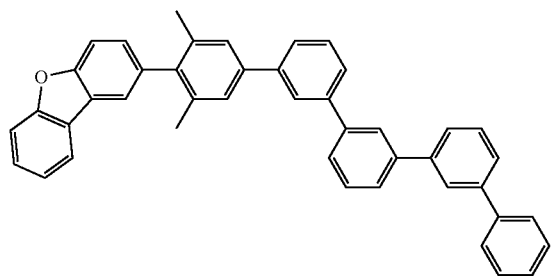
1-10
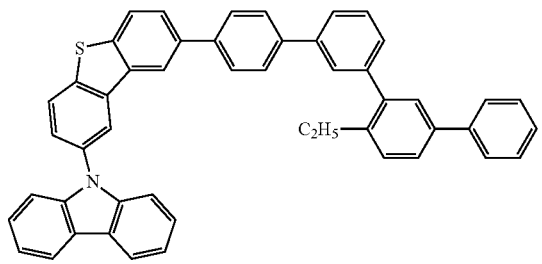
[Chemical Formula 14]
2-1
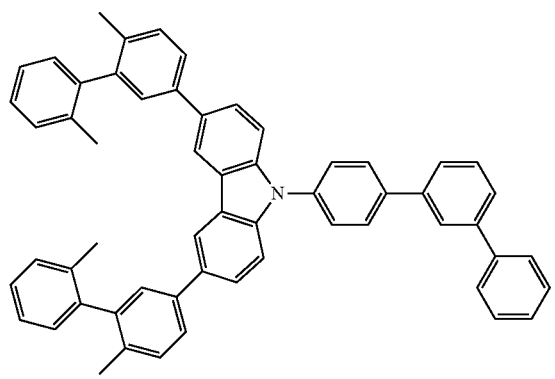
2-2
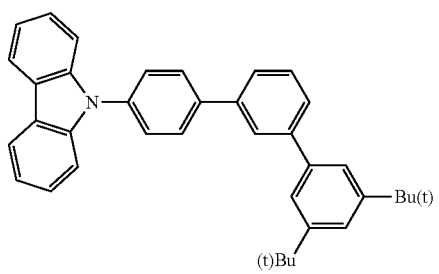

2-3
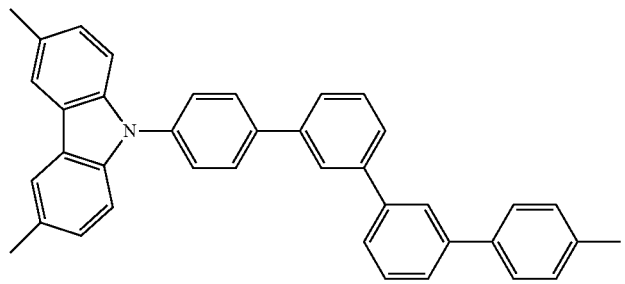
2-4
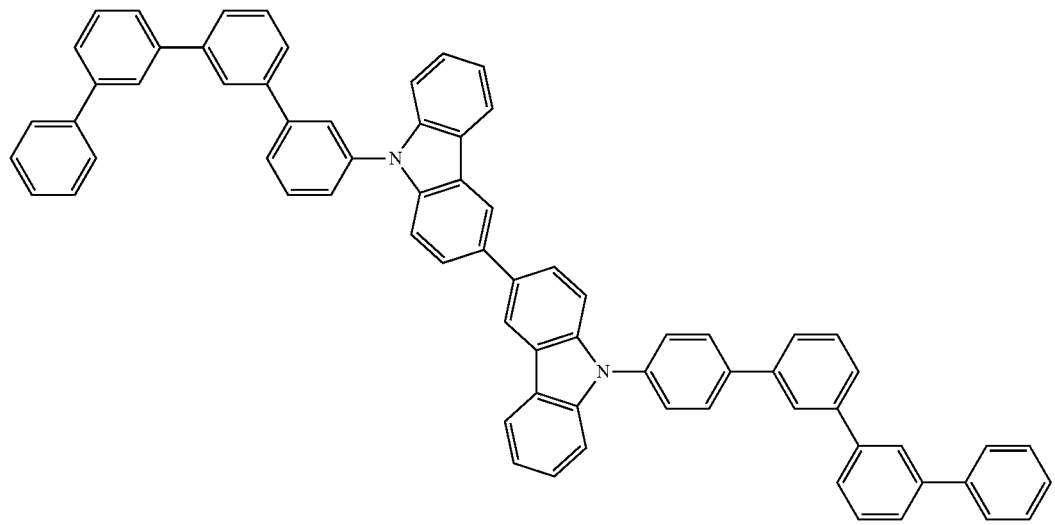
2-5
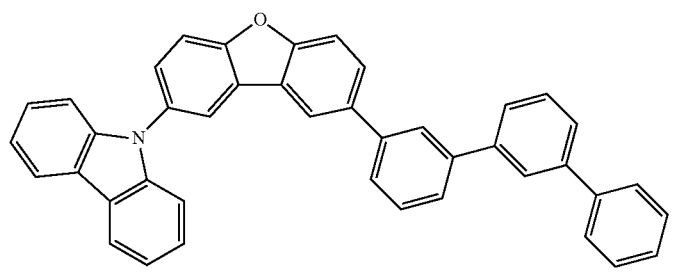
[Chemical Formula 15]
2-6
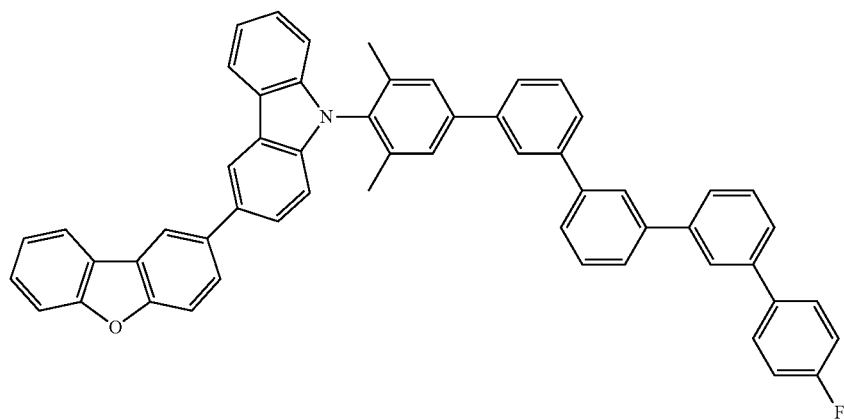

-continued
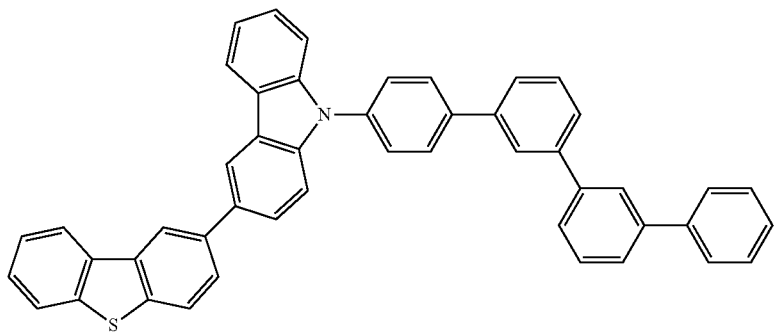
2-7
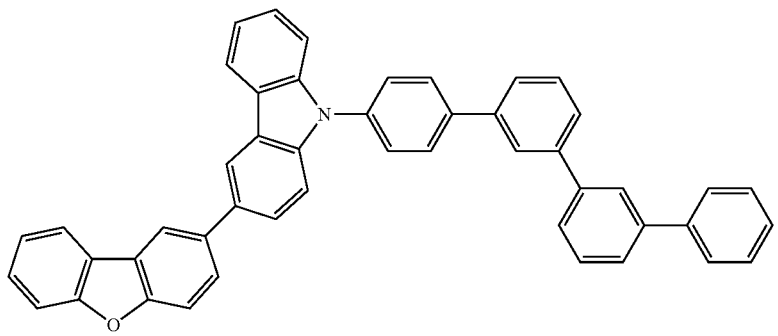
2-8
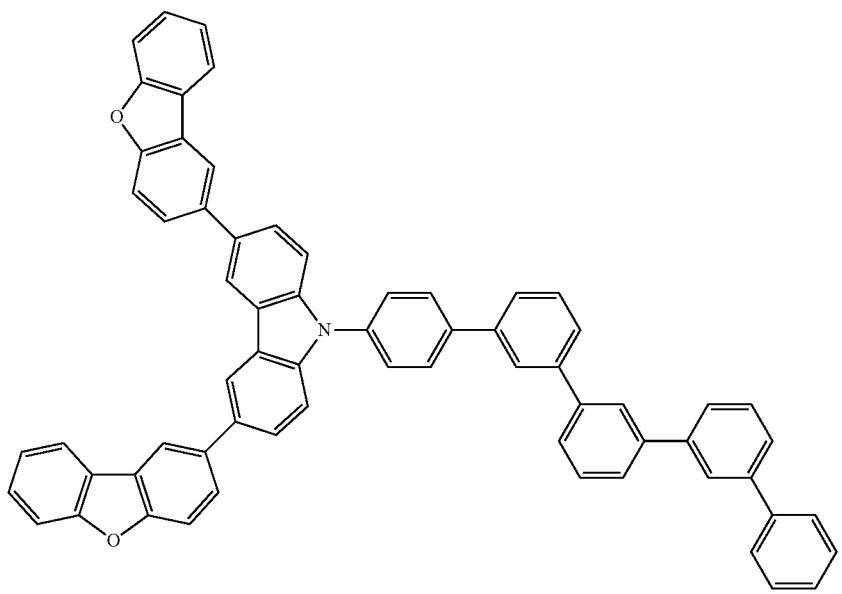
2-9
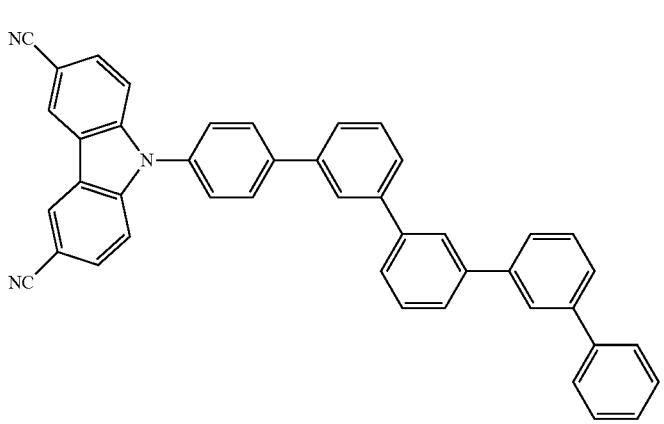
2-10

[Chemical Formula 16]
3-1
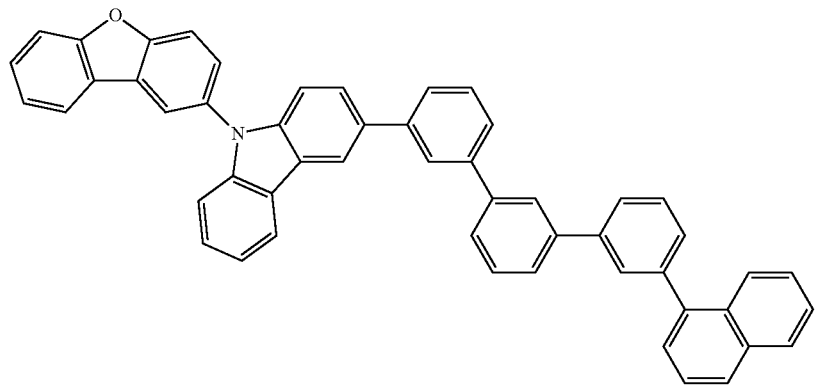
3-2 3-3
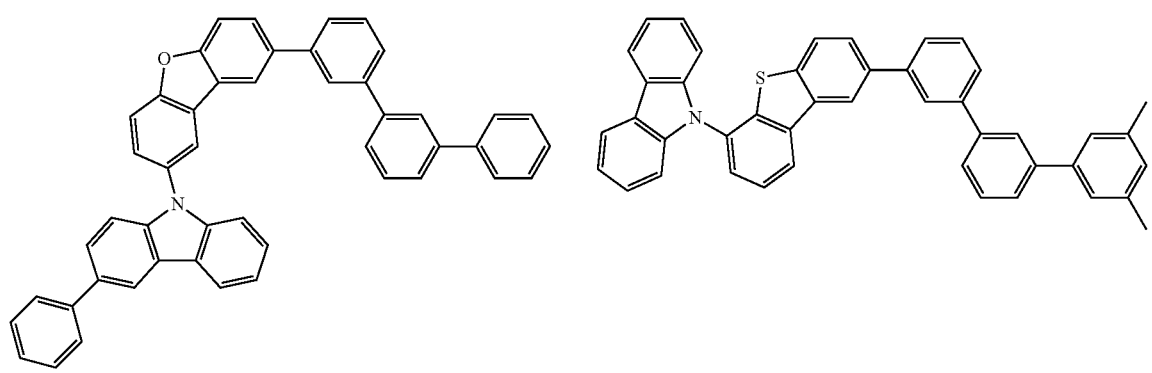
3-4 3-5
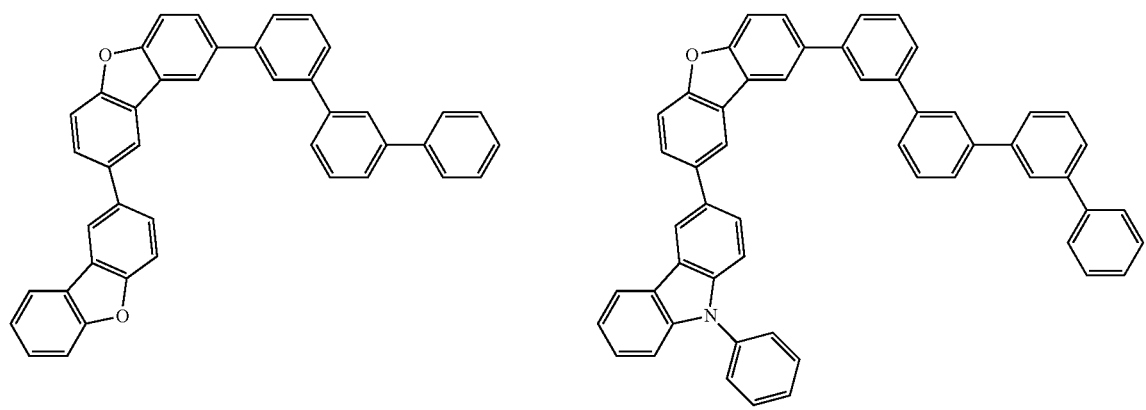
3-6
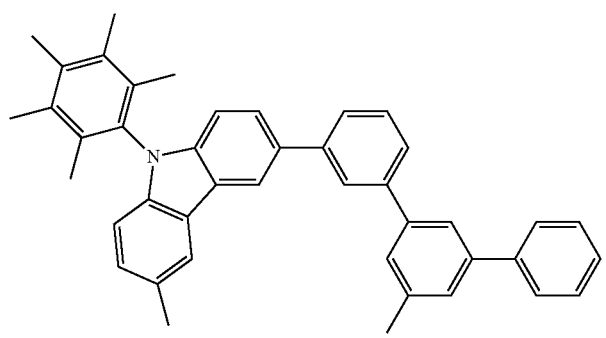

-continued
[Chemical Formula 17]
3-7
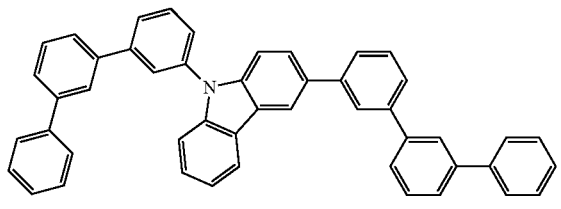
3-8
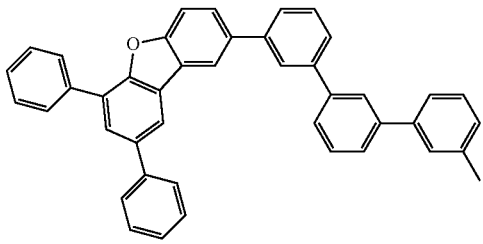
3-9
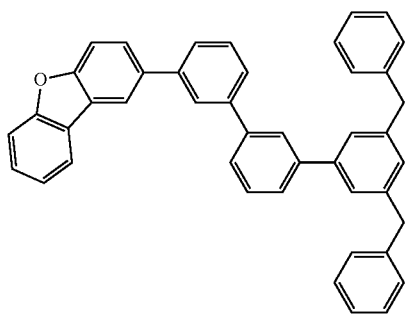
3-10
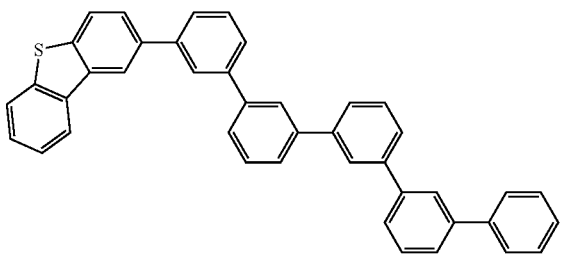
3-11
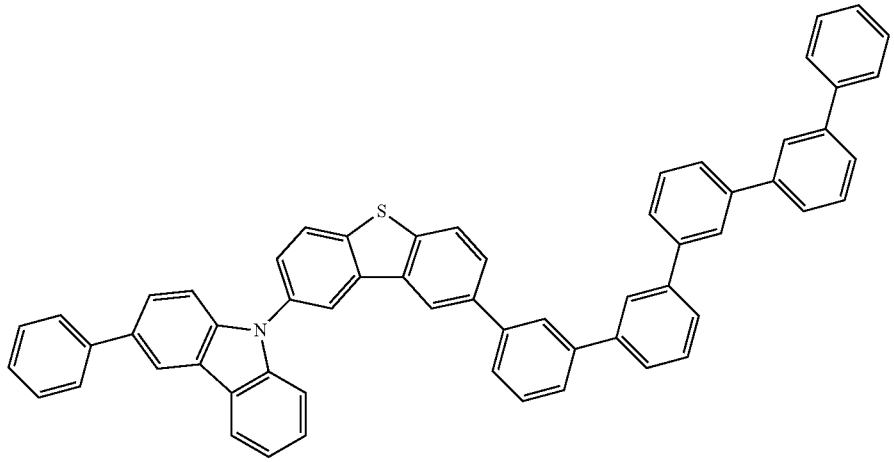
3-12
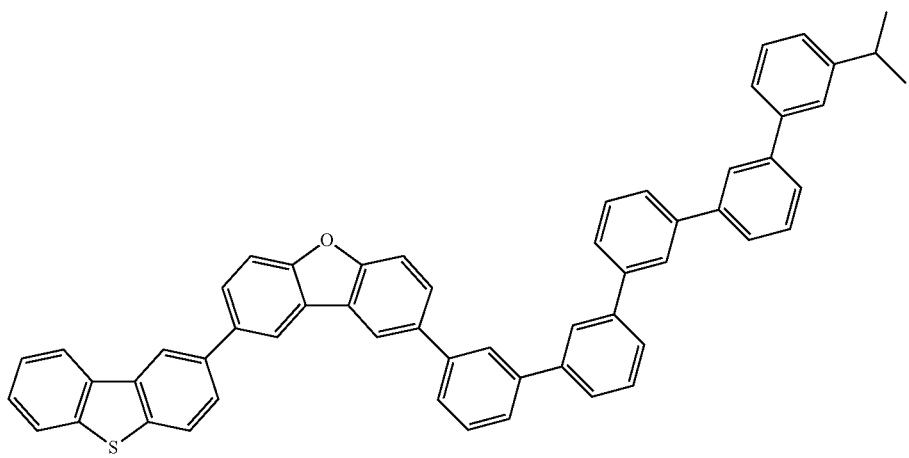

[Chemical Formula 18]
4-1
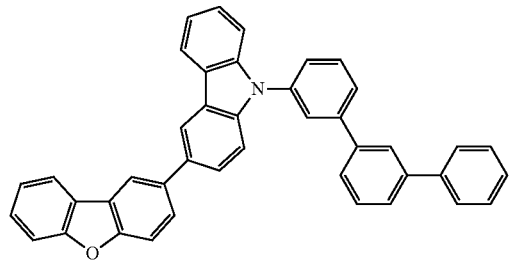
4-2
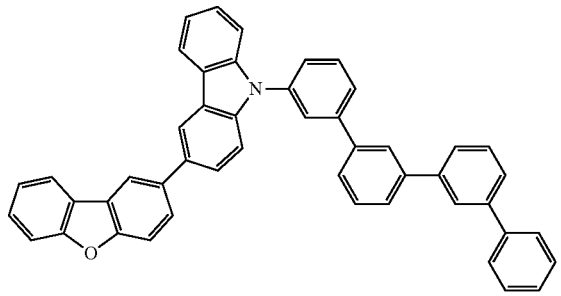
4-3
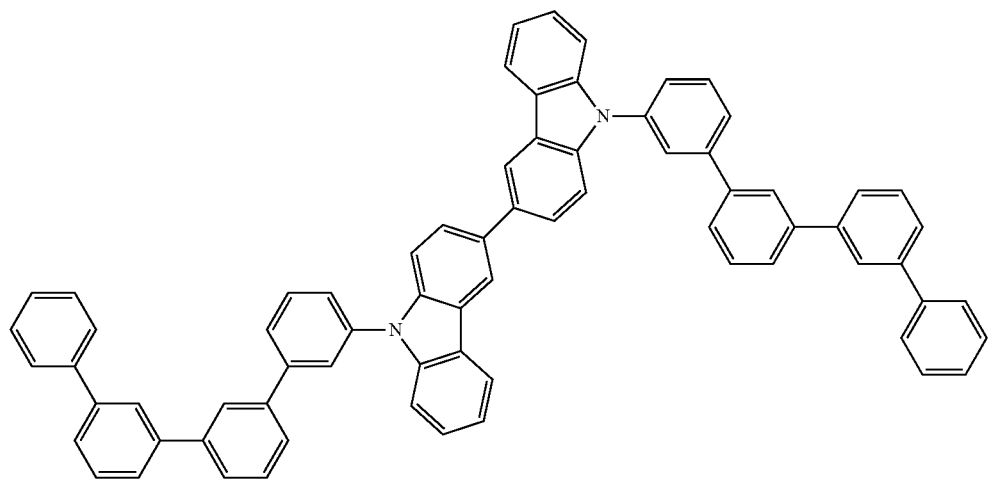
4-4
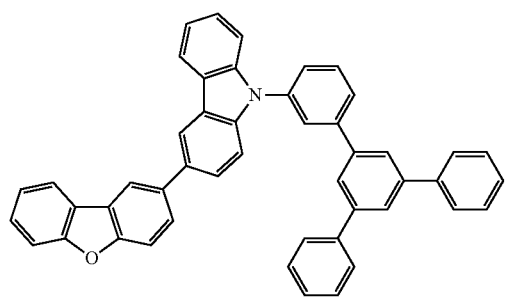
4-5
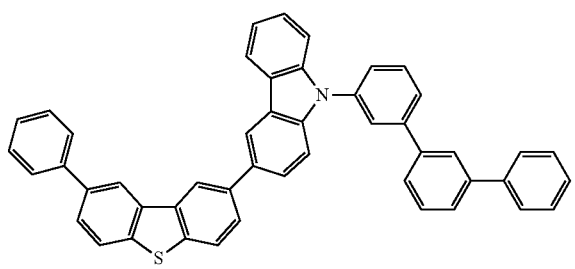
[Chemical Formula 19]
4-6
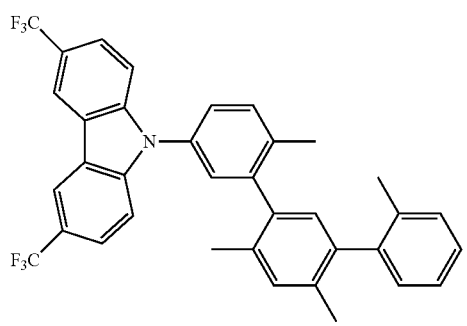
4-7
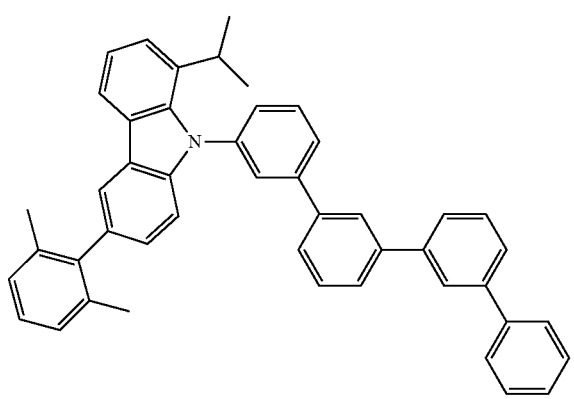

-continued
4-8
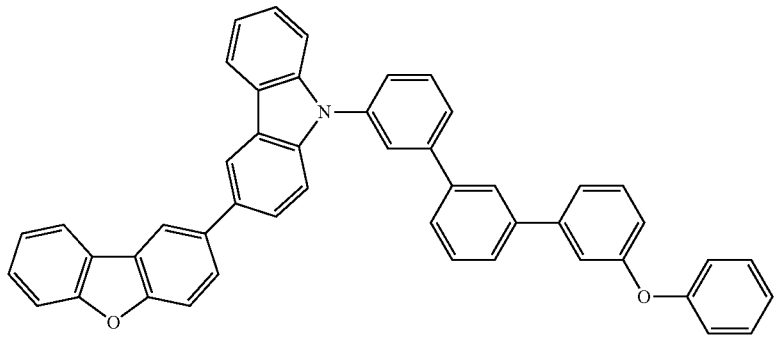
4-9
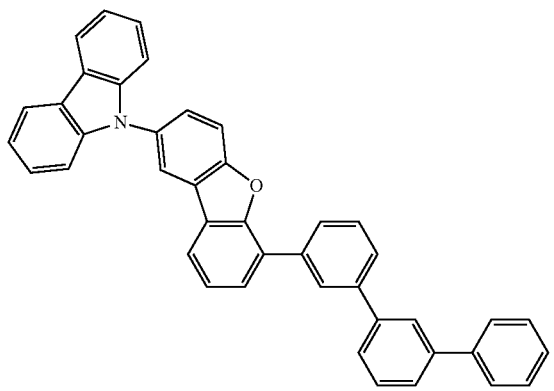
4-10
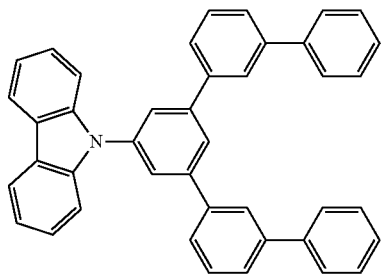
4-11
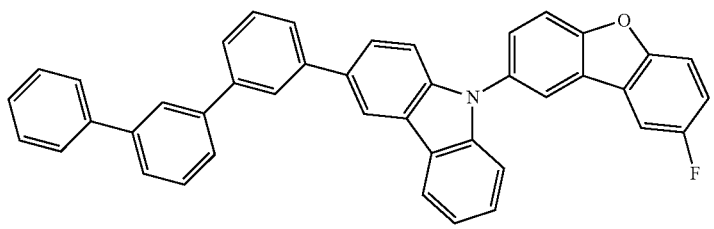
4-12
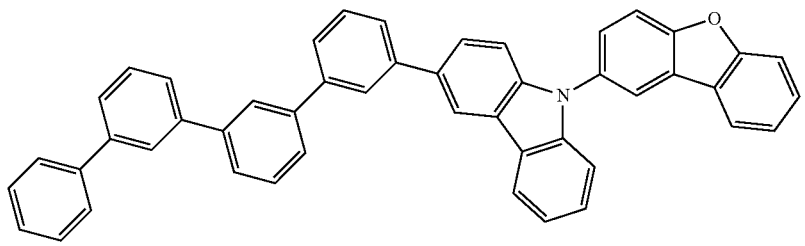
[Chemical Formula 20]
4-13
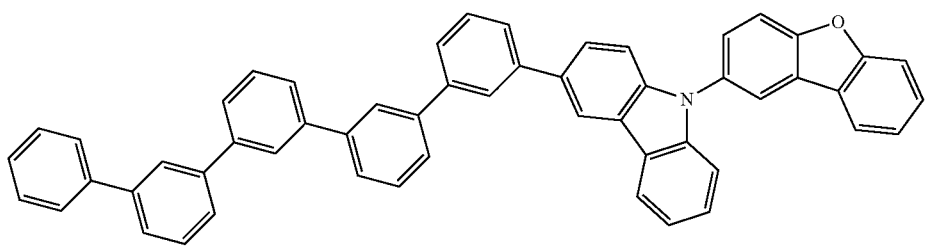

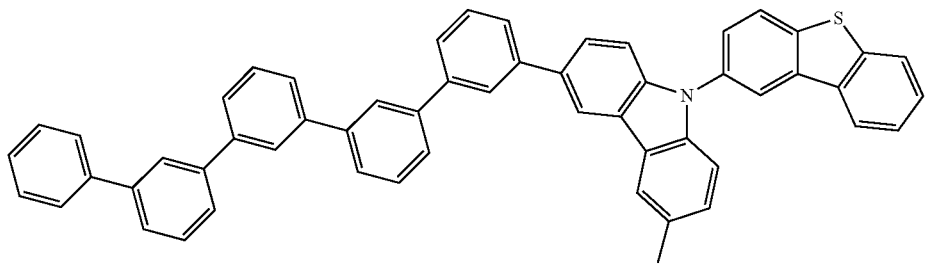
4-14
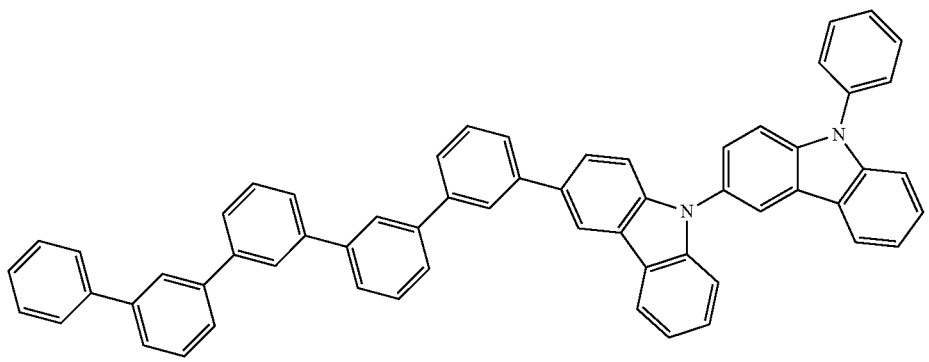
4-15
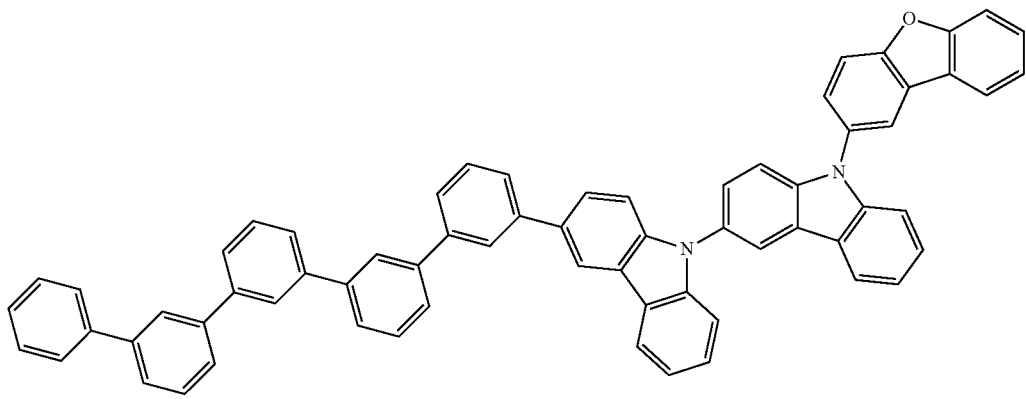
4-16
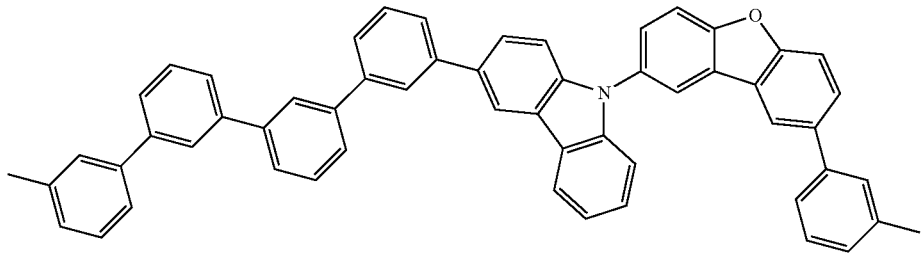
4-17

According to the present invention, the luminescent dopant contained in the luminous layer is preferably a phosphorescent compound represented by Formula (A1):

[Chemical Formula 21]

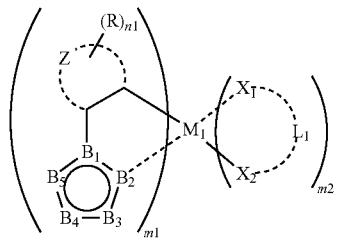

Formula (A1)

[Phosphorescent Compound Represented by Formula (A1)]

In Formula (A1), if R represents a substituent group, the substituent group has the same definition as that of $R_1$ to $R_{10}$ and Ra in Formula (1).

Z represents a nonmetallic atomic group necessary for formation of a five- to seven-member ring. Examples of the five- to seven-member ring composed of Z include benzene, naphthalene, pyridine, pyrimidine, pyrrole, thiophene, pyrazole, imidazole, oxazole, and thiazole rings. Among them, preferred is a benzene ring.

n1 represents an integer of 0 to 5.

$B_1$ to $B_5$ each represent a carbon atom, CRa, a nitrogen atom, NRb, an oxygen atom or a sulfur atom, with the proviso that at least one of $B_1$ to $B_5$ represents a nitrogen atom.

Ra and Rb each represent a hydrogen atom or a substituent group. The substituent group has the same definition as that of $R_1$ to $R_{10}$ and Ra in Formula (1).

The five atoms represented by $B_1$ to $B_5$ form an aromatic nitrogen-containing heterocycle. Examples of the aromatic nitrogen-containing heterocycle include pyrrole, pyrazole, imidazole, triazole, tetrazole, oxazole, isoxazole, thiazole, isothiazole, oxadiazole, and thiadiazole rings, and carbene-containing rings. Among them, preferred are pyrazole and imidazole rings, and carbene-containing rings.

$B_5$ and Z may be bonded to each other to form a ring.

$L_1$ represents an atomic group forming a bidentate ligand together with $X_1$ and $X_2$. Specific examples of the bidentate ligand represented by $X_1$-$L_1$-$X_2$ include substituted or unsubstituted phenylpyridine, phenylpyrazole, phenylimidazole, phenyltriazole, phenyltetrazole, pyrazabole, imidazophenanthridine, and acetylacetone. These groups may further be substituted by the above-described substituent groups.

m1 represents an integer of 1 to 3, and m2 represents an integer of 0 to 2, provided that m1+m2 is 2 or 3. In particular, m2 is preferably 0.

Examples of the metal represented by $M_1$ include transition metal elements (also simply referred to as "transition metals") belonging to any one of Groups 8 to 10 in the periodic table. Among these examples, preferred are iridium and platinum, more preferably iridium.

In Formula (A1), the aromatic heterocycle formed by $B_1$ to $B_5$ is preferably represented by any one of Formulae (DP-1a), (DP-1b) and (DP-1c):

[Chemical Formula 22]

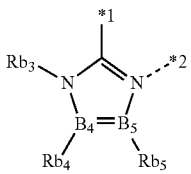

Formula (DP-1a)

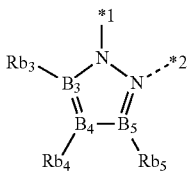

Formula (DP-1b)

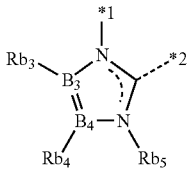

Formula (DP-1c)

In Formulae (DP-1a), (DP-1b) and (DP-1c), *1 represents a binding site to Z in Formula (A1), and *2 represents a binding site to $M_1$ in Formula (A1).

$Rb_3$ to $Rb_5$ each represent a hydrogen atom or a substituent group. The substituent group represented by each of $Rb_3$ to $Rb_5$ has the same definition as that of $R_1$ to $R_{10}$ and Ra in Formula (1).

In Formula (DP-1c), $Rb_5$ preferably represents an aromatic hydrocarbon ring group or a heterocyclic aromatic ring group.

In Formula (DP-1a), $B_4$ and $B_5$ each represent a carbon or nitrogen atom. More preferably, at least one of $B_4$ and $B_5$ is a carbon atom.

In Formula (DP-1b), $B_3$, $B_4$ and $B_5$ each represent a carbon or nitrogen atom. More preferably, at least one of $B_3$ to $B_5$ is a carbon atom.

In Formula (DP-1c), $B_3$ and $B_4$ each represent a carbon or nitrogen atom. More preferably, at least one of $B_3$ and $B_4$ is a carbon atom.

In one embodiment, Formula (A1) may be represented by Formula (DP-2)]:

[Chemical Formula 23]

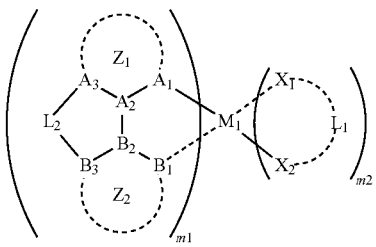

Formula (DP-2)

In Formula (DP-2), $M_1$, $X_1$, $X_2$, $L_1$, m1, and m2 respectively have the same definitions as those of $M_1$, $X_1$, $X_2$, $L_1$, m1, and m2 of Formula (A1).

$A_1$, $A_2$, $A_3$, $B_1$, $B_2$ and $B_3$ each represent a carbon or nitrogen atom. Ring $Z_1$ represents a six-member aromatic hydrocarbon ring or a five- or six-member heterocyclic aromatic ring composed of atoms including $A_1$ and $A_2$, and ring $Z_2$ represents a five-member heterocyclic aromatic ring composed of atoms including $B_1$ to $B_3$. $L_2$ represents a bivalent linking group.

Examples of the bivalent linking group represented by $L_2$ include alkylene, alkenylene, arylene, and heteroarylene groups, bivalent heterocyclic ring groups, —O—, —S—, and any combination thereof.

Formula (DP-2) is preferably represented by Formula (DP-2a):

[Chemical Formula 24]

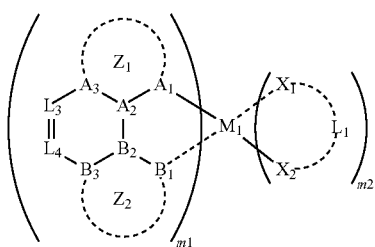

Formula (DP-2a)

In Formula (DP-2a), $M_1$, $X_1$, $X_2$, $L_1$, m1, m2, ring $Z_1$, ring $Z_2$, $A_1$, $A_2$, $A_3$, $B_1$, $B_2$ and $B_3$ respectively have the same definitions as those of $M_1$, $X_1$, $X_2$, $L_1$, m1, m2, ring $Z_1$, ring $Z_2$, $A_1$, $A_2$, $A_3$, $B_1$, $B_2$ and $B_3$ in Formula (DP-2).

$L_3$ and $L_4$ each represent C—$Rb_6$ or a nitrogen atom, and $Rb_6$ represents a hydrogen atom or a substituent group. If $L_3$ and $L_4$ each represent C—$Rb_6$, $Rb_6$ of $L_3$ and $Rb_6$ of $L_4$ may be bonded to each other to form a ring. The substituent group represented by $Rb_6$ has the same definition as that of $R_1$ to $R_{10}$ and Ra in Formula (1).

Formula (DP-2a) is preferably represented by Formula (DP-2b).

[Chemical Formula 25]

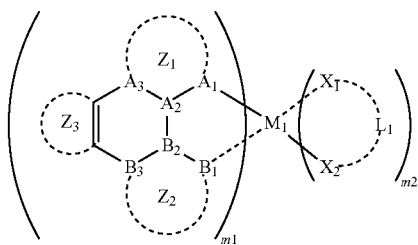

Formula (DP-2b)

In Formula (DP-2b), $M_1$, $X_1$, $X_2$, $L_1$, m1, m2, ring $Z_1$, ring $Z_2$, $A_1$, $A_2$, $A_3$, $B_1$, $B_2$ and $B_3$ respectively have the same definition as those of $M_1$, $X_1$, $X_2$, $L_1$, m1, m2, ring $Z_1$, ring $Z_2$, $A_1$, $A_2$, $A_3$, $B_1$, $B_2$ and $B_3$ in Formula (DP-2).

The ring $Z_3$ is preferably a substituted or unsubstituted benzene, pyridine, or thienyl ring, more preferably a benzene ring.

In Formula (DP-2b), the aromatic heterocycle composed of $B_1$ to $B_3$ and $Z_2$ is preferably represented by any one of Formula (DP-1a), (DP-1b) and (DP-1c). In Formulae (DP-1a), (DP-1b), and (DP-1c), *1 represents a binding site to $Z_1$ of Formula (DP-2b) and *2 represents a binding site to $M_1$ of Formula (DP-2b).

In Formulae (DP-1a), (DP-1b), (DP-1c), (DP-2), (DP-2a), and (DP-2b), preferably $A_2$ is a carbon atom, and more preferably also $A_1$ is a carbon atom. Moreover, the ring represented by $Z_1$ is preferably a substituted or unsubstituted benzene, pyridine, or thienyl ring, and more preferably a benzene ring.

Non-limiting specific examples of the phosphorescent compounds represented by Formula (A1) are as follows:

[Chemical Formula 26]

D1

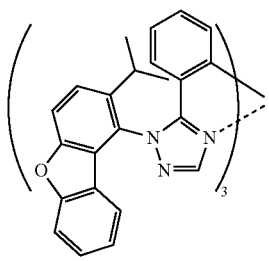

D2

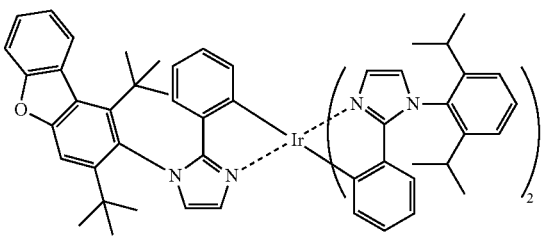

D3

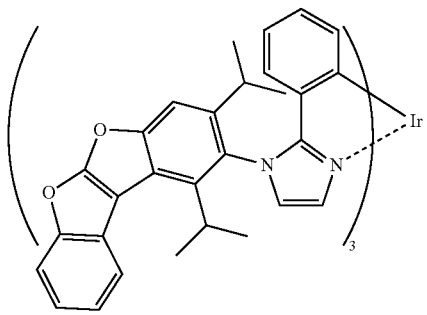

D4

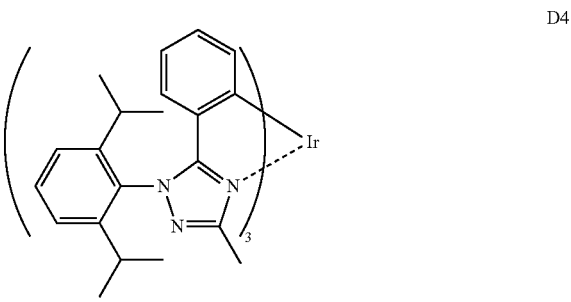

-continued
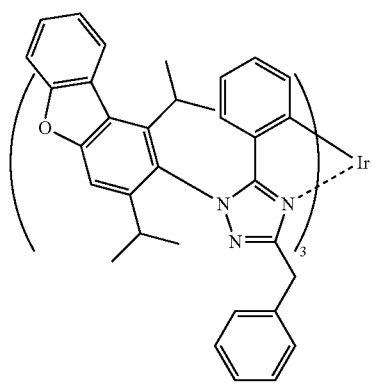
D5
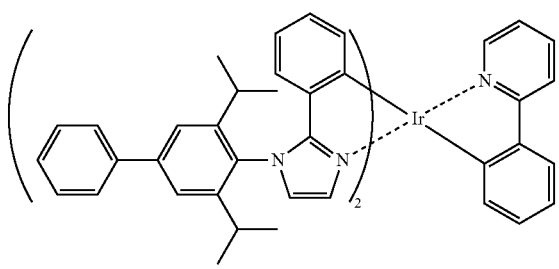
D6
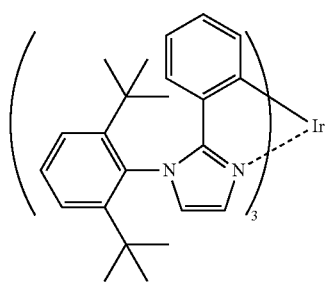
D7
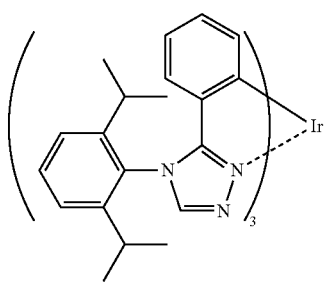
D8
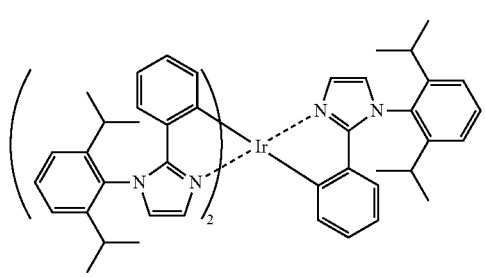
D9
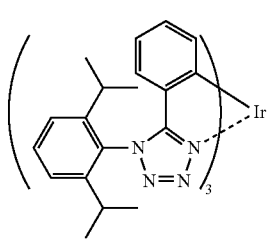
D10
[Chemical Formula 27]
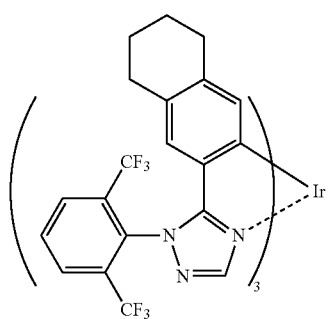
D11
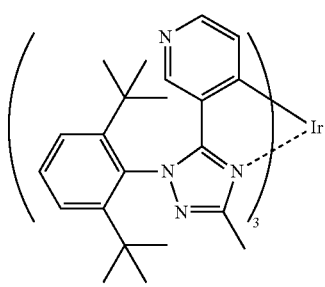
D12

-continued
D13
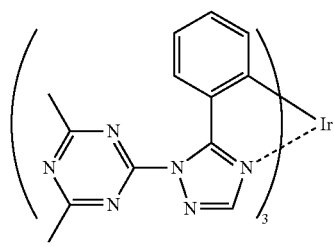
D14
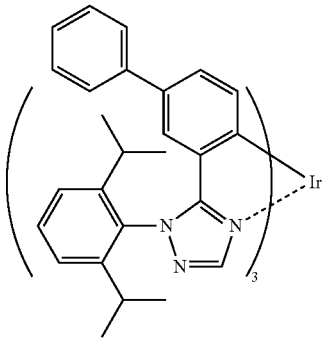
D15
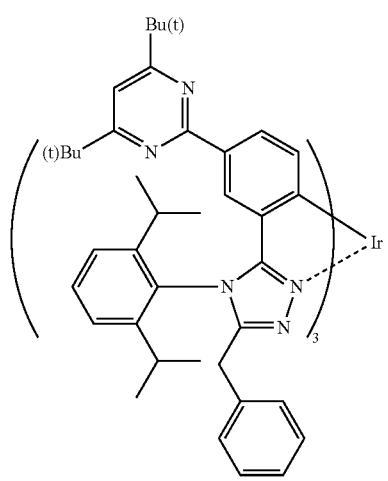
D16
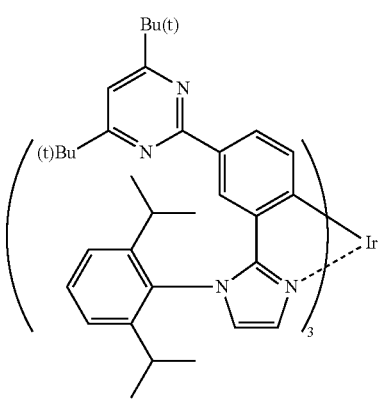
D17
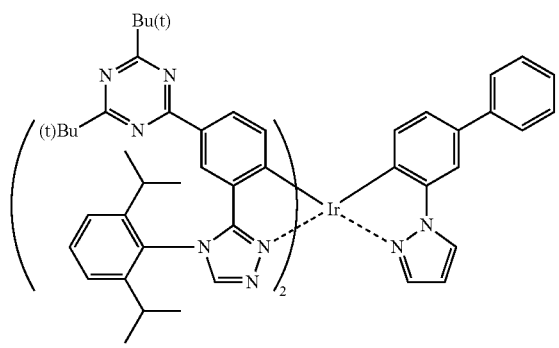
D18
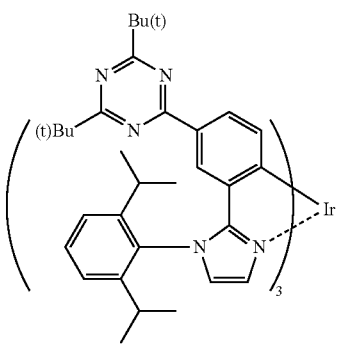
D19
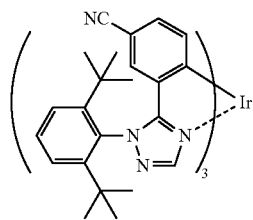
D20
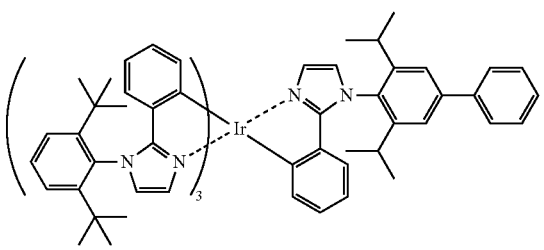

[Chemical Formula 28]
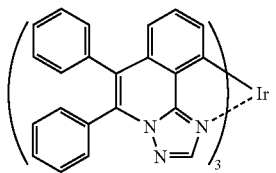
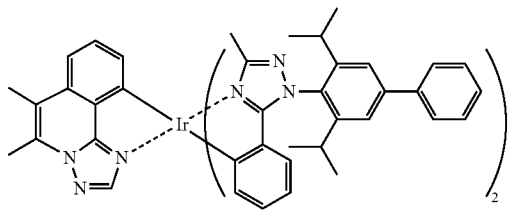
D21, D22
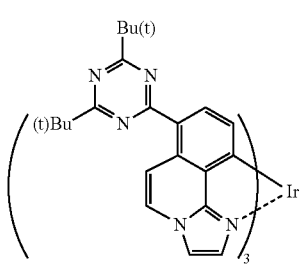
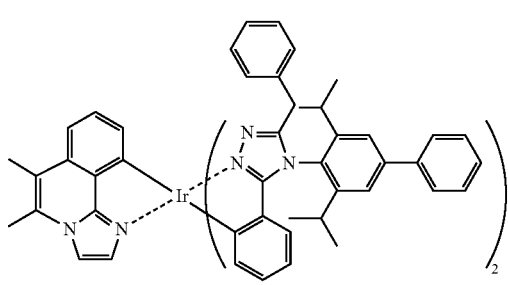
D23, D24
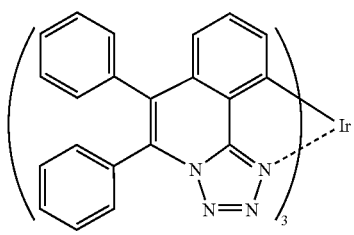
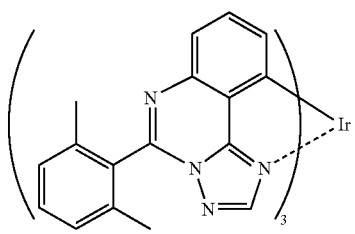
D25, D26
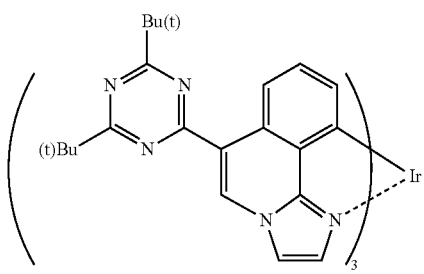
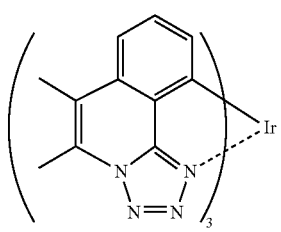
D27, D28
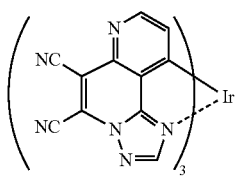
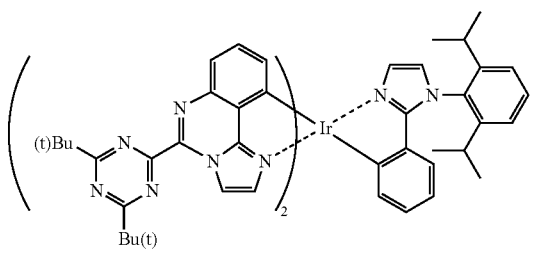
D29, D30

[Chemical Formula 29]
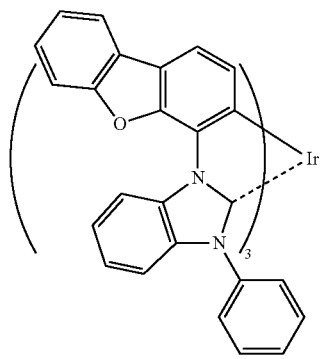 D31
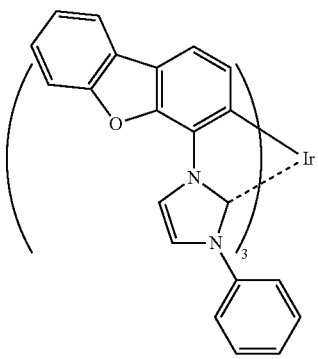 D32
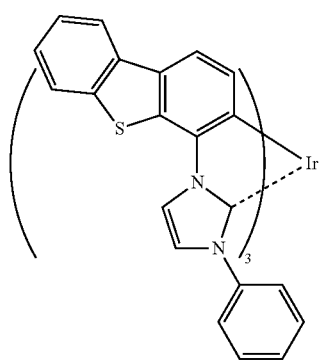 D33
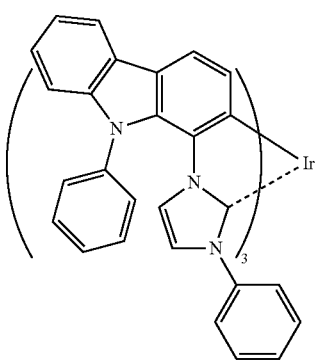 D34
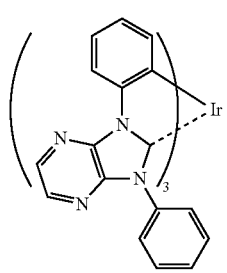 D35
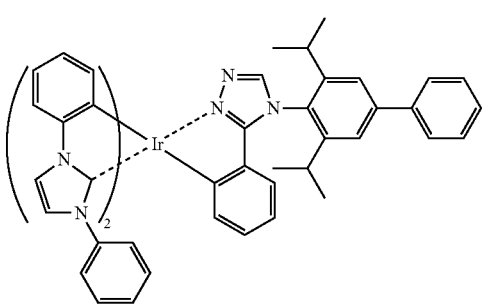 D36
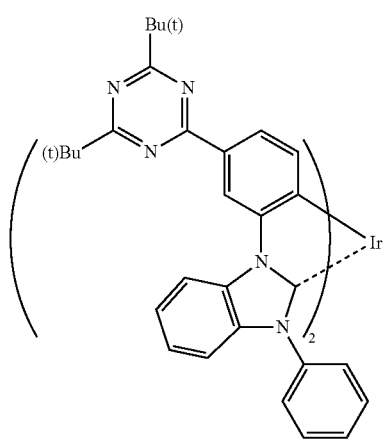 D37
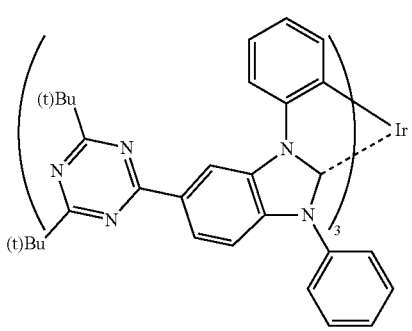 D38

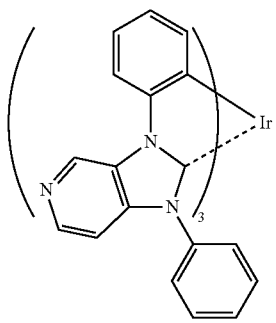 D39
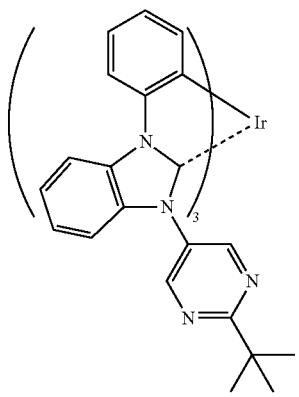 D40
[Chemical Formula 30]
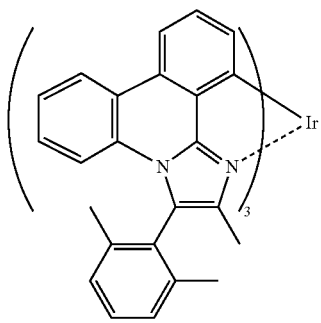 D41
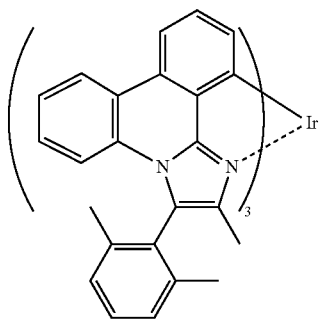 D42
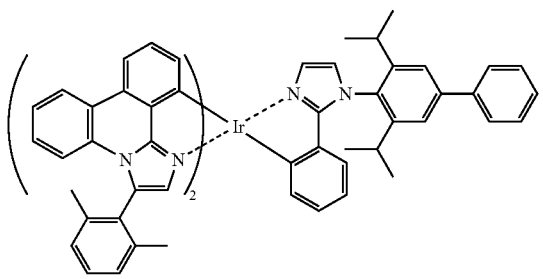 D43
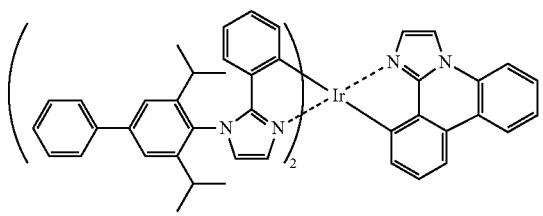 D44
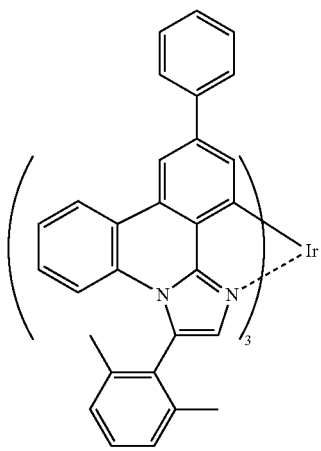 D45
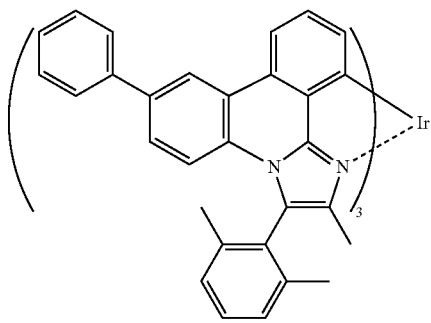 D46

D47 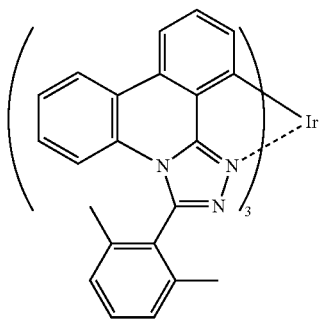
D48 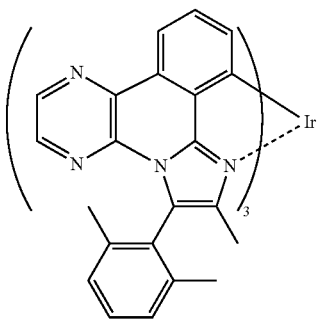
D49 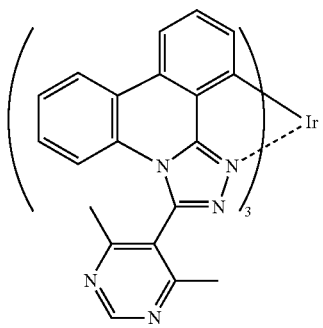
D50 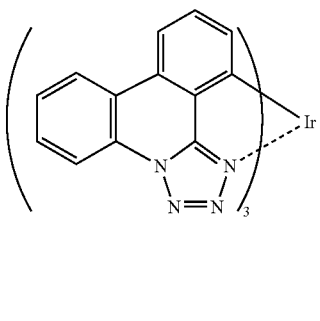
[Chemical Formula 31]
D51 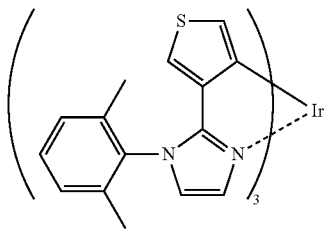
D52 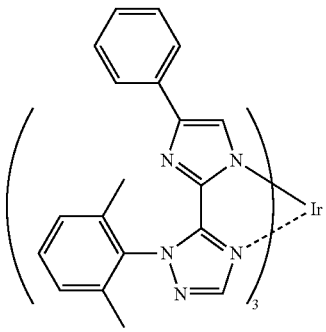
D53 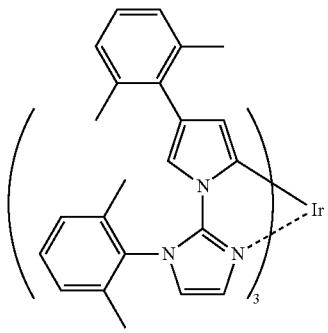
D54 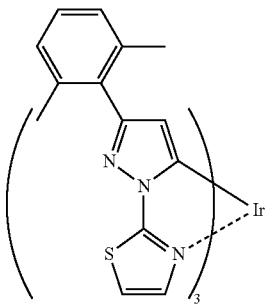
D55 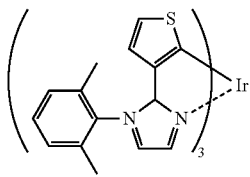
D56 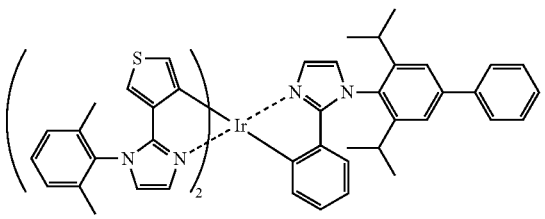

-continued
D57
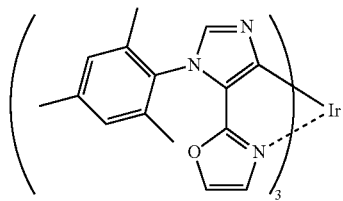
D58
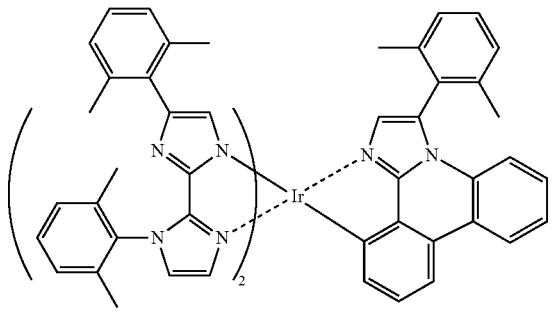
D59
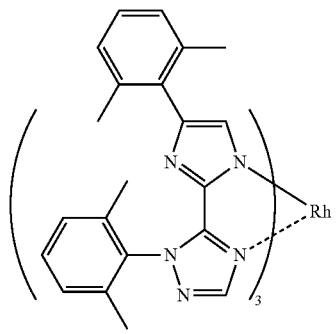
D60
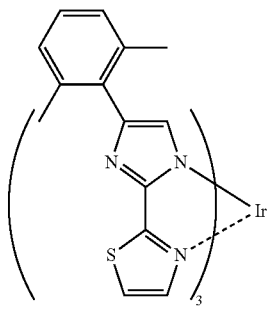
[Chemical Formula 32]
D61
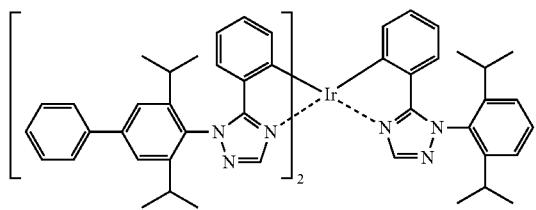
D62
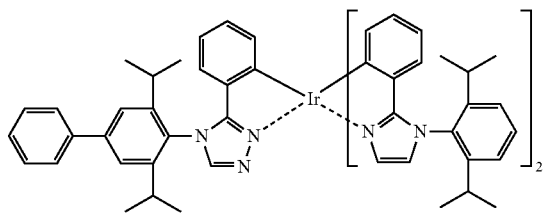
D63
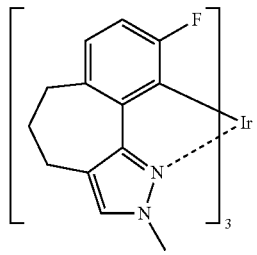
D64
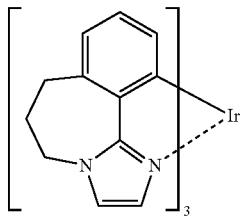
D65
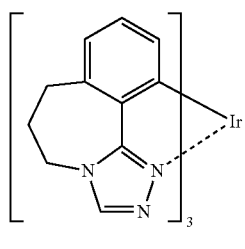
D66
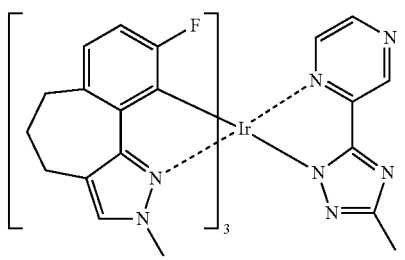

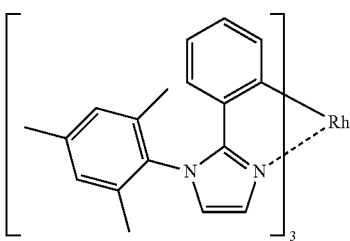
D67

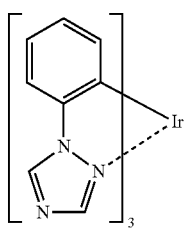
D68

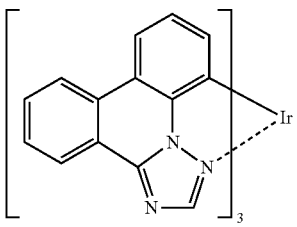
D69

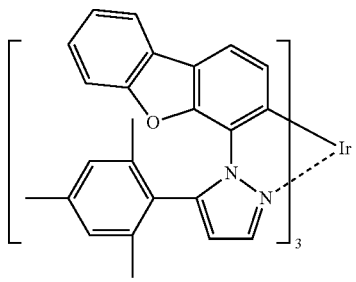
D70

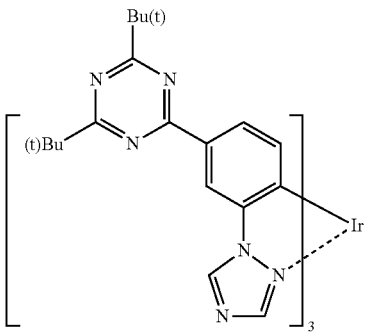
D71

[Layer Structure of the Organic EL Element]

In a preferred embodiment, the organic EL element of the present invention includes a luminous layer disposed between an anode and a cathode, the luminous layer including a compound represented by Formula (1) and a compound represented by Formula (A1).

In a preferred embodiment, the compound represented by Formula (1) serves as a host compound, and the compound represented by Formula (A1) serves as a luminescent dopant.

Non-limiting specific examples of the preferred layer structures of the inventive organic EL element are as follows:
(i) Anode/luminous layer/electron transport layer/cathode
(ii) Anode/hole transport layer/luminous layer/electron transport layer/cathode
(iii) Anode/hole transport layer/luminous layer/hole blocking layer/electron transport layer/cathode
(iv) Anode/hole transport layer/luminous layer/hole blocking layer/electron transport layer/cathode buffer layer/cathode
(v) Anode/anode buffer layer/hole transport layer/luminous layer/hole blocking layer/electron transport layer/cathode buffer layer/cathode
(vi) Anode/hole transport layer/electron blocking layer/luminous layer/hole blocking layer/electron transport layer/cathode The organic EL element of the present invention preferably includes monochromatic luminous layers, i.e., a blue luminous layer preferably having a maximum emission wavelength within a range of 430 nm to 480 nm, a green luminous layer preferably having a maximum emission wavelength within a range of 510 nm to 550 nm, and a red luminous layer preferably having a maximum emission wavelength within a range of 600 nm to 640 nm. The display device of the invention is preferably provided with such luminous layers.

The luminous layer may also be a white luminous layer having a multilayer structure composed of at least these three luminous layers, and the illumination device of the invention is preferably provided with such a luminous layer.

A non-luminous intermediate layer may also be provided between any two luminous layers.

The layers constituting the organic EL element of the present invention will now be described in detail.

<Luminous Layer>

The luminous layer of the present invention emits light by recombination of injected electrons and holes. The luminous site may be inside the luminous layer or may be the interface between the luminous layer and an adjoining layer thereof.

The luminous layer may have any total thickness, but is preferably adjusted within a range of 2 nm to 5 μm, more preferably within a range of 2 to 200 nm, particularly preferably within a range of 10 to 20 nm, from the viewpoints of uniformity of the film to be formed, to avoid application of an excessive high voltage at the time of light emission, and increase in stability of the color of emitted light with respect to a driving current.

The luminous layer can be produced by forming a film from a luminescent dopant and a host compound described below by any known deposition technique, for example, vacuum vapor deposition, spin coating, casting, Langmuir Blodgett (LB) coating, or ink jetting.

The luminous layer of the organic EL element of the present invention contains a host compound and at least one luminescent dopant (such as phosphorescent dopant or fluorescent dopant).

The host compound is preferably represented by Formula (1), and other compounds applicable as the host compound will be described below. The luminescent dopant is preferably represented by Formula (A1), and other compounds applicable as the luminescent dopant will also be described below.

<<Host Compound>>

As used herein, the term "host compound" (also referred to as "luminescent host") refers to a compound which is contained in a mass ratio of 20% or more in the luminous layer and has a phosphorescence quantum yield of less than 0.1 at room temperature (25° C.). The host compound preferably has a phosphorescence quantum yield of less than 0.01 and is preferably contained in a mass ratio of 20% or more in the luminous layer.

The host compound is composed of a compound represented by Formula (1), which may be used in combination with one or more known host compounds. Use of a plurality of host compounds can control the charge transfer, resulting in high luminous efficiency of the organic EL element. Use of a plurality of luminescent dopants described below also can emit light with a mixture of different colors, resulting in emission of light with an intended color.

The host compound used in the present invention may be any known compound having a low molecular weight, a polymer having repeating units, or a low-molecular-weight compound having a polymerizable group, such as a vinyl group or an epoxy group (vapor deposition polymerizable luminous host).

Preferred known host compounds which may be used in combination with the compound represented by Formula (1) have hole and electron transportability, can prevent the shift of emission toward a longer wavelength, and have a high glass transition temperature (Tg).

Specific examples of the known host compound include compounds described in the following patents:

Japanese Patent Application Laid-Open Publication Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084, and 2002-308837.

[Chemical Formula 33]

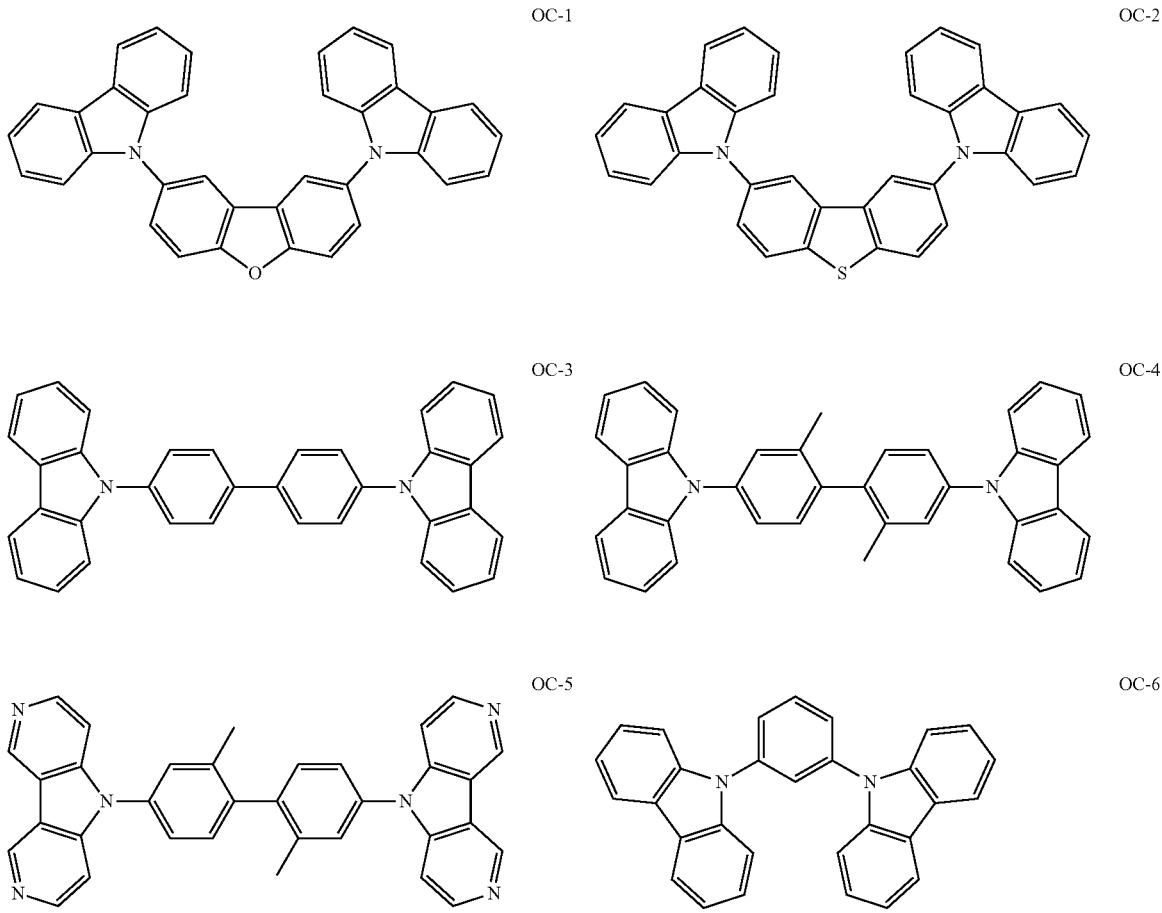

-continued
OC-7
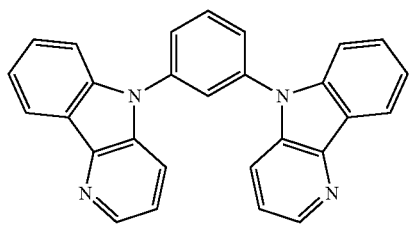
OC-8
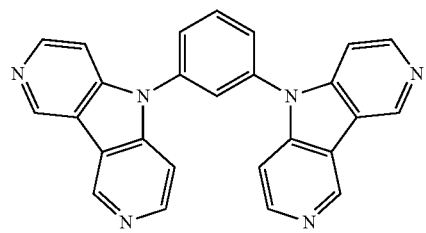
OC-9
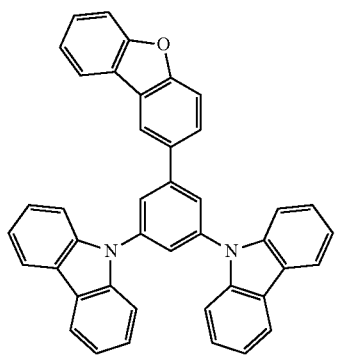
OC-10
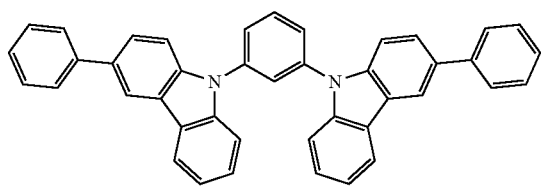
[Chemical Formula 34]
OC-11
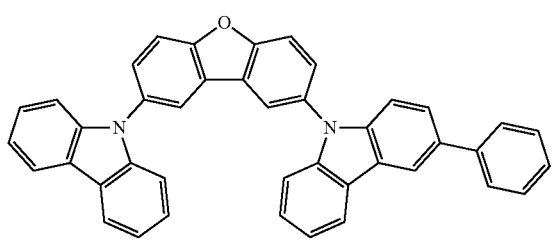
OC-12
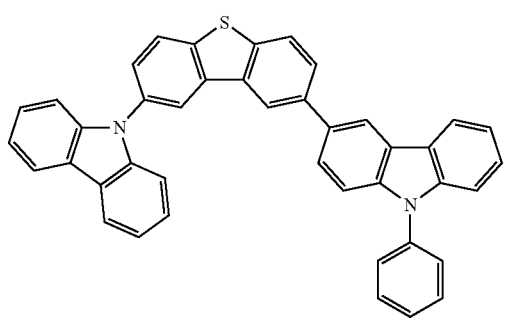
OC-13
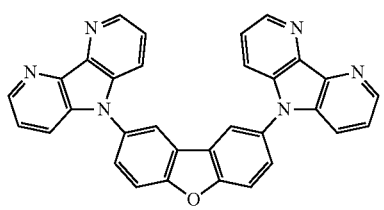
OC-14
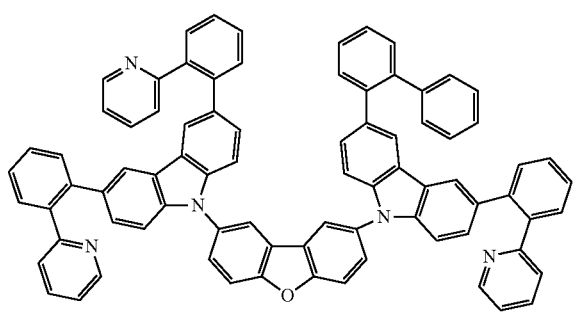

OC-15
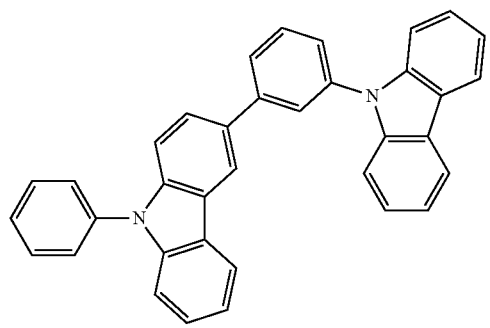
OC-16
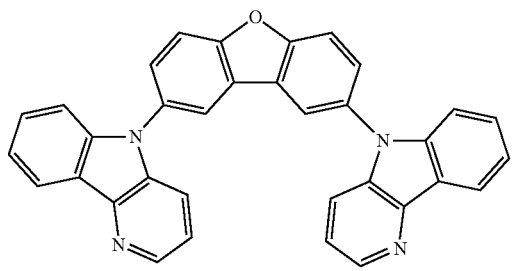
OC-17
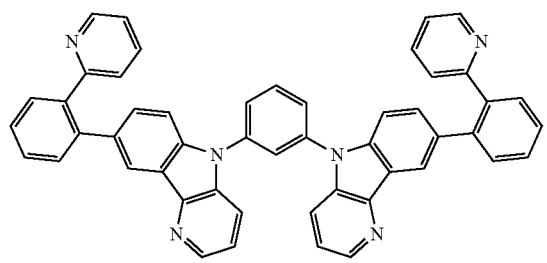
[Chemical Formula 35]
OC-18
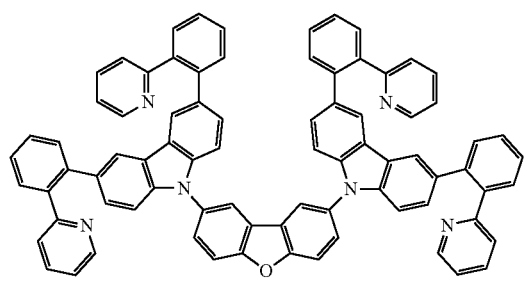
OC-19
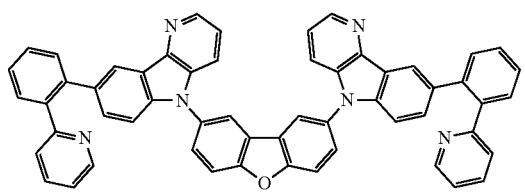
OC-20
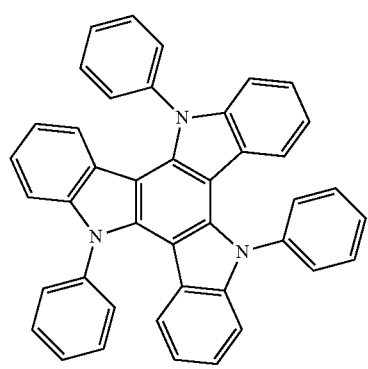
OC-21
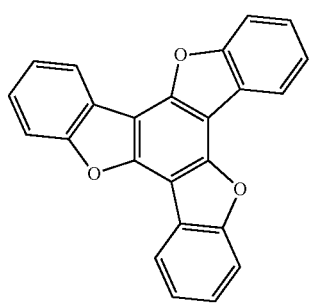
OC-22
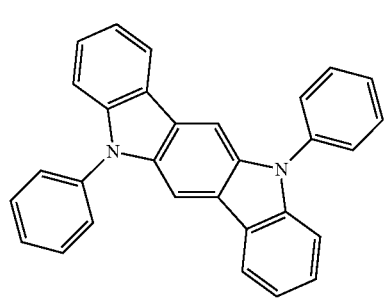

OC-23
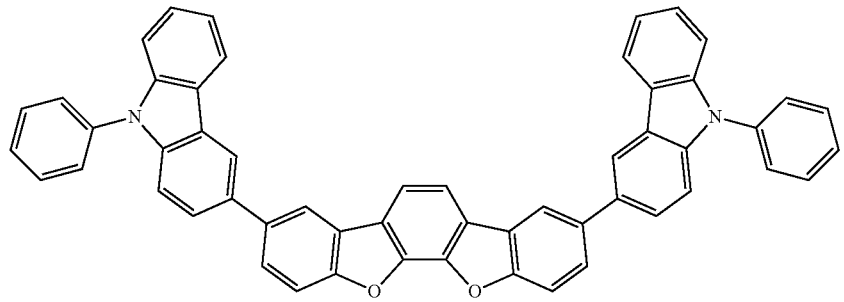
[Chemical Formula 36]
OC-24  OC-25
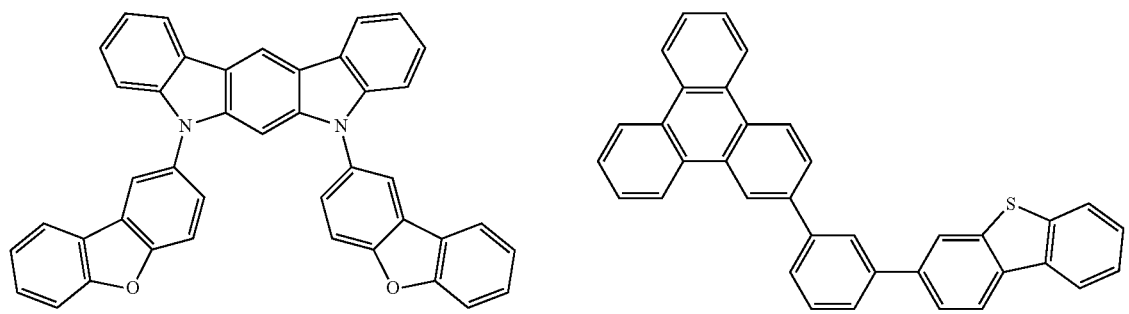
OC-26  OC-27
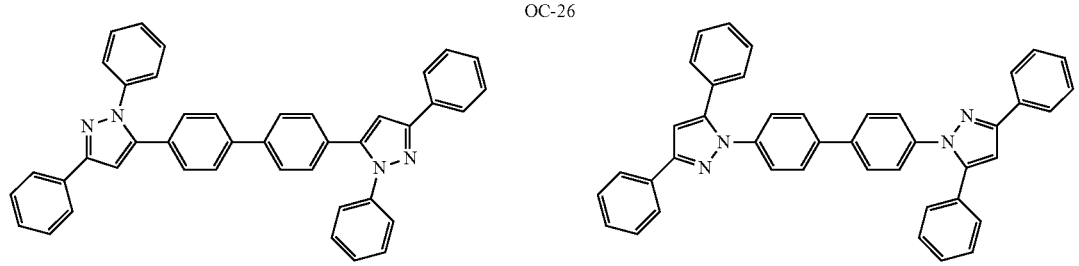
OC-28
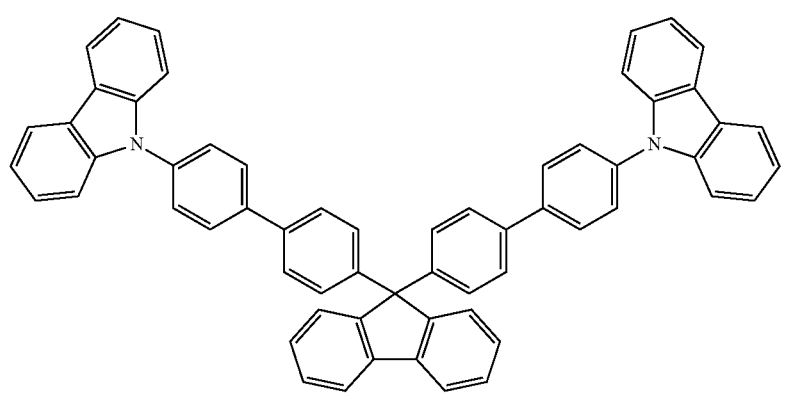

[Chemical Formula 37]
OC-29
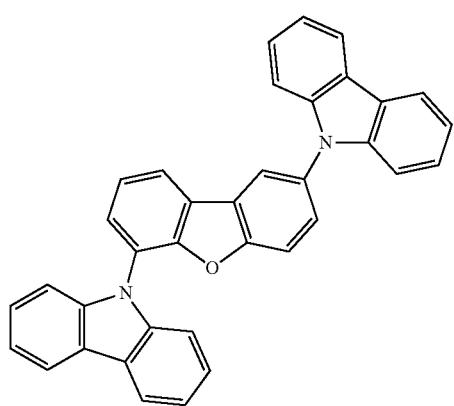
OC-30
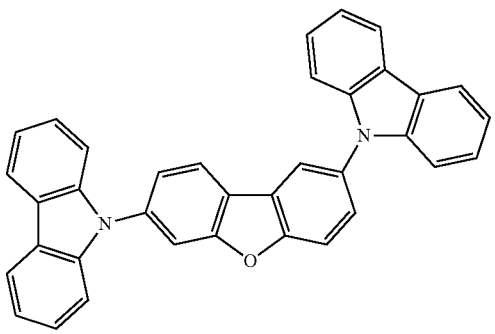
OC-31
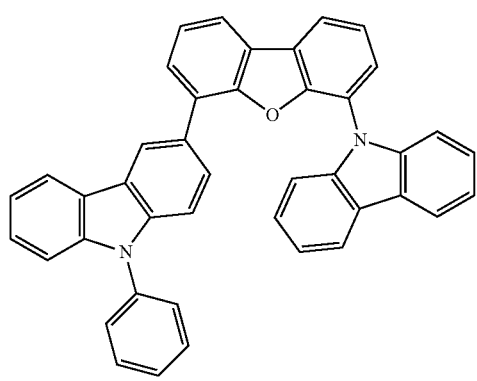
OC-32
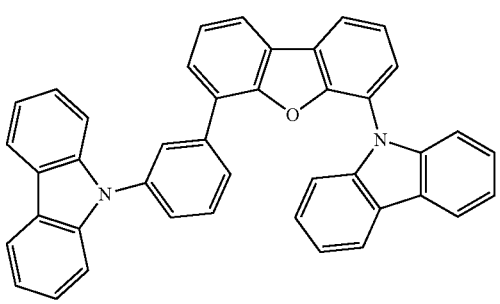
OC-33
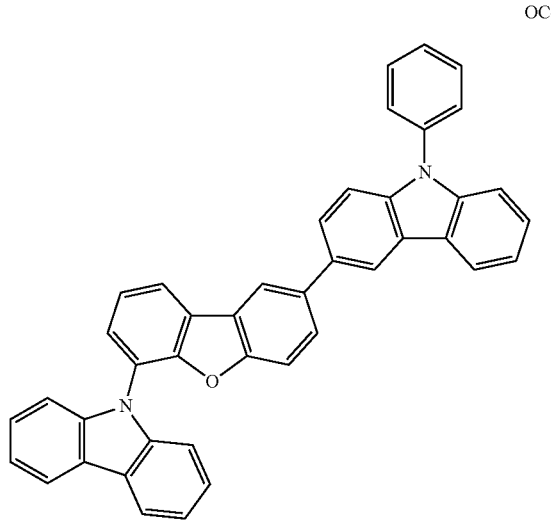
OC-34
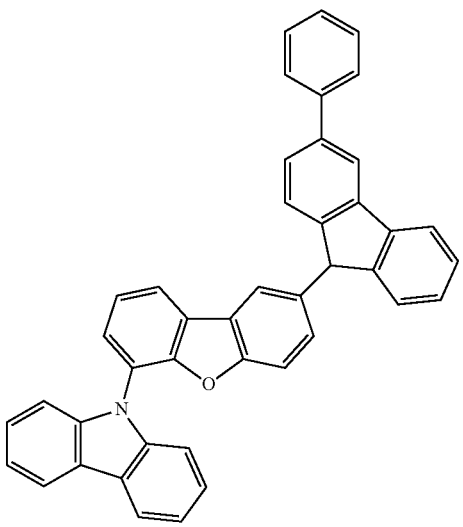

OC-35

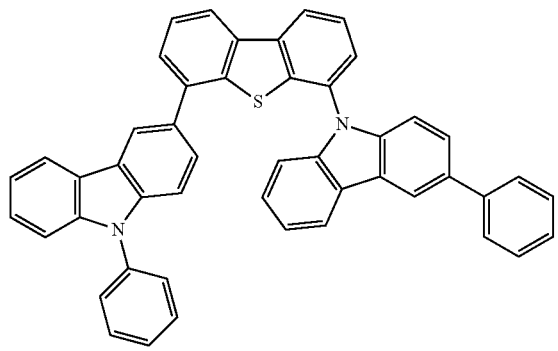

OC-36

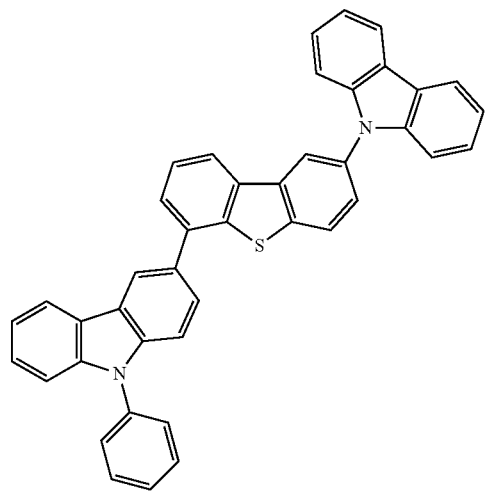

<<Luminescent Dopant>>

The luminescent dopant may be a fluorescent dopant (also referred to as "fluorescent compound") or a phosphorescent dopant (also referred to as "phosphorescent body" or "phosphorescent compound"). The luminescent dopant (also simply referred to as "luminescent material") applicable for the luminous layer and the luminous unit of the organic EL element of the present invention is preferably a phosphorescent dopant used in combination with the host compound described above, from the viewpoint of higher luminous efficiency of the organic EL element.

<<Phosphorescent Dopant>>

The phosphorescent dopant is a compound which can emit light from the excited triplet, specifically, can emit phosphorescent light at room temperature (25° C.) and is defined as a compound having a phosphorescence quantum yield of 0.01 or more at 25° C. The phosphorescence quantum yield is preferably 0.1 or more.

The phosphorescence quantum yield can be measured by the method described in "Dai 4 Han Jikken Kagaku Koza, 7. Bunkoh II" on page 398 (Series of Experimental Chemistry 4th Edition, 7. Spectroscopy II) (1992, published by Maruzen Co., Ltd.). The phosphorescence quantum yield in a solution can be measured using any appropriate solvent. The only requirement for the phosphorescent dopant used in the present invention is to have the phosphorescence quantum yield described above (0.01 or more) in any appropriate solvent.

There are two principles of light emission of a phosphorescent dopant. One is emission based on energy transfer, which involves the recombination of carriers on a host compound onto which the carriers are transferred to produce an excited state of the host compound, and then light emission from a phosphorescent dopant due to transfer of this energy to the phosphorescent dopant. The other is emission based on a carrier trap, in which a phosphorescent dopant serves as a carrier trap to cause recombination of carriers on the phosphorescent dopant, and thereby light emission from the phosphorescent dopant occurs. In each case, it is essential that the energy in the excited state of the phosphorescent dopant be lower than that in the excited state of the host compound.

A compound represented by Formula (A1) can be used as the phosphorescent dopant.

Any conventionally known compounds described in the following patents may be used in combination for the luminous layer of the present invention:

WO00/70655, Japanese Patent Application Laid-Open Publication Nos. 2002-280178, 2001-181616, 2002-280179, 2001-181617, 2002-280180, 2001-247859, 2002-299060, 2001-313178, 2002-302671, 2001-345183, and 2002-324679, WO02/15645, Japanese Patent Application Laid-Open Publication Nos. 2002-332291, 2002-50484, 2002-332292, and 2002-83684, Japanese Publication of International Patent Application No. 2002-540572, Japanese Patent Application Laid-Open Publication Nos. 2002-117978, 2002-338588, 2002-170684, and 2002-352960, WO01/93642, Japanese Patent Application Laid-Open Publication Nos. 2002-50483, 2002-100476, 2002-173674, 2002-359082, 2002-175884, 2002-363552, 2002-184582, and 2003-7469, Japanese Publication of International Patent Application No. 2002-525808, Japanese Patent Application Laid-Open Publication No. 2003-7471, Japanese Publication of International Patent Application No. 2002-525833, Japanese Patent Application Laid-Open Publication Nos. 2003-31366, 2002-226495, 2002-234894, 2002-235076, 2002-241751, 2001-319779, 2001-319780, 2002-62824, 2002-100474, 2002-203679, 2002-343572, and 2002-203678.

The phosphorescent dopant of the present invention is preferably a complex compound containing a metal belonging to any one of Groups 8 to 10 in the periodic table, more preferably an iridium, osmium, or platinum complex (platinum-group complex) or rare earth complex. Most preferred is an iridium complex.

The following known luminescent dopants may also be used in combination.

[Chemical Formula 38]
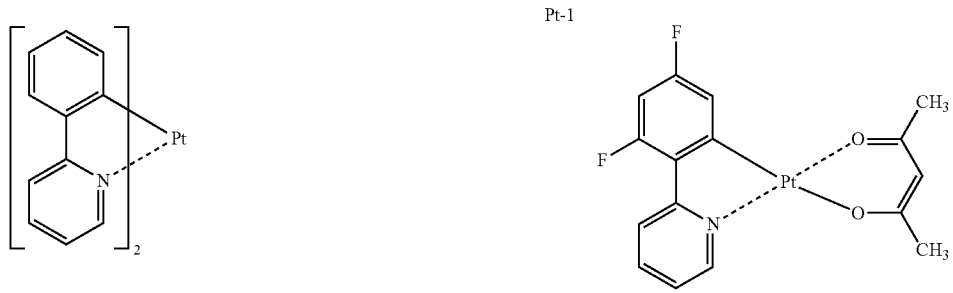
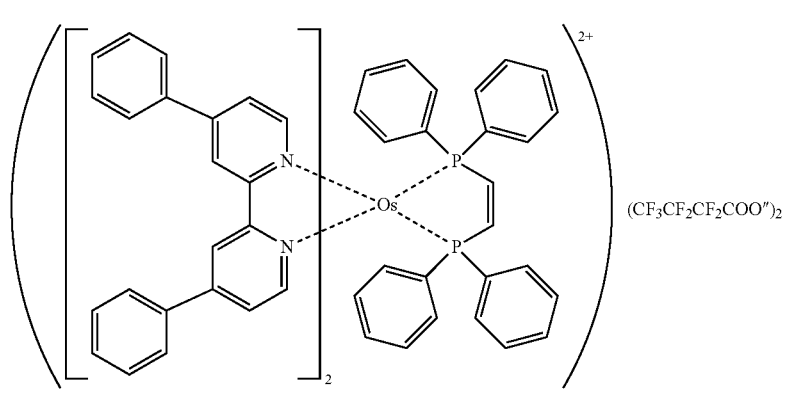
[Chemical Formula 39]
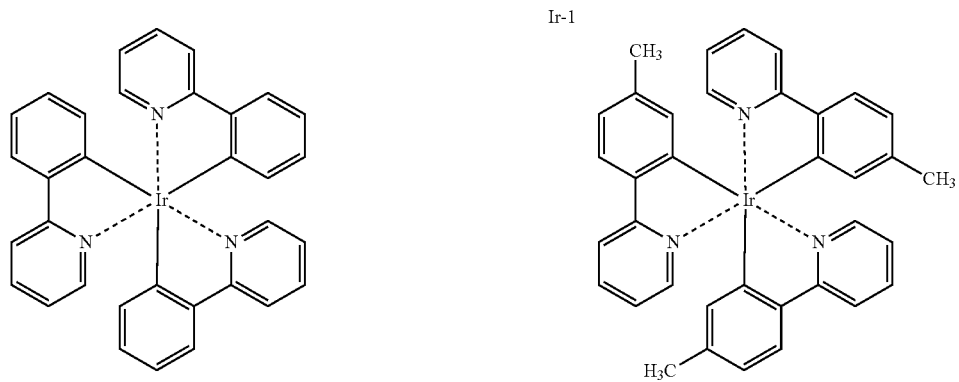

Ir-3
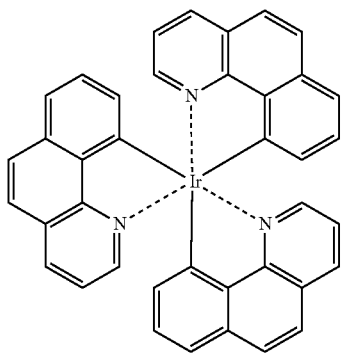
Ir-4
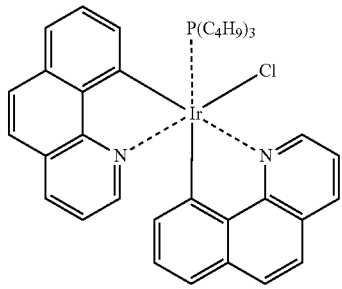
Ir-5
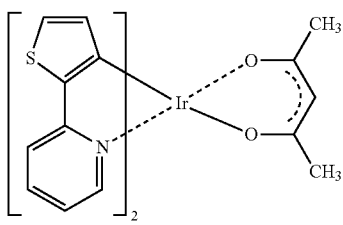
Ir-6
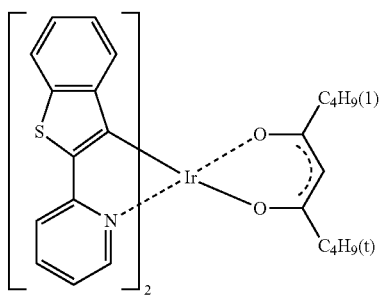
[Chemical Formula 40]
Ir-7
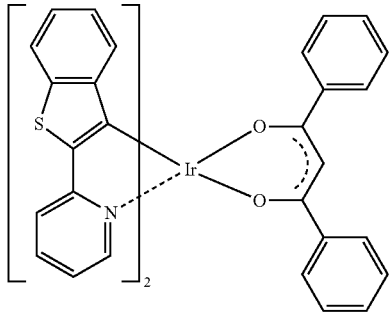
Ir-8
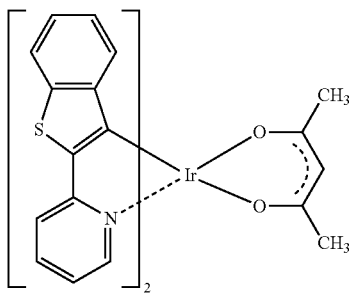
Ir-9
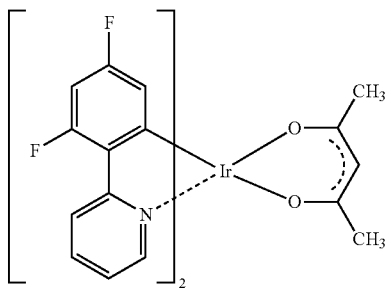
Ir-10
Ir-11
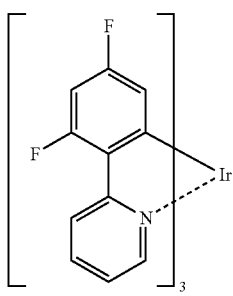
Ir-12(FIrpic)
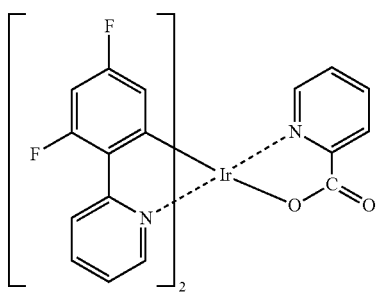

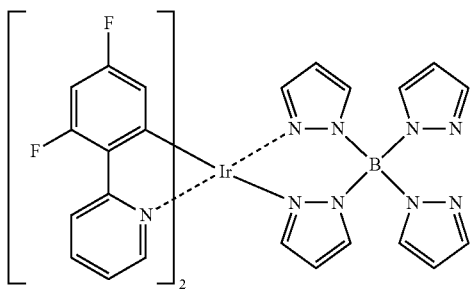

Ir-13

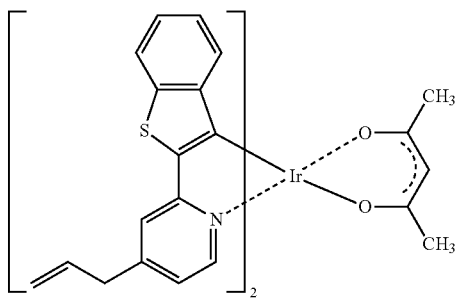

Ir-14

[Chemical Formula 41]

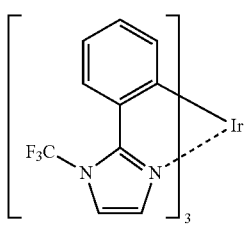

Ir-15

Ir-16

Ir-17

Ir-18

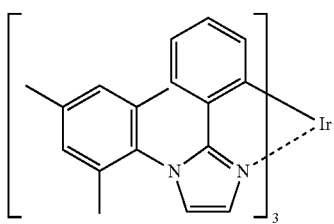

Ir-19

Ir-20

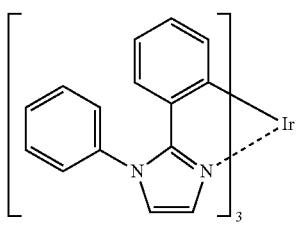

Ir-21

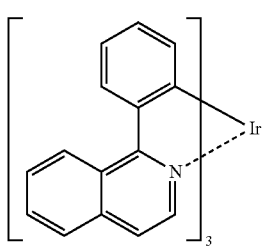

<<Fluorescent Dopant>>

Examples of the fluorescent dopant (also referred to as "fluorescent compound") include coumarin dyes, pyran dyes, cyanine dyes, chroconium dyes, squarylium dyes, oxobenzanthracene dyes, fluorescein dyes, rhodamine dyes, pyrylium dyes, perylene dyes, stilbene dyes, polythiophene dyes, and fluorescent rare earth complexes.

The injection layers, the blocking layers, the hole transport layer, and the electron transport layer constituting the organic EL element of the present invention will be now described.

<Injection Layers: Electron Injection Layer and Hole Injection Layer>

The organic EL element of the present invention may optionally be provided with one or more injection layers.

The injection layers are categorized as an electron injection layer and a hole injection layer. As described above, the injection layers are optionally disposed between an anode and the luminous layer or the anode and a hole transport layer, and between a cathode and the luminous layer or the cathode and an electron transport layer.

The injection layer is provided between an electrode and an organic layer in order to reduce the driving voltage and to improve the luminance, and is described in detail in, for example, "Denkyoku zairyo (Electrode material)", Div. 2, Chapter 2 (pp. 123-166) of "Yuki EL soshi to sono kogyoka saizensen (Organic EL element and its frontier of industrialization)" (published by NTS Corporation, Nov. 30, 1998). The injection layers are categorized as a hole injection layer (anode buffer layer) and an electron injection layer (cathode buffer layer).

The anode buffer layer (hole injection layer) is described in detail in, for example, Japanese Patent Application Laid-Open Publication Nos. H09-45479, H09-260062, and H08-288069. Specific examples of the hole injection layer include phthalocyanine buffer layers, such as copper phthalocyanine buffer layers, oxide buffer layers, such as vanadium oxide buffer layers, amorphous carbon buffer layers, and polymer buffer layers composed of an electroconductive polymer, such as polyaniline (emeraldine) and polythiophene.

The cathode buffer layer (electron injection layer) is described in detail in, for example, Japanese Patent Application Laid-Open Publication Nos. H06-325871, H09-17574, and H10-74586, and specific examples thereof include metal buffer layers, such as a strontium or aluminum layer; alkali metal compound buffer layers, such as a lithium fluoride layer; alkali earth metal compound buffer layers, such as a magnesium fluoride layer; and oxide buffer layers, such as an aluminum oxide layer.

The injection layers can be produced by forming a film from the material described above by any known deposition technique, for example, vacuum vapor deposition, spin coating, casting, ink jetting, or Langmuir Blodgett (LB) coating.

The buffer layers (injection layers) are desirably very thin layers, and preferably have a thickness within a range of 0.1 nm to 5 μm, although it depends on the material. The injection layers may have a monolayer structure composed of one or more of the materials described above.

<Blocking Layers: Hole Blocking Layer and Electron Blocking Layer>

The organic EL element of the present invention may optionally be provided with one or more blocking layers in addition to the basic structure of organic layers. The blocking layer is, for example, a hole blocking layer described in detail in Japanese Patent Application Laid-Open Publication Nos. H11-204258 and H11-204359, and "Yuki EL soshi to sono kogyoka saizensen (Organic EL element and its frontier of industrialization)" (published by NTS Corporation, Nov. 30, 1998, page 237).

The hole blocking layer functions as an electron transport layer in a broad sense, and is composed of a hole blocking material which has electron transportability and has a very low hole transportability. The hole blocking layer transports electrons and blocks holes, resulting in an increased probability of recombination between the electrons and the holes. The electron transport layer with the structure described below may also be used as a hole blocking layer.

The hole blocking layer preferably contains a carbazole, carboline, or diazacarbazole (i.e., a ring in which any one of the carbon atoms in the carboline ring of the carboline derivatives is replaced with a nitrogen atom) derivative.

According to the present invention, if the organic EL element has a plurality of luminous layers emitting light of different colors, preferably the luminous layer having a maximum emission wavelength on a shortest wavelength side among all luminous layers is disposed nearest to an anode. In such a case, an additional hole blocking layer is preferably disposed between the luminous layer with the shortest wavelength and the luminous layer second-nearest to the anode. The hole blocking layer additionally disposed on such a position preferably contains 50% by mass or more of a compound having an ionization potential higher than that of the host compound of the luminous layer with the shortest wavelength by 0.3 eV or higher.

The ionization potential is defined by energy necessary to release electrons of a compound existing in HOMO (highest occupied molecular orbital) level to a vacuum level, and can be determined by the following method, for example.

The ionization potential is preferably measured with a low-energy photoelectron spectrometer "Model AC-1" manufactured by RIKEN KEIKI Co., Ltd., or based on a method known as ultraviolet photoelectron spectroscopy.

The electron blocking layer functions as a hole transport layer in a broad sense, and is composed of an electron blocking material which has hole transportability and has a very low electron transportability. The electron blocking layer transports holes and blocks electrons, resulting in an increased probability of recombination between the electrons and the holes.

The hole transport layer with the structure described below may also be used as an electron blocking layer. The hole blocking layer and the electron transport layer preferably have a thickness within the range of 3 to 100 nm, more preferably within the range of 5 to 30 nm.

<Hole Transport Layer>

The hole transport layer is composed of a hole transport material that has hole transportability. The hole injection layer and the electron blocking layer also serve as the hole transport layer in a broad sense. The hole transport layer may have a monolayer or multilayer structure.

The hole transport materials have hole injecting or transporting ability or electron blocking ability, and may be either organic or inorganic materials. Examples of such materials include triazole, oxadiazole, imidazole, polyarylalkane, pyrazoline, pyrazolone, phenylenediamine, arylamine, amino-substituted chalcone, oxazole, styryl anthracene, fluorenone, hydrazone, stilbene, and silazane derivatives, aniline copolymers, and electroconductive high-molecular weight oligomers, particularly thiophene oligomers.

These materials can be used as hole transport materials. Further examples of preferred materials include porphyrin compounds, aromatic tertiary amine compounds, and styrylamine compounds, among which particularly preferred are aromatic tertiary amine compounds.

Typical examples of the aromatic tertiary amine compounds and the styrylamine compounds include N,N,N',N'-tetraphenyl-4,4'-diaminophenyl, N,N'-diphenyl-N,N'-bis(3-methylphenyl)-(1,1'-biphenyl)-4,4'-diamine (hereinafter referred to as "TPD"), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenyl ether, 4,4'-bis (diphenylamino)quardriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostylbenzene, N-phenylcarbazole, compounds having two fused aromatic rings per molecule, described in U.S. Pat. No. 5,061,569, such as 4,4'-bis[N-(1-naphthyl)-N-phenylamino]biphenyl (hereinafter referred to as "NPD"), and compounds described in Japanese Patent Application Laid-Open Publication No. H04-308688, such as 4,4',4"-tris[N-(3-methylphenyl)-N-phenylamino]triphenylamine (hereinafter referred to as "MTDATA") in which three triphenylamine units are bonded into a starburst form.

Polymer materials containing the above compounds introduced into their chains or containing the above compounds as main chains can also be used. Inorganic compounds such as p-type Si and p-type SiC can also be used as a hole injection material or a hole transport material.

The hole transport layer may also be composed of so-called p-type hole transport materials. Such materials are described in Japanese Patent Application Laid-Open Publication No. H11-251067 and J. Huang, et al., "Applied Physics Letters", 80 (2002), p. 139. In the present invention, such materials are preferred, which provide a light-emitting element with higher luminous efficiency.

The hole transport layer can be produced by forming a film from the hole transport material described above by any known deposition technique, for example, vacuum vapor deposition, spin coating, casting, printing such as ink jetting, or Langmuir Blodgett (LB) coating. The hole transport layer may have any thickness, normally within the range of 5 nm to 5 µm, preferably within the range of 5 to 200 nm. The hole transport layer may have a monolayer structure composed of one or more of the materials mentioned above.

A hole transport layer having high p-type conductivity doped with an impurity can also be used. Examples of such a hole transport layer include those described in, for example, Japanese Patent Application Laid-Open Publication Nos. H04-297076, 2000-196140, and 2001-102175, and J. Appl. Phys., 95, 5773 (2004).

In the present invention, such a hole transport layer with high p-type conductivity is preferably used to produce an element with low electric power consumption.

<Electron Transport Layer>

The electron transport layer is composed of a material having electron transportability, and the electron injection layer and the hole blocking layer are categorized into the electron transport layer in a broad sense. The electron transport layer may have a monolayer or multilayer structure.

The electron transport material (also serving as a hole blocking material) may be any material that can transport electrons injected from a cathode to a luminous layer. Such a material has been conventionally used in a single electron transport layer or multiple electron transport layers disposed on a luminous layer to adjoin a cathode. The material can be selected from any known compounds, such as nitro-substituted fluorene, diphenylquinone, thiopyrandioxide, carbodiimide, fluorenylidenemethane, anthraquinodimethane, anthrone, and oxadiazole derivatives.

Further examples of the electron transport material include thiadiazole (i.e., a ring in which an oxygen atom in the oxadiazole ring of the oxadiazole derivatives is replaced with a sulfur atom) derivatives, and quinoxaline derivatives having a quinoxaline ring known as an electron-withdrawing group. Polymer materials containing the above compounds introduced into their chains or containing the above compounds as main chains can also be used.

Further examples of the electron transport material include metal complexes of 8-quinolinol derivatives, such as tris(8-quinolinol)aluminum (Alq), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, and bis(8-quinolinol)zinc (Znq), and metal complexes formed by replacing the central metal of the above metal complexes with In, Mg, Cu, Ca, Sn, Ga or Pb.

Further preferred examples of the electron transport material include metal-free or metal-containing phthalocyanines and derivatives thereof having an alkyl or sulfonate substituted end. Distyrylpyrazine derivatives known as a material for a luminous layer may also be used as the electron transport material. Inorganic semiconductors such as n-type Si and n-type SiC may also be used as the electron transport material, as in the case of the hole injection layer or the hole transport layer.

The electron transport layer can be produced by forming a film from the electron transport material described above by any known deposition technique, for example, vacuum vapor deposition, spin coating, casting, printing such as ink jetting, or Langmuir Blodgett (LB) coating. The electron transport layer may have any thickness, normally within the range of 5 nm to 5 µm, preferably within the range of 5 to 200 nm. The electron transport layer may have a monolayer structure composed of one or more of the materials mentioned above.

An electron transport layer having high n-type conductivity doped with an impurity can also be used. Examples of such an electron transport layer include those described in, for example, Japanese Patent Application Laid-Open Publication Nos. H04-297076, H10-270172, 2000-196140, and 2001-102175, and J. Appl. Phys., 95, 5773 (2004).

In the present invention, such an electron transport layer with high n-type conductivity is preferably used to produce an element with low electric power consumption.

<Anode>

The anode of the organic EL element is preferably composed of an electrode material such as a metal, an alloy, an electrically conductive compound, or a mixture thereof, that has a high work function (4 eV or higher). Specific examples of such an electrode material include metals such as Au; CuI; indium-tin oxide (hereinafter, abbreviated as "ITO"); and conductive transparent materials such as $SnO_2$ and ZnO.

Amorphous materials applicable to production of a transparent conductive film, such as IDIXO ($In_2O_3$—ZnO), may also be used. The anode may also be produced by depositing the electrode material into a thin film by any process such as vapor deposition or sputtering, and then producing a desired pattern by any process such as photolithography. If high patterning accuracy (approximately 100 µm or higher) is not required, the pattern may be formed through a mask having a desired shape by vapor deposition or sputtering of the electrode material.

Alternatively, the film may be formed with a material which can be coated, such as an organic conductive compound, through a wet process, for example, printing or coating. If luminescent light is extracted from the anode, the anode preferably has a transmittance of above 10%. The sheet resistance of the anode is preferably several hundred ohms or lower per sheet. The thickness of the anode is normally within the range of 10 to 1000 nm, preferably within the range of 10 to 200 nm, although it depends on the electrode material.

<Cathode>

The cathode of the organic EL element of the present invention is preferably composed of an electrode material such as a metal (referred to as "electron-injecting metal"), an alloy, an electrically conductive compound, or a mixture thereof, that has a low work function (4 eV or lower). Specific examples of such an electrode material include sodium, sodium-potassium alloys, magnesium, lithium, magnesium/copper mixtures, magnesium/silver mixtures, magnesium/aluminum mixtures, magnesium/indium mixtures, aluminum/aluminum oxide ($Al_2O_3$) mixtures, indium, lithium/aluminum mixtures, and rare earth metals.

From the perspective of electron injection and resistance to oxidation, it is preferable to use a mixture of a first metal as an electron-injecting metal and a second metal which is a stable metal with a higher work function than the first metal, among these materials. Preferred examples of such a mixture include magnesium/silver mixtures, magnesium/aluminum mixtures, magnesium/indium mixtures, aluminum/aluminum oxide ($Al_2O_3$) mixtures, lithium/aluminum mixtures, and aluminum.

The cathode can be produced by forming such an electrode material into a thin film using any process, for example, vapor deposition or sputtering. The sheet resistance of the cathode is preferably several hundred ohms or lower per sheet. The thickness of the cathode is normally within the range of 10 nm to 5 μm, preferably within the range of 50 to 200 nm.

In order to allow the emitted light to transmit, either the anode or the cathode of the organic EL element is preferably transparent or translucent, which improves the luminance of the emitted light.

After any of the metals exemplified above is deposited into a thin film with a thickness of 1 to 20 nm on a cathode, any of the transparent conductive materials exemplified in the description of the anode is deposited thereon to produce a transparent or translucent cathode. This process can be applied to production of an organic EL element having an anode and a cathode that have transparency.

<Support Substrate>

The support substrate (hereinafter, also referred to as "substrate", "base", or "support") of the organic EL element of the present invention may be any type of substrate, for example, glass or plastic substrate, and may be transparent or opaque. If light is extracted from the support substrate, the support substrate is preferably transparent. Examples of the preferred transparent support substrate include glass, quartz, and transparent resin films. In particular, the support substrate is preferably a resin film which can provide a flexible organic EL element.

Examples of the resin film include polyesters, such as poly(ethylene terephthalate) (PET) and poly(ethylene naphthalate) (PEN); polyethylene; polypropylene; cellophane; cellulose esters and derivatives thereof, such as cellulose diacetate, cellulose triacetate, cellulose acetate butyrate, cellulose acetate propionate (CAP), cellulose acetate phthalate (TAC), and cellulose nitrate; poly(vinylidene chloride); poly(vinyl alcohol); poly(ethylene-vinyl alcohol); syndiotactic polystyrene; polycarbonates; norbornene resins; polymethylpentene; polyether ketone; polyimides; polyethersulfones (PESs); polyphenylene sulfide; polysulfones; polyether imides; polyether ketone imides; polyamides; fluororesins; nylons; poly(methyl methacrylate); acrylics or polyarylates; and cycloolefin resins, such as ARTON (product name; manufactured by JSR) and APEL (product name; manufactured by Mitsui Chemicals, Inc.).

The surface of the resin film may be covered with a coating layer of an inorganic or organic material or a hybrid film of inorganic and organic materials. The resin film is preferably a barrier film having water vapor permeability (measured in accordance with JIS K 7129-1992 (25±0.5° C.; relative humidity: (90±2)% RH))) of 0.01 g/($m^2$·24 h) or lower, and is preferably a high barrier film having oxygen permeability (measured in accordance with JIS K 7126-1987) of $10^{-3}$ ml/($m^2$·24 h·atm) or lower and water vapor permeability of $10^{-5}$ g/($m^2$·24 h) or lower.

The barrier film may be composed of any material that can block infiltration of undesirable substances, such as moisture and oxygen, which cause deterioration of the organic EL element. For example, silicon oxide, silicon dioxide and silicon nitride can be used. In order to prevent the brittleness of the film, the film preferably has a laminated structure composed of one or more inorganic layers and one or more organic layers. The inorganic layers and organic layers may be deposited in any order, preferably alternately.

The barrier film may be formed by any process, for example, vacuum vapor deposition, sputtering, reactive sputtering, molecular beam epitaxy, cluster ion beam deposition, ion plating, plasma polymerization, atmospheric pressure plasma polymerization, plasma chemical vapor deposition (CVD), laser CVD, thermal CVD, and coating. In particular, the gas barrier film is preferably produced by an atmospheric pressure plasma polymerization process as described in Japanese Patent Application Laid-Open Publication No. 2004-68143.

Examples of an opaque support substrate include metal plates such as aluminum plate and stainless steel plate, films, opaque resin substrates, and ceramic substrates.

In the organic EL element of the present invention, the luminescence extraction quantum efficiency at a room temperature (25° C.) is preferably 1% or higher, more preferably 5% or higher.

The extraction quantum efficiency (%) is expressed by the following expression:

Extraction quantum efficiency (%)=the number of photons emitted from the organic EL element/ the number of electrons passing through the organic EL element×100.

The organic EL element of the invention may also be provided with a hue improving filter, such as a color filter, or a color conversion filter to convert the color of light emitted from the organic EL element into multiple colors using a fluorescent material. If a color conversion filter is used, the organic EL element preferably has the maximum emission wavelength (λmax) of 480 nm or less.

<Sealing>

The organic EL element of the present invention is preferably covered with a sealing material in order to seal and insulate the anode, the cathode, and the layer(s) between the cathode and the anode from the air.

Examples of a sealing means applicable to the organic EL element of the present invention include adhesion of a sealing material, electrodes, and a support substrate with an adhesive. The sealing material may be disposed to cover a display area of the organic EL element. The sealing material may have a concave or flat shape, and transparency and electric insulation are no object.

Specific examples of the sealing material include glass plates, composite materials of a polymer plate and film, and composite materials of a metal plate and film Specific examples of materials for the glass plate include soda-lime glass, barium-strontium-containing glass, lead glass, aluminosilicate glass, borosilicate glass, barium borosilicate glass, and quartz. Examples of materials for the polymer plate include polycarbonates, acrylics, poly(ethylene terephthalate), polyether sulfides, and polyether sulfones. Examples of materials for the metal plate include one or more metals or alloys selected from the group consisting of stainless steel, iron, copper, aluminum, magnesium, nickel, zinc, chromium, titanium, molybdenum, silicone, germanium and tantalum.

In the present invention, a polymer film and a metal film may be preferably used as a sealing material because they contribute to production of thinner elements. The polymer film preferably has an oxygen permeability (measured in accordance with JIS K 7126-1987) of $1 \times 10^{-3}$ ml/(m²·24 h·atm) or lower and a water vapor permeability (measured in accordance with JIS K 7129-1992; 25±0.5° C., relative humidity: (90±2) % RH) of $1 \times 10^{-3}$ g/(m²·24 h) or lower.

The sealing material may be processed into a concave shape through any process, for example, sandblasting or chemical etching.

Specific examples of the adhesive for sealing include light-curable or thermosetting adhesives having reactive vinyl groups, such as acrylic acid oligomers and methacrylic acid oligomers; moisture-curable resins, such as 2-cyanoacrylic acid esters; thermosetting and chemically curable adhesives (two-component adhesives), such as epoxy adhesives; hot-melt adhesives, such as polyamide adhesives, polyester adhesives, and polyolefin adhesives; and cation-curable and ultraviolet-curable epoxy resin adhesives.

The adhesive for sealing can preferably cure and adhere at a temperature within the range from room temperature (25° C.) to 80° C. to prevent deterioration of the organic EL element during a thermal treatment. The adhesive may also contain a desiccant dispersed therein.

The adhesive may be coated on a target portion with a commercially available dispenser or by a screen printing process.

It is also preferable to form a layer of inorganic or organic material as a sealing film on the outer side of the electrode positioned opposite to the substrate across the organic layer, so that the layer of the inorganic or organic material covers the electrode and the organic layer and is in contact with the support substrate. The sealing film may be composed of any material that can block infiltration of substances, such as moisture and oxygen, which cause deterioration of the organic EL element. For example, silicon oxide, silicon dioxide and silicon nitride can be used.

In order to reduce the brittleness of the sealing film, the film preferably has a laminated structure composed of an inorganic layer and an organic material layer. The sealing film may be formed by any process, for example, vacuum vapor deposition, sputtering, reactive sputtering, molecular beam epitaxy, cluster ion beam deposition, ion plating, plasma polymerization, atmospheric pressure plasma polymerization, plasma chemical vapor deposition (CVD), laser CVD, thermal CVD, and coating.

The gap between the sealing material and the display area of the organic EL element is preferably filled with an inactive gas, such as nitrogen gas and argon gas, or an inactive liquid, such as fluorohydrocarbon and silicon oil, for the purpose of forming a gaseous or a liquid phase. The gap may also be a vacuum or filled with a moisture-absorbing compound.

Examples of the moisture-absorbing compound include metal oxides, such as sodium oxide, potassium oxide, calcium oxide, barium oxide, magnesium oxide, and aluminum oxide; sulfates, such as sodium sulfate, calcium sulfate, magnesium sulfate, and cobalt sulfate; metal halides, such as calcium chloride, magnesium chloride, cesium fluoride, tantalum fluoride, cerium bromide, magnesium bromide, barium iodide, and magnesium iodide; and perchlorates, such as barium perchlorate and magnesium perchlorate. Sulfates, metal halides, and anhydrous perchlorates are preferably used.

<Protective Film and Protective Plate>

In order to enhance the mechanical strength of the organic EL element, a protective film or plate may be provided on the outer side of the sealing film which is opposite to the support substrate across the organic layer. Since sealing with a sealing film not always ensure high mechanical strength of the organic EL element, such a protective film or plate is preferably provided. Examples of a material usable for such a protective film or plate include the same glass plates, composite materials of a polymer plate and film, and composite materials of a metal plate and film as those which can be used for the sealing. A polymer film is preferably used, from the perspective of weight reduction and thinning of the organic EL element.

<Light Extraction>

In general, in an organic EL element, light emission occurs inside a layer with a refractive index higher than that of the air (that is, a layer with a refractive index within the range of approximately 1.7 to 2.1), and mere 15 to 20% of the light emitted from the luminous layer can be extracted. This is because incident light on an interface (interface between a transparent substrate and the air) at an incident angle θ equal to or greater than a critical angle is totally reflected and cannot be extracted from the element, or because light is totally reflected at the interface between the transparent electrode or the luminous layer and the transparent substrate and is guided to the transparent electrode or the luminous layer to be released to the side of the element.

Examples of the measure for enhancing the light extraction efficiency include: asperities formed on a surface of a transparent substrate to prevent total reflection at the interface between the transparent substrate and the air (U.S. Pat. No. 4,774,435); a substrate with light-condensing property to improve the light extraction efficiency (Japanese Patent Application Laid-Open Publication No. S63-314795); a reflection surface formed on the side surface of the element (Japanese Patent Application Laid-Open Publication No. H01-220394); a smooth antireflective layer formed between a substrate and a luminous material, the antireflective layer having a refractive index between those of the substrate and the luminous material (Japanese Patent Application Laid-Open Publication No. S62-172691); a smooth layer disposed between a substrate and a luminous material, the smooth layer having a refractive index lower than that of the substrate (Japanese Patent Application Laid-Open Publication No. 2001-202827); and a diffraction grating formed at an interface between any layers selected from a substrate, a transparent electrode layer, and a luminous layer (including the interface between the substrate surface and the exterior) (Japanese Patent Application Laid-Open Publication No. H 11-283751).

In the present invention, these methods can be employed in combination with the organic EL element of the present invention. Preferably a smooth layer having a refractive index lower than that of the substrate is disposed between a substrate and a luminous material. In alternative preferred embodiment, a diffraction grating is formed at an interface between any two layers selected from a substrate, a transparent electrode layer, and a luminous layer (including the interface between the substrate surface and the exterior).

The present invention in combination with such measures provides an element with higher luminance and durability.

If a medium having a low refractive index and having a thickness greater than light wavelength is disposed between a transparent electrode and a transparent substrate, the extraction efficiency of light from the transparent electrode to the exterior increases as the refractive index of the medium decreases.

Examples of the layer with a low refractive index include aerogel, porous silica, magnesium fluoride, and fluoropolymer layers. Since a transparent substrate generally has a refractive index of about 1.5 to 1.7, the layer with a low refractive index preferably has a refractive index of about 1.5 or lower, more preferably 1.35 or lower.

The medium with a low refractive index preferably has a thickness two or more times a light wavelength in the medium for the following reason: If the medium with a low refractive index has a thickness similar to that of the light wavelength, the electromagnetic wave leaking as an evanescent wave penetrates into the substrate, resulting in a reduction in advantage of the layer with a low refractive index.

A diffraction grating disposed at an interface or in any medium where total reflection occurs can effectively enhance the light extraction efficiency. This method is based on the property of a diffraction grating that can change the direction of light to a specific direction, different from the direction of refracted light, by so-called Bragg diffraction such as primary diffraction or secondary diffraction. In this method, a diffraction grating is disposed at an interface between any two layers or in any medium (in a transparent substrate or a transparent electrode) to diffract and extract the light that is emitted from a luminous layer and that cannot be extracted due to total reflection occurring at the interface between the layers.

The diffraction grating to be disposed preferably has a two-dimensional periodic refractive index. The light generated in a luminous layer is emitted at random in all directions but a common one-dimensional diffraction grating having a periodic refractive index distribution only in a specific direction can diffract only the light proceeding in a specific direction and thus cannot significantly increase the light extraction efficiency.

However, a diffraction grating having a two-dimensional refractive index distribution diffracts light propagating in all directions and enhances the light extraction efficiency.

The diffraction grating may be disposed in an interface between any two layers or in any medium (in a transparent substrate or a transparent electrode), but is preferably disposed close to an organic luminous layer generating light. The period of the diffraction grating is preferably about ½ to 3 times the wavelength of light in a medium. The array of the diffraction grating is preferably a two-dimensional periodic array, such as a square, triangular, or honeycomb lattice.

<Light-Condensing Sheet>

The organic EL element of the present invention can enhance the luminance in a specific direction, for example, in the front direction with respect to the luminous surface of the element, by condensing the light in the specific direction, with a microlens array structure disposed on the light extraction side of the support substrate, or a so-called light-condensing sheet provided to the element, for example.

In an exemplary microlens array, a two-dimensional array of quadrangular pyramids having a side of 30 µm and having a vertex angle of 90 degrees are disposed on the light extraction side of the substrate. The quadrangular pyramid preferably has a side of 10 to 100 µm. If the length of the side is shorter than this range, the light is colored due to the effect of diffraction, whereas if it is significantly long, the thickness of the array is unfavorably large.

The light-condensing sheets can be practically used in LED backlights of liquid crystal display devices, such as a brightness-enhancing film (BEF) manufactured by SUMITOMO 3M Inc. The prism sheet may be a base having any shape, for example, triangle-shaped stripes each having a vertex angle of 90 degrees and a pitch of 50 µm, a shape having round apexes, a shape having random pitches, or other shape.

Alternatively, the light-condensing sheet may be used in combination with a light diffusion plate or film in order to control the emission angle of light from the light-emitting element. For example, a diffusion film (Light-Up) manufactured by KIMOTO Co., Ltd., can be used.

[Production Process of Organic EL Element]

A production process of the organic EL element of the present invention will now be described. The organic EL element has a layer configuration including an anode, a hole injection layer, a hole transport layer, a luminous layer, a hole blocking layer, an electron transport layer, and a cathode.

An intended electrode material, for example, a thin film of anode material, is deposited onto an appropriate substrate by any deposition process such as vapor deposition or sputtering, to form an anode film with a thickness of 1 µm or less, preferably 10 to 200 nm.

Subsequently, materials for the organic EL element are deposited onto the anode to form organic compound thin films such as a hole injection layer, a hole transport layer, a luminous layer, a hole blocking layer, and an electron transport layer.

Examples of the process for forming these layers include a vapor deposition process and wet processes, such as die coating, spin coating, casting, ink jetting, spray coating, and printing, as described above. The layers of the present invention are preferably formed by vapor deposition process, spin coating, ink jetting, or printing, from the viewpoints of uniformity of the layers and fewer pinholes.

The individual layers may be deposited by different processes. If a vapor deposition process is employed for film formation, the deposition conditions vary depending on compounds to be used, and are preferably selected appropriately from the following general ranges: a boat heating temperature of 50 to 450° C., a degree of vacuum of $10^{-6}$ to $10^{-2}$ Pa, a deposition rate of 0.01 to 50 nm per second, a substrate temperature of −50 to 300° C., and a layer thickness of 0.1 nm to 5 µm.

If the layers are formed by a wet process, examples of solvent used to dissolve or disperse the organic EL materials according to the present invention include ketones, such as methyl ethyl ketone and cyclohexanone; fatty acid esters, such as ethyl acetate; halogenated hydrocarbons, such as dichlorobenzene; aromatic hydrocarbons, such as toluene, xylene, mesitylene, and cyclohexylbenzene; aliphatic hydrocarbons, such as cyclohexane, decaline, and dodecane; and organic solvents, such as dimethylformamide (DMF) and dimethylsulfoxide (DMSO). The materials can be dispersed by any appropriate process, such as ultrasonic wave dispersion, high-shearing force dispersion, or media dispersion.

After deposition of these layers, a cathode material is deposited by a process such as vapor deposition or sputtering, into a cathode layer with a thickness of 1 µm or less, preferably within the range of 50 to 200 nm. A desired organic EL element can thereby be produced.

In production of such an organic EL element, all layers from the hole injection layer to the cathode should preferably be formed in a single vacuuming operation, or a semi-finished organic EL element may be taken out for a different deposition process. In such a case, the process should be performed under dry inactive gas atmosphere.

[Applications]

The organic EL element of the present invention is applicable to display devices, displays, and various light emitting sources. Non-limiting examples of the light emitting sources include illumination devices (domestic lighting fixtures and automobile lighting fixtures), backlights of watches, clocks, and liquid crystal display devices, advertising displays, traffic signals, light sources of optical memory media, light sources of electrophotographic copying machines, light sources of optical communication processors, and light sources of photosensors. In particular, the organic EL element is suitable for backlights of liquid crystal display devices and light sources for lighting fixtures.

The organic EL element of the present invention may be subjected to patterning during the deposition process through a metal mask or by ink jet printing, if necessary. The patterning is targeted to only the electrode(s), both the electrode(s) and the luminous layer, or all the layers of the element. The element can be prepared by any known process.

Colors of light emitted from the organic EL element and compounds of the present invention are determined based on measurements using a spectroradiometer CS-1000 (available from KONICA MINOLTA SENSING; INC.) by converting the measured values into the CIE chromaticity coordinates in accordance with "Shinpen Shikisai Kagaku Handbook (A New Version of Handbook of Color Science)" (edited by The Color Science Association of Japan; published by University of Tokyo Press, 1985), page 108, FIG. 4.16.

If the organic EL element of the present invention emits white light, "white light" refers to light having chromaticity within a region defined by chromaticity coordinates where $X=0.33\pm0.07$ and $Y=0.33\pm0.1$ at 1000 cd/m$^2$ according to the CIE 1931 chromaticity system based on the measurement of a front luminance at a viewing angle of 2 degrees by the method described above.

[Display Device]

The display device of the present invention includes the organic EL element described above.

The display device of the present invention may be a monochromatic or multicolor display device. The following description focuses on a multiple color display device. If the organic EL element is applied to a multicolor display device, a shadow mask is provided only during formation of the luminous layer, and a film can be deposited on an entire surface by a process such as vapor deposition, casting, spin coating, ink jetting, or printing.

Only the luminous layer may be patterned by any process, preferably by vapor deposition, ink jetting, or printing. If vapor deposition is employed, patterning is preferably performed through a shadow mask.

Alternatively, the layers of the organic EL element may be deposited in a reverse order. That is, an electron transport layer, a hole blocking layer, a luminous layer, a hole transport layer, and an anode are deposited in sequence on a cathode.

The resulting multicolor display device can emit light when a DC voltage of about 2 to 40 V is applied across the anode with positive polarity and the cathode with negative polarity. If the voltage is applied with reverse polarity, no current flows and thus the device cannot emit light.

If an AC voltage is applied across the anode with positive polarity and the cathode with negative polarity, the display device can emit light. An AC voltage of any waveform may be applied.

The multicolor display device is applicable to display devices, displays and various light emitting sources. If the organic EL element is applied to a display device or display, three organic EL elements that respectively emit blue, red and green light are used to achieve full-color display.

Examples of the display devices or displays include television sets, personal computers, mobile equipment, AV equipment, teletext displays, and information displays for automobiles. The device is also applicable to a display device for playing back still or moving images. If the device is applied to a display device for playing back moving images, the driving mode may be either a simple matrix (passive matrix) mode or active matrix mode.

Non-limiting examples of the light emitting sources include domestic lighting fixtures, automobile lighting fixtures, backlights of watches, clocks, and liquid crystal display devices, advertising displays, traffic signals, light sources of optical memory media, light sources of electrophotographic copying machines, light sources of optical communication processors, and light sources of photosensors.

[Illumination Device]

The organic EL element of the present invention can be applied to lamps such as a lighting source and an exposure light source, or can be applied to projectors for projecting images or display devices (displays) for directly viewing still or moving images.

If the organic EL element of the present invention is applied to a display device for playing back moving images, the driving mode may be either a simple matrix (passive matrix) mode or active matrix mode. Alternatively, two or more organic EL elements of the present invention emitting light of different colors may be used in combination to produce a full-color display device.

Embodiments of a display device including the organic EL element of the present invention will now be described with reference to the accompanying drawings.

FIG. 1 is a schematic view illustrating an example of a display device provided with an organic EL element, such as a display of mobile phone. Such a display utilizes light emission of the organic EL element to display image information.

The display 1 is composed of a display section A including multiple pixels, and a control section B for executing image scanning on the display section A based on image information.

The control section B is electrically connected to the display section A, and sends scanning signals and image data signals to respective pixels based on external image information. In response to the scanning signals, the pixels in each scanning line sequentially emit light based on the image data signals to execute the image scanning so that the image information appears on the display section A.

Figure 2:
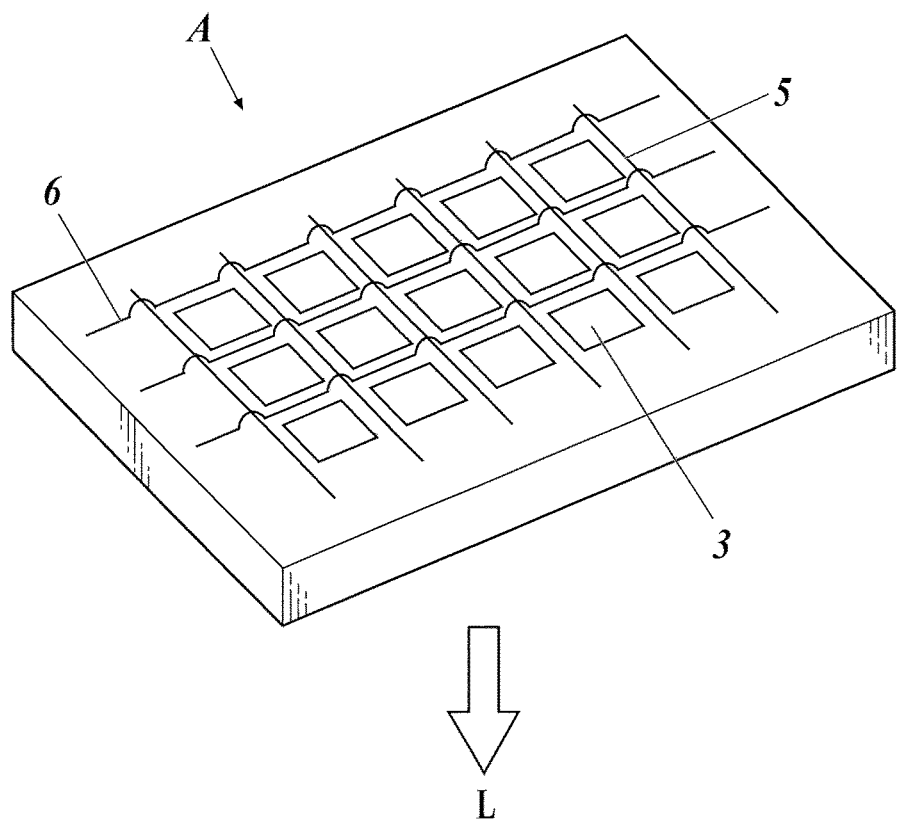
FIG. 2 is a schematic view illustrating a display section A.

FIG. 2 is a schematic view of the display section A.

The display section A includes a wiring part including a plurality of scanning lines 5 and data lines 6, and multiple pixels 3, which are arrayed on a substrate. Main components of the display section A will be described below.

Figure 5:
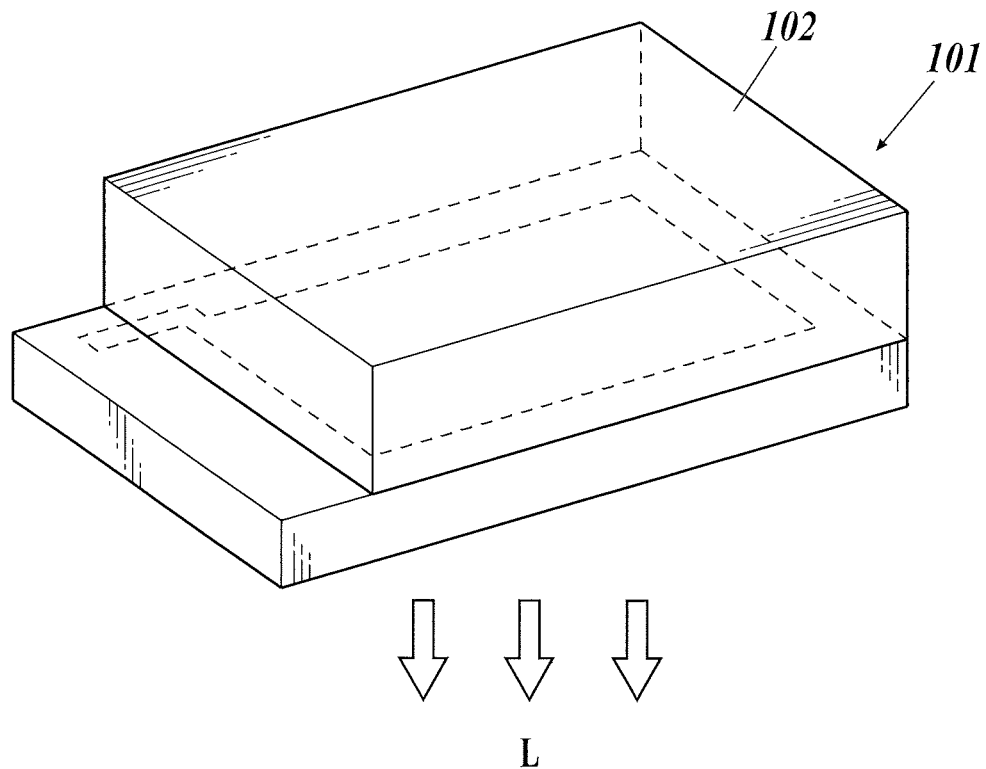
FIG. 5 is a diagrammatic illustration of an illumination device.
Figure 6:
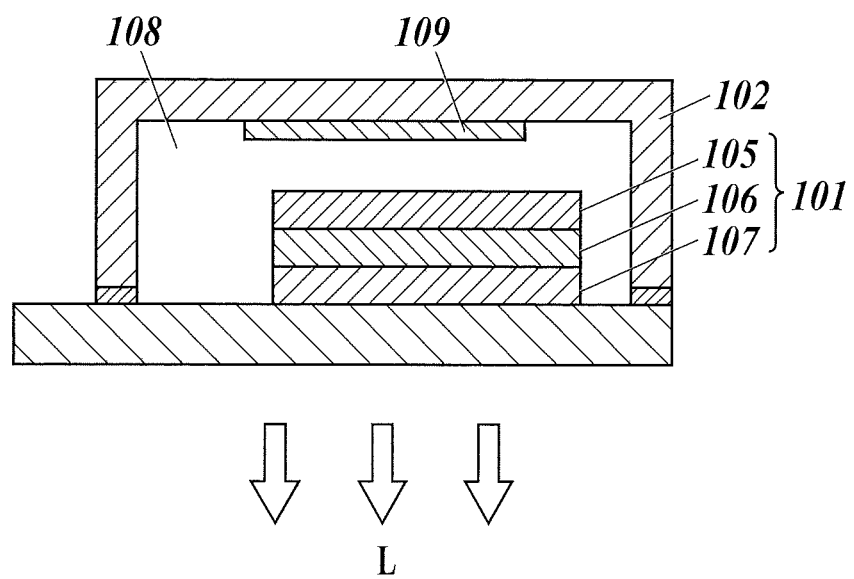
FIG. 6 is a schematic view illustrating an illumination device.

In the display section shown in the drawing, light emitted from the pixels 3 is extracted to the direction shown with the white arrow (downward direction). In FIG. 2 and FIGS. 5 and 6 mentioned below, L represents light.

The scanning lines 5 and the data lines 6 in the wiring part are composed of an electroconductive material, and are disposed so as to be orthogonal to each other to form a grid pattern. The scanning lines 5 and the data lines 6 are connected to the respective pixels 3 at the intersections (not shown in detail) therebetween.

When a scanning signal is applied to the scanning lines 5, the pixels 3 receive image data signal from the data lines 6 and emit light based on the received image data.

Full-color display is achieved by an appropriate array of pixels each emitting light in a red, green, or blue region on a single substrate.

The light emitting process of pixels will now be described.

Figure 3:
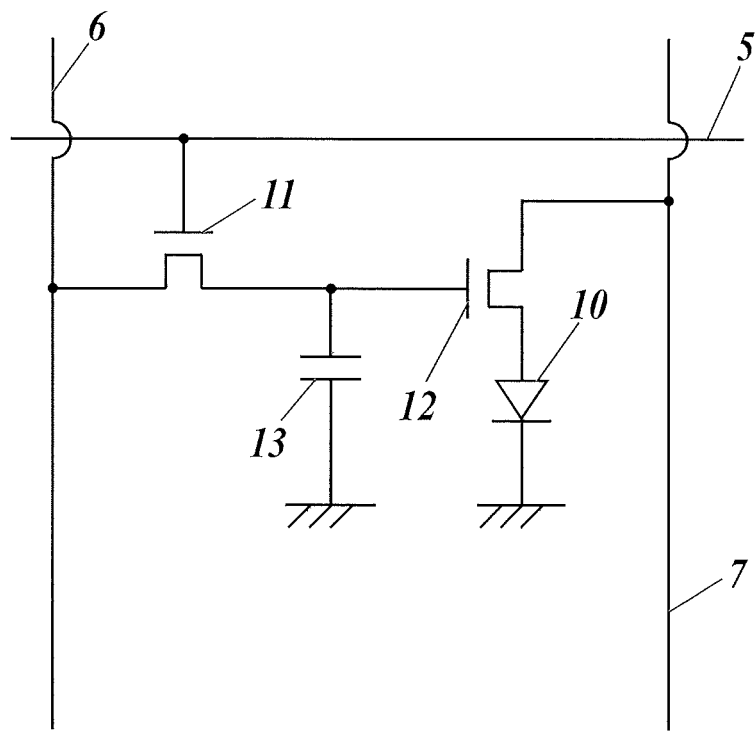
FIG. 3 is a schematic view illustrating a pixel.

FIG. 3 is a schematic view of a pixel.

The pixel includes an organic EL element 10, a switching transistor 11, a driving transistor 12, and a capacitor 13. The organic EL elements 10 each emitting red, green or blue light are arrayed in the respective pixels on a single substrate, and thereby full-color images can be displayed.

In FIG. 3, an image data signal from the control section B is applied to the drain of the switching transistor 11 via the data line 6. A scanning signal from the control section B is then applied to the gate of the switching transistor 11 via the scanning line 5 to activate the switching transistor 11, and the image data signal applied to the drain is transmitted to the gates of the capacitor 13 and the driving transistor 12.

In response to the transmission of the image data signal, the capacitor 13 is charged depending on the potential of the image data signal, and the driving transistor 12 is activated. The driving transistor 12 is connected to a power source line 7 through the drain and to the electrode of the organic EL element 10 through the source. A current is supplied to the organic EL element 10 from the power source line 7 depending on the potential of the image data signal applied to the gate.

When the control section B transmits a scanning signal to the next scanning line 5 by sequential scanning, the switching transistor 11 is deactivated. Even after deactivation of the switching transistor 11, the capacitor 13 maintains the charged potential of the image data signal and thus the driving transistor 12 is maintained to continue light emission of the organic EL element 10 until a subsequent scanning signal is applied. When the subsequent scanning signal is applied by sequential scanning, the driving transistor 12 is activated based on the potential of the subsequent image data signal in synchronization with the subsequent scanning signal, resulting in light emission of the organic EL element 10.

In other words, the organic EL elements 10 in the respective pixels 3 is each provided with a switching transistor 11 and a driving transistor 12 that serve as active elements for light emission. Such a light emission mode is referred to as active matrix mode.

Light emitted from the organic EL element 10 may have multiple gradations according to multi-value image data signals having different gradation potentials. Alternatively, the organic EL element 10 may emit light of a predetermined intensity based on an ON/OFF operation of a binary image data signal. Alternatively, the potential of the capacitor 13 may be maintained until a subsequent scanning signal is applied, or may be discharged immediately before the subsequent signal is applied.

The driving mode of the organic EL element of the present invention may be either the active matrix mode described above or a passive matrix mode. In the passive matrix mode, the organic EL element emits light in response to a data signal only during application of a scanning signal.

Figure 4:
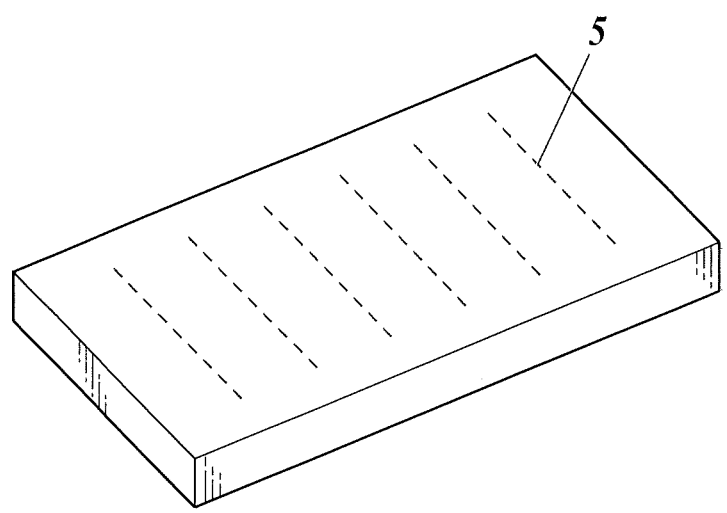
FIG. 4 is a schematic view illustrating a full-color passive-matrix display device.
Figure 4:
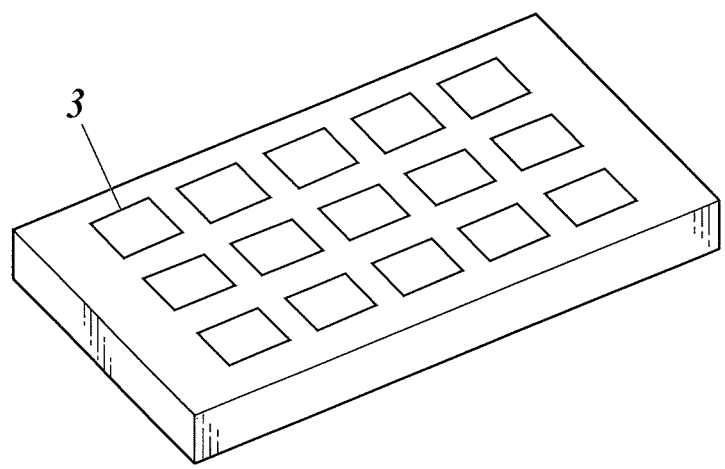
Figure 4:
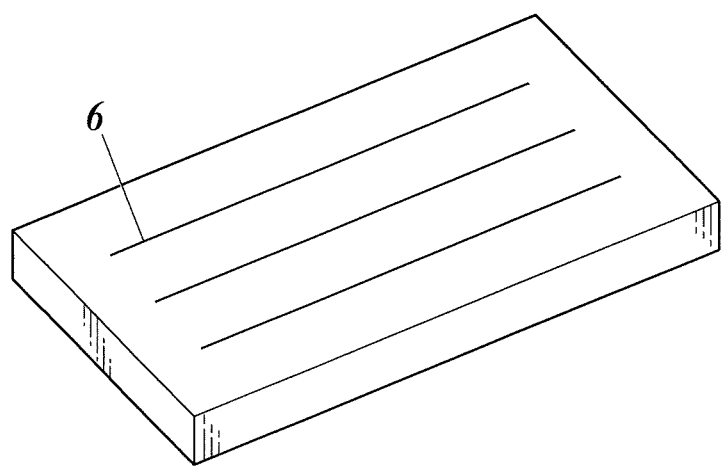

FIG. 4 is a schematic view of a display device of the passive matrix mode. In FIG. 4, a plurality of scanning lines 5 and a plurality of image data lines 6 are disposed orthogonal to each other across pixels 3.

When a scanning signal is applied to a scanning line 5 by sequential scanning, the pixel 3 connected to the scanning line 5 to which the scanning signal has been applied emits light based on the image data signal.

The passive matrix mode does not require an active element in pixels 3, resulting in reduced production costs.

The organic EL material of the present invention may also be applied to an organic EL element which emits substantially white light as an illumination device. Such an organic EL element emits white light by mixing of color light components emitted at the same time from individual luminescent dopants (luminescent materials). The respective luminescent dopants may have three different maximum emission wavelengths of the three primary colors, i.e. blue, green and red, or two different maximum emission wavelengths of two complementary colors, such as blue and yellow, and blue green and orange.

A combination of luminescent dopants for achieving emission of a plurality of color light components may be a combination of a plurality of phosphorescent or fluorescent materials, or a combination of a luminescent dopant which emits phosphorescence or fluorescence and a dye which emits excitation light in response to the light emitted from the luminescent dopant. The organic EL element emitting white light of the present invention simply employs a combination or mixture of luminescent dopants.

A mask is provided only during formation of the luminous layer, a hole transport layer, an electron transport layer, etc. The mask can be merely disposed for patterning. Patterning with the mask is not necessary for the formation of the other layers each of which is common over the surface. A film, such as an electrode film, can be deposited on the entire surface by a process such as vapor deposition, casting, spin coating, ink jetting or printing, which increases production efficiency. According to this method, the organic EL element itself emits white light, unlike a white light-emitting organic EL element including an array of multiple light-emitting elements which emit light of different colors.

If the organic EL element is to be applied to a backlight of liquid crystal display element, for example, the luminescent dopants for the luminous layer can be appropriately selected from compounds represented by Formula (A1) of the present invention and known luminescent dopants, and may be used in combination, such that the luminous layer has a wavelength range corresponding to color filter (CF) characteristics. White light emission is thus achieved.

As described above, the white light-emitting organic EL element of the present invention can be applied not only to display devices and displays but also to various light emitting sources and illumination devices for domestic lighting fixtures and automobile lighting fixtures, lamps such as an exposure light source, and backlights of liquid crystal display devices.

The organic EL element of the present invention can also be applied to a wide variety of fields, including backlights of watches and clocks, advertising displays, traffic signals, light sources of optical memory media, light sources of electrophotographic copying machines, light sources of optical communication processors, light sources of photosensors, and general electric home appliance which requires a display device.

<Embodiment of the Inventive Illumination Device>

The illumination device of the present invention is provided with the organic EL element described above.

The non-luminous surface of the inventive organic EL element is covered with a glass case. A glass substrate having a thickness of 300 μm is used as a substrate for sealing. An epoxy photo-curable adhesive (LUXTRACK LC0629B, manufactured by TOAGOSEI CO., LTD.) as a sealant is applied onto the periphery of the glass case. The glass case is attached on the transparent support substrate to cover the cathode. The adhesive is then cured by irradiation with UV light incident on the glass substrate to seal the periphery. An illumination device shown in FIGS. 5 and 6 can be thereby produced.

FIG. 5 is a schematic view of the illumination device. The organic EL element 101 of the present invention is covered with a glass cover 102 (sealing with the glass cover 102 is performed under a high-purity (99.999% or higher) nitrogen gas atmosphere in a glovebox to avoid exposure of the organic EL element 101 to the air).

FIG. 6 is a cross-sectional view of the illumination device that includes a cathode 105, an organic EL layer 106, and a glass substrate 107 provided with a transparent electrode. The interior of the glass cover 102 is filled with nitrogen gas 108 and is provided with a water-trapping agent 109.

EXAMPLES

The present invention will now be described in more detail by way of Examples. The present invention however should not be limited to these Examples.

The luminescent dopants and the host compounds used in the Examples are as follows:

[Chemical Formula 42]

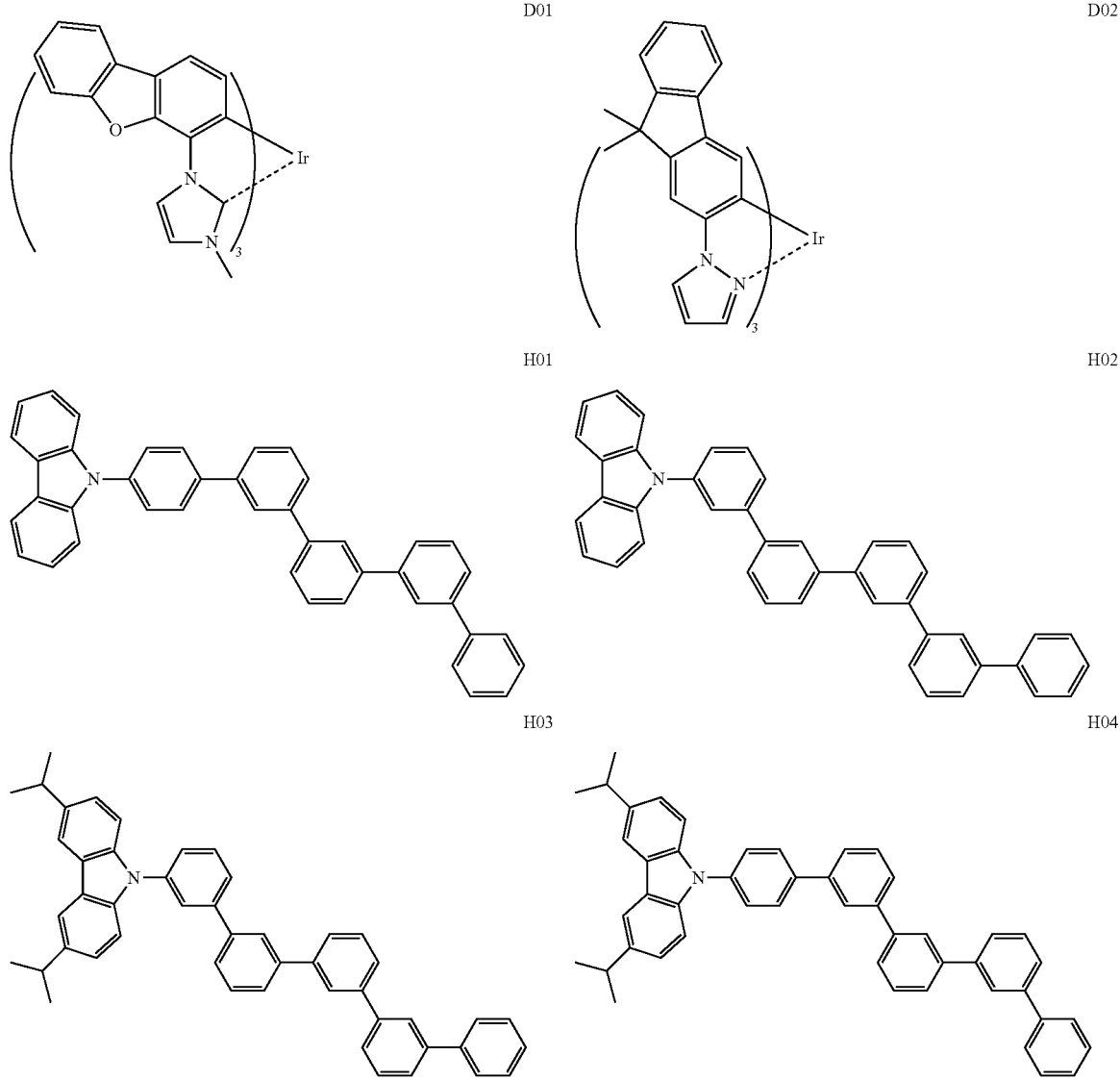

Example 1

Preparation of Organic EL Element 1-1

Indium tin oxide (ITO) with a thickness of 100 nm was deposited on a glass substrate with dimensions of 100 mm by 100 mm by 1.1 mm (NA 45 manufactured by NH Technoglass Corporation) and was patterned into an anode. A transparent substrate provided with the transparent ITO electrode was ultrasonically cleaned in isopropyl alcohol, was dried in a dry nitrogen stream, and then was cleaned in a UV ozone environment for five minutes.

The transparent support substrate was fixed to a substrate holder in a commercially available vacuum deposition system, and 200 mg of α-NPD was placed onto a molybdenum resistive heating boat, 200 mg of OC-6 as a host compound was placed onto another molybdenum resistive heating boat, 200 mg of BAlq was placed onto another molybdenum resistive heating boat, 100 mg of comparative compound 1 (Ir-12) was placed onto another molybdenum resistive heating boat, and 200 mg of $Alq_3$ was placed onto another molybdenum resistive heating boat. The molybdenum resistive heating boats were then placed in the vacuum vapor deposition system.

After evacuation of the vacuum vessel to $4 \times 10^{-4}$ Pa, the heating boat containing α-NPD was electrically heated to deposit α-NPD onto the transparent support substrate at a deposition rate of 0.1 nm/sec. A hole transport layer with a thickness of 40 nm was thereby formed.

The heating boats respectively containing OC-6 as a host compound and comparative compound 1 (Ir-12) as a dopant compound were electrically heated to codeposit OC-6 and comparative compound 1 (Ir-12) onto the hole transport layer at deposition rates of 0.2 nm/sec and 0.012 nm/sec, respectively. A luminous layer with a thickness of 40 nm was thereby formed. The substrate was maintained at room temperature (25° C.) during the deposition.

The heating boat containing BAlq was then electrically heated to deposit BAlq onto the luminous layer at a deposition rate of 0.1 nm/sec. A hole blocking layer with a thickness of 10 nm was thereby formed.

The heating boat containing $Alq_3$ was then electrically heated to deposit $Alq_3$ onto the hole blocking layer at a deposition rate of 0.1 nm/sec. An electron transport layer with a thickness of 40 nm was thereby formed. The substrate was maintained at room temperature (25° C.) during the deposition.

Subsequently, lithium fluoride and aluminum were deposited into a thickness of 0.5 nm and 110 nm, respectively, to form a cathode. The organic EL element 1-1 was thereby prepared.

The illumination device was evaluated. The non-luminous surface of each prepared organic EL element was covered with a glass case. A glass substrate having a thickness of 300 μm was used as a substrate for sealing. An epoxy photo-curable adhesive (LUXTRACK LC0629B, manufactured by TOAGOSEI CO., LTD.) as a sealant was applied onto the periphery of the glass case. The glass case was attached on the transparent support substrate to cover the cathode. The adhesive was then cured by irradiation with UV light incident on the glass substrate to seal the periphery. An illumination device shown in FIGS. 5 and 6 was thereby produced.

<Preparation of Organic EL Elements 1-2 to 1-45>

The organic EL elements 1-2 to 1-45 were prepared as in the organic EL element 1-1, except that the host compound and the luminescent dopant were replaced with those described in Table 1.

<Evaluation of Organic EL Elements 1-1 to 1-45>

For evaluation, the non-luminous surface of the individual organic EL elements 1-1 to 1-45 prepared above was covered with a glass case. A glass substrate having a thickness of 300 μm was used as a substrate for sealing. An epoxy photo-curable adhesive (LUXTRACK LC0629B, manufactured by TOAGOSEI CO., LTD.) as a sealant was applied onto the periphery of the glass case. The glass case was attached on the transparent support substrate to cover the cathode. The adhesive was then cured by irradiation with UV light incident on the glass substrate to seal the periphery. Illumination devices shown in FIGS. 5 and 6 were thereby produced, and were evaluated for the items described below. The results are shown in Table 1. Table 1 also shows the reorganization energy $\lambda_D$ of the individual luminescent dopants and the molecular weight and the reorganization energy $\lambda_H$ of the individual host compounds. The reorganization energy was determined by the method described above.

<<Luminous Efficiency>>

The individual organic EL elements were driven under a constant current condition of 2.5 mA/cm² at room temperature (25° C.), and were measured for a luminance immediately after the start of lighting (L)[cd/m²] to calculate the luminous efficiency (also referred to as extraction quantum efficiency) (q). The calculated value serves as an indicator of luminous efficiency.

The luminance was measured with CS-1000 (manufactured by KONICA MINOLTA SENSING; INC.). The extraction quantum efficiency of the individual organic EL elements is a relative value to the measured value (set as 100) of the organic EL element 1-1.

<<Lifetime at 50° C. (Half-Life During High-Temperature Preservation) and Chromatic Variation>>

The individual organic EL elements were evaluated for the lifetime at 50° C. by the following method.

The individual organic EL elements were driven under constant conditions at 50° C. and at a constant current such that the initial luminance was 1000 cd/m² to determine a half period when the luminance decreased to half (500 cd/m²) of the initial luminance. The lifetime at 50° C. was thereby determined as an indicator of the durability. The lifetime at 50° C. of the individual organic EL elements is a relative value to that (set as 100) of the comparative organic EL element 1-1.

The individual organic EL elements were also measured for chromaticity of light before and after the driving with CS-1000 (manufactured by KONICA MINOLTA SENSING; INC.) to determine the CIE chromaticity coordinates. For example, the CIE chromaticity coordinates of the organic EL element 1-1 before the driving were represented by (x1,y1) and those after the driving were represented by (x2,y2), and the value ΔC was determined based on the following expression (A).

$$\Delta C = [(x2-x1)^2 + (y2-y1)^2]^{1/2} \qquad \text{Expression (A):}$$

The results are shown in Table 1.

<<Dark Spots>>

The individual organic EL elements were continuously driven under a constant current condition of 2.5 mA/cm² at room temperature (25° C.), and were evaluated by visual observation of the luminous surface. The individual elements were visually observed by randomly selected ten persons, and were ranked into the following categories. The evaluation serves as indicator of the preventive effect against dark spots.

C: five or more persons confirmed dark spots;
B: one to four persons confirmed dark spots; and
A: no person confirmed dark spots.

TABLE 1

| ORGANIC EL ELEMENT NO. | LUMINESCENT DOPANT | $\lambda_D$ [eV] | HOST COMPOUND | $\lambda_H$ [eV] | MOLECULAR WEIGHT OF HOST COMPOUND | LUMINOUS EFFICIENCY | HALF PERIOD UNDER HIGH-TEMPERATURE | CHROMATIC VARIATION $\Delta C$ | DARK SPOTS | REMARKS |
|---|---|---|---|---|---|---|---|---|---|---|
| 1-1 | Ir-12 | 1.20 | OC-6 | 0.15 | 408 | 100 | 100 | 0.15 | C | COMPARATIVE EXAMPLE |
| 1-2 | Ir-12 | 1.20 | 2-3 | 0.29 | 513 | 90 | 85 | 0.14 | C | COMPARATIVE EXAMPLE |
| 1-3 | Ir-12 | 1.20 | 3-5 | 0.12 | 713 | 92 | 110 | 0.17 | C | COMPARATIVE EXAMPLE |
| 1-4 | Ir-12 | 1.20 | 4-1 | 0.24 | 561 | 90 | 78 | 0.13 | C | COMPARATIVE EXAMPLE |
| 1-5 | Ir-12 | 1.20 | A-5 | 0.26 | 560 | 98 | 85 | 0.19 | C | COMPARATIVE EXAMPLE |
| 1-6 | Ir-12 | 1.20 | A-21 | 0.14 | 534 | 77 | 120 | 0.18 | C | COMPARATIVE EXAMPLE |
| 1-7 | Ir-12 | 1.20 | H02 | 0.34 | 547 | 102 | 43 | 0.23 | C | COMPARATIVE EXAMPLE |
| 1-8 | Ir-12 | 1.20 | 1-9 | 0.15 | 576 | 98 | 104 | 0.12 | C | COMPARATIVE EXAMPLE |
| 1-9 | D01 | 0.73 | 3-5 | 0.12 | 713 | 95 | 107 | 0.12 | C | COMPARATIVE EXAMPLE |
| 1-10 | D02 | 0.85 | 3-2 | 0.20 | 637 | 100 | 105 | 0.11 | C | COMPARATIVE EXAMPLE |
| 1-11 | D4 | 0.62 | 1-1 | 0.24 | 561 | 113 | 456 | 0.01 | A | PRESENT INVENTION |
| 1-12 | D4 | 0.62 | 2-3 | 0.29 | 513 | 118 | 465 | 0.00 | A | PRESENT INVENTION |
| 1-13 | D4 | 0.62 | 3-2 | 0.20 | 637 | 124 | 550 | 0.00 | A | PRESENT INVENTION |
| 1-14 | D4 | 0.62 | H03 | 0.34 | 547 | 110 | 255 | 0.04 | A | PRESENT INVENTION |
| 1-15 | D27 | 0.44 | A-5 | 0.26 | 560 | 119 | 480 | 0.02 | A | PRESENT INVENTION |
| 1-16 | D27 | 0.44 | 4-12 | 0.15 | 637 | 127 | 630 | 0.00 | A | PRESENT INVENTION |
| 1-17 | D27 | 0.44 | OC-6 | 0.15 | 408 | 90 | 104 | 0.10 | C | COMPARATIVE EXAMPLE |
| 1-18 | D47 | 0.51 | 2-3 | 0.29 | 513 | 116 | 475 | 0.00 | A | PRESENT INVENTION |
| 1-19 | D47 | 0.51 | 1-1 | 0.24 | 561 | 125 | 550 | 0.00 | A | PRESENT INVENTION |
| 1-20 | D47 | 0.51 | 3-2 | 0.20 | 637 | 120 | 570 | 0.00 | A | PRESENT INVENTION |
| 1-21 | D47 | 0.51 | 4-1 | 0.24 | 561 | 120 | 490 | 0.00 | A | PRESENT INVENTION |
| 1-22 | D70 | 0.56 | A-5 | 0.26 | 560 | 115 | 440 | 0.00 | A | PRESENT INVENTION |
| 1-23 | D70 | 0.56 | 3-2 | 0.20 | 637 | 120 | 611 | 0.00 | A | PRESENT INVENTION |
| 1-24 | D70 | 0.56 | OC-6 | 0.15 | 408 | 84 | 103 | 0.10 | C | COMPARATIVE EXAMPLE |
| 1-25 | D35 | 0.50 | 4-12 | 0.15 | 637 | 124 | 620 | 0.00 | A | PRESENT INVENTION |
| 1-26 | D35 | 0.50 | 3-5 | 0.12 | 713 | 125 | 635 | 0.00 | A | PRESENT INVENTION |
| 1-27 | D35 | 0.50 | H03 | 0.34 | 547 | 112 | 278 | 0.04 | A | PRESENT INVENTION |
| 1-28 | D35 | 0.50 | 4-1 | 0.24 | 561 | 126 | 634 | 0.00 | A | PRESENT INVENTION |
| 1-29 | D52 | 0.68 | a-21 | 0.26 | 534 | 124 | 620 | 0.02 | A | PRESENT INVENTION |
| 1-30 | D52 | 0.68 | 4-1 | 0.24 | 561 | 120 | 534 | 0.00 | A | PRESENT INVENTION |
| 1-31 | D52 | 0.68 | OC-6 | 0.15 | 408 | 90 | 75 | 0.10 | C | COMPARATIVE EXAMPLE |
| 1-32 | D41 | 0.58 | 1-2 | 0.28 | 547 | 117 | 481 | 0.00 | A | PRESENT INVENTION |
| 1-33 | D41 | 0.58 | 2-3 | 0.29 | 513 | 114 | 475 | 0.00 | A | PRESENT INVENTION |
| 1-34 | D41 | 0.58 | 3-5 | 0.12 | 713 | 123 | 620 | 0.00 | A | PRESENT INVENTION |
| 1-35 | D41 | 0.58 | H03 | 0.34 | 547 | 110 | 285 | 0.04 | A | PRESENT INVENTION |
| 1-36 | D10 | 0.55 | a-21 | 0.14 | 534 | 119 | 504 | 0.02 | A | PRESENT INVENTION |
| 1-37 | D10 | 0.55 | H03 | 0.34 | 547 | 111 | 284 | 0.04 | A | PRESENT INVENTION |
| 1-38 | D10 | 0.55 | OC-6 | 0.15 | 408 | 92 | 89 | 0.10 | C | COMPARATIVE EXAMPLE |
| 1-39 | D18 | 0.42 | 1-1 | 0.24 | 561 | 120 | 546 | 0.00 | A | PRESENT INVENTION |
| 1-40 | D18 | 0.42 | 2-3 | 0.29 | 513 | 115 | 537 | 0.00 | A | PRESENT INVENTION |
| 1-41 | D18 | 0.42 | 3-5 | 0.12 | 713 | 133 | 690 | 0.00 | A | PRESENT INVENTION |
| 1-42 | D18 | 0.42 | 4-12 | 0.15 | 637 | 124 | 647 | 0.00 | A | PRESENT INVENTION |
| 1-43 | D18 | 0.42 | 1-9 | 0.15 | 576 | 120 | 625 | 0.00 | A | PRESENT INVENTION |
| 1-44 | D18 | 0.42 | H03 | 0.34 | 547 | 113 | 275 | 0.04 | A | PRESENT INVENTION |
| 1-45 | D18 | 0.42 | OC-6 | 0.15 | 408 | 68 | 95 | 0.10 | C | COMPARATIVE EXAMPLE |

The results shown in Table 1 demonstrate that the inventive organic EL elements have higher luminous efficiency, lower deterioration under high temperature, and less dark spots and chromatic variation, in comparison with the comparative organic EL elements.

Example 2

Preparation of Organic EL Element 2-1

Indium tin oxide (ITO) with a thickness of 100 nm was deposited on a glass substrate with dimensions of 100 mm by 100 mm by 1.1 mm (NA 45 manufactured by AvanStrate Inc.) and was patterned into an anode. A transparent support substrate provided with the transparent ITO electrode was ultrasonically cleaned in isopropyl alcohol, was dried in a dry nitrogen stream, and then was cleaned in a UV ozone environment for five minutes.

A solution of 70% poly(3,4-ethylene dioxythiophene)-polystyrenesulfonate (PEDOT/PSS; Baytron P Al 4083 manufactured by Bayer AG) in pure water was coated by spin coating onto the transparent support substrate, and the substrate was then dried at 200° C. for one hour. A first hole transport layer with a thickness of 30 nm was thereby formed.

A solution of Poly(N,N'-bis(4-butylphenyl)-N,N'-bis(phenyl))benzidine (ADS-254 manufactured by American Dye Source, Inc.) in chlorobenzene, which is a hole transport material, was coated by spin coating onto the first hole transport layer, and the substrate was then dried by heating at 150° C. for one hour. A second hole transport layer with a thickness of 40 nm was thereby formed.

A solution of OC-6 as a host compound and comparative compound 1 (Ir-12) as a dopant compound in butyl acetate was coated by spin coating onto the second hole transport layer, and the substrate was then dried by heating at 120° C. for one hour. A luminous layer with a thickness of 40 nm was thereby formed.

A 1-butanol solution of OC-18, which is an electron transport material, was coated by spin coating onto the luminous layer. An insolubilized electron transport layer with a thickness of 20 nm was thereby formed.

The support substrate was then placed in the vacuum deposition system, and the vacuum vessel was evacuated to $4\times10^{-4}$ Pa. Lithium fluoride with a thickness of 1.0 nm was deposited into an electron injection layer, and aluminum with a thickness of 110 nm was deposited into a cathode. An organic EL element 2-1 was thereby prepared.

<Preparation of Organic EL Elements 2-2 to 2-45>

The organic EL elements 2-2 to 2-45 were prepared as in the organic EL element 1-1, except that the host compound OC-6 and the dopant Ir-12 of the luminous layer were replaced with compounds described in Table 2.

<Evaluation of Organic EL Elements 2-1 to 2-45>

For evaluation, the non-luminous surface of the individual organic EL elements 2-1 to 2-45 prepared above was covered with a glass case. A glass substrate having a thickness of 300 μm was used as a substrate for sealing. An epoxy photo-curable adhesive (LUXTRACK LC0629B, manufactured by TOAGOSEI CO., LTD.) as a sealant was applied onto the periphery of the glass case. The glass case was attached on the transparent support substrate to cover the cathode. The adhesive was then cured by irradiation with UV light incident on the glass substrate to seal the periphery. Illumination devices shown in FIGS. 5 and 6 were thereby produced. The individual illumination devices were evaluated for the items described below, and the results are shown in Table 2. Table 2 also shows the reorganization energy $\lambda_D$ of the individual luminescent dopants and the molecular weight and the reorganization energy $\lambda_H$ of the individual host compounds. The reorganization energy was determined by the method described above.

<<Luminous Efficiency>>

The individual organic EL elements were driven under a constant current condition of 2.5 mA/cm² at room temperature (25° C.), and were measured for a luminance immediately after the start of the lighting (L)[cd/m²] to calculate the luminous efficiency (extraction quantum efficiency) (q). The calculated value serves as an indicator of luminous efficiency.

The luminance was measured with CS-1000 (manufactured by KONICA MINOLTA SENSING; INC.). The extraction quantum efficiency of the individual organic EL elements is a relative value to that (set as 100) of the organic EL element 2-1.

<<Initial Degradation>>

The individual elements were evaluated for initial degradation as an indicator of durability in accordance with the method described below. During the measurement of the half period under high-temperature preservation, the time period when the luminance decreased to 90% of the initial luminance was measured as an indicator of initial degradation. The initial degradation is a relative value to that (set as 100) of the comparative organic EL element 2-1. The initial degradation was calculated based on the following expression:

Initial degradation=[(time period when the luminance of the organic EL element 2-1 decreased to 90%)/(time period when the luminance of each element decreased to 90%)]×100

The smaller value of initial degradation indicates that the element has less initial degradation.

<<Retention Stability of Coating Solution of the Luminous Layer>>

The coating solution used in formation of the luminous layer in preparation of the organic EL element 2-1 (a solution prepared by dissolving the mixture of OC-6 (60 mg) and comparative compound 1 (Ir-12, 3.0 mg) in 12 ml of toluene) was left to stand at room temperature (25° C.) for one hour to observe the precipitation for evaluation of the retention stability of the coating solution. The following evaluation serves as an indicator of the preventive effect against dark spots.

A: No precipitation was visually observed;

B: Slight precipitation was visually observed; and

C: Remarkable precipitation was visually observed.

TABLE 2

| ORGANIC EL ELEMENT No. | LUMINESCENT DOPANT | $\lambda D$ [eV] | HOST COMPOUND | $\lambda H$ [eV] | MOLECULAR WEIGHT OF HOST COMPOUND | LUMINOUS EFFICIENCY | INITIAL DEGRADATION | RETENTION STABILITY | REMARKS |
|---|---|---|---|---|---|---|---|---|---|
| 2-1 | Ir-12 | 1.20 | OC-6 | 0.15 | 408 | 100 | 100 | C | COMPARATIVE EXAMPLE |
| 2-2 | Ir-12 | 1.20 | 2-3 | 0.29 | 513 | 100 | 88 | C | COMPARATIVE EXAMPLE |
| 2-3 | Ir-12 | 1.20 | 1-9 | 0.15 | 576 | 88 | 60 | B | COMPARATIVE EXAMPLE |
| 2-4 | Ir-12 | 1.20 | 4-1 | 0.24 | 561 | 99 | 75 | C | COMPARATIVE EXAMPLE |
| 2-5 | Ir-12 | 1.20 | a-5 | 0.26 | 560 | 103 | 56 | C | COMPARATIVE EXAMPLE |
| 2-6 | Ir-12 | 1.20 | a-21 | 0.14 | 534 | 89 | 77 | B | COMPARATIVE EXAMPLE |
| 2-7 | Ir-12 | 1.20 | H01 | 0.35 | 547 | 98 | 90 | C | COMPARATIVE EXAMPLE |
| 2-8 | Ir-12 | 1.20 | OC-6 | 0.15 | 408 | 90 | 104 | C | COMPARATIVE EXAMPLE |
| 2-9 | D01 | 0.73 | 3-5 | 0.12 | 713 | 70 | 78 | B | COMPARATIVE EXAMPLE |
| 2-10 | D02 | 0.85 | 3-2 | 0.20 | 637 | 60 | 90 | C | COMPARATIVE EXAMPLE |
| 2-11 | D4 | 0.62 | 1-1 | 0.24 | 561 | 121 | 35 | A | PRESENT INVENTION |
| 2-12 | D4 | 0.62 | 2-8 | 0.18 | 637 | 125 | 32 | A | PRESENT INVENTION |
| 2-13 | D4 | 0.62 | 3-2 | 0.20 | 637 | 127 | 36 | A | PRESENT INVENTION |
| 2-14 | D4 | 0.56 | 4-11 | 0.18 | 579 | 124 | 30 | A | PRESENT INVENTION |
| 2-15 | D27 | 0.44 | a-5 | 0.26 | 560 | 132 | 37 | A | PRESENT INVENTION |
| 2-16 | D27 | 0.44 | 4-1 | 0.24 | 561 | 130 | 33 | A | PRESENT INVENTION |
| 2-17 | D27 | 0.44 | OC-6 | 0.15 | 408 | 74 | 90 | C | COMPARATIVE EXAMPLE |
| 2-18 | D47 | 0.51 | 2-3 | 0.29 | 513 | 126 | 32 | A | PRESENT INVENTION |
| 2-19 | D47 | 0.51 | 1-1 | 0.24 | 561 | 122 | 41 | A | PRESENT INVENTION |
| 2-20 | D47 | 0.51 | 3-2 | 0.20 | 637 | 129 | 37 | A | PRESENT INVENTION |
| 2-21 | D47 | 0.51 | H04 | 0.35 | 547 | 112 | 49 | A | PRESENT INVENTION |
| 2-22 | D70 | 0.56 | a-5 | 0.26 | 560 | 130 | 35 | A | PRESENT INVENTION |
| 2-23 | D70 | 0.56 | 4-11 | 0.18 | 579 | 120 | 32 | A | PRESENT INVENTION |
| 2-24 | D70 | 0.56 | OC-6 | 0.15 | 408 | 82 | 95 | C | COMPARATIVE EXAMPLE |

TABLE 2-continued

| ORGANIC EL ELEMENT No. | LUMI-NES-CENT DOPANT | λD [eV] | HOST COM-POUND | λH [eV] | MOLECULAR WEIGHT OF HOST COMPOUND | LUMINOUS EFFICIENCY | INITIAL DEGRADATION | RETEN-TION STABILITY | REMARKS |
|---|---|---|---|---|---|---|---|---|---|
| 2-25 | D35 | 0.50 | 4-12 | 0.15 | 637 | 131 | 30 | A | PRESENT INVENTION |
| 2-26 | D35 | 0.50 | H04 | 0.35 | 547 | 112 | 48 | A | PRESENT INVENTION |
| 2-27 | D35 | 0.50 | 3-2 | 0.20 | 637 | 132 | 36 | A | PRESENT INVENTION |
| 2-28 | D35 | 0.50 | 4-1 | 0.24 | 561 | 131 | 36 | A | PRESENT INVENTION |
| 2-29 | D52 | 0.68 | a-5 | 0.26 | 560 | 128 | 38 | A | PRESENT INVENTION |
| 2-30 | D52 | 0.68 | 4-11 | 0.18 | 579 | 132 | 34 | A | PRESENT INVENTION |
| 2-31 | D52 | 0.68 | OC-6 | 0.15 | 408 | 84 | 90 | C | COMPARATIVE EXAMPLE |
| 2-32 | D41 | 0.58 | 1-2 | 0.28 | 547 | 125 | 30 | A | PRESENT INVENTION |
| 2-33 | D41 | 0.58 | 2-3 | 0.29 | 513 | 123 | 34 | A | PRESENT INVENTION |
| 2-34 | D41 | 0.58 | 3-5 | 0.12 | 713 | 126 | 32 | A | PRESENT INVENTION |
| 2-35 | D41 | 0.58 | 4-1 | 0.24 | 561 | 125 | 34 | A | PRESENT INVENTION |
| 2-36 | D10 | 0.55 | 4-11 | 0.18 | 579 | 127 | 32 | A | PRESENT INVENTION |
| 2-37 | D10 | 0.55 | a-5 | 0.26 | 560 | 125 | 34 | A | PRESENT INVENTION |
| 2-38 | D10 | 0.55 | OC-6 | 0.15 | 408 | 82 | 98 | C | COMPARATIVE EXAMPLE |
| 2-39 | D18 | 0.42 | 3-11 | 0.17 | 806 | 130 | 25 | A | PRESENT INVENTION |
| 2-40 | D18 | 0.42 | 2-3 | 0.29 | 513 | 127 | 30 | A | PRESENT INVENTION |
| 2-41 | D18 | 0.42 | 1-9 | 0.15 | 576 | 132 | 31 | A | PRESENT INVENTION |
| 2-42 | D18 | 0.42 | 4-13 | 0.13 | 713 | 130 | 27 | A | PRESENT INVENTION |
| 2-43 | D18 | 0.42 | a-21 | 0.14 | 534 | 130 | 25 | A | PRESENT INVENTION |
| 2-44 | D18 | 0.42 | H04 | 0.35 | 547 | 114 | 47 | A | PRESENT INVENTION |
| 2-45 | D18 | 0.42 | OC-6 | 0.15 | 408 | 65 | 85 | C | COMPARATIVE EXAMPLE |

The results shown in Table 2 demonstrate that the inventive organic EL elements have higher luminous efficiency, less deterioration under high temperature, and high retention stability of the coating solution in comparison with the comparative organic EL elements.

Example 3

The organic EL element 1-11 (blue light-emitting organic EL element) prepared in Example 1, an organic EL element prepared as in the organic EL element 1-1 and containing Ir-1 (green light-emitting organic EL element) in place of the luminescent dopant (D4 in the organic EL element 1-11), and an organic EL element prepared as in the organic EL element 1-1 and containing Ir-9 (red light-emitting organic EL element) in place of the luminescent dopant (D4 in the organic EL element 1-11) were arrayed on a single substrate, thereby preparing a full-color display device (display) of active matrix mode shown in FIG. 1.

The prepared full-color display device 1 was driven and was confirmed to display clear full-color moving images with low voltage, high luminance, long-term durability, less voltage rise at the start of driving the device, high luminous efficiency, and high stability over time.

Example 4

Preparation of White Light-Emitting Organic EL Element

Indium tin oxide (ITO) with a thickness of 100 nm was deposited on a glass substrate with dimensions of 100 mm by 100 mm by 1.1 mm (NA 45 manufactured by NH Technoglass Corporation) and was patterned into an anode. A transparent support substrate provided with the transparent ITO electrode was ultrasonically cleaned in isopropyl alcohol, was dried in a dry nitrogen stream, and then was cleaned in a UV ozone environment for five minutes.

A solution of 70% (by mass) poly(3,4-ethylene dioxythiophene)-polystyrenesulfonate (PEDOT/PSS; Baytron P Al 4083 manufactured by Bayer AG) in pure water was coated by spin coating onto the transparent support substrate at 3000 rpm for 30 seconds, and the substrate was dried at 200° C. for one hour. A hole transport layer with a thickness of 30 nm was thereby formed.

The substrate was transferred into a nitrogen atmosphere, and a solution of the host compound 4-2 (60 mg) and the dopant compounds Ir-1 (1.2 mg), D7 (12.0 mg) and Ir-9 (1.2 mg) in 6 ml of toluene was coated by spin coating onto the hole transport layer at 1000 rpm for 30 seconds, and the substrate was heated at 150° C. for one hour in the vacuum. A luminous layer was thereby formed.

A solution of BCP (20 mg) dissolved in 6 ml of cyclohexane was coated by spin coating at 1000 rpm for 30 seconds, and the substrate was heated at 80° C. for one hour in the vacuum. A first electron transport layer was thereby formed.

The substrate was then fixed to a substrate holder in a vacuum deposition system, and 200 mg of $Alq_3$ was placed onto a molybdenum resistive heating boat, which was then placed in the vacuum deposition system. After evacuation of the vacuum vessel to $4 \times 10^4$ Pa, the heating boat containing $Alq_3$ was electrically heated to deposit $Alq_3$ onto the first electron transport layer at a deposition rate of 0.1 nm/sec. A second electron transport layer with a thickness of 40 nm was thereby formed. The substrate was maintained at room temperature (25° C.) during the deposition.

Subsequently, lithium fluoride and aluminum were deposited into a thickness of 0.5 nm and 110 nm, respectively, to form a cathode. A white light-emitting organic EL element was thereby produced.

The white light-emitting organic EL element was electrically driven, and emitted substantially white light, which indicates that the element can be applied to an illumination device. An organic EL element containing other compounds exemplified above instead of the host compound 4-2 also emitted white light.

Although the present invention is described in detail by way of embodiments and Examples, the gist of the present invention is not limited thereto. The technical scope of the present invention should be determined based on the scope of the appended claims. Modifications and variations will be obvious to those skilled in the art based on the description.

For example, display devices and illumination devices including the organic EL element of the present invention may have any shape and application, and may be applied to any other devices without departing from the gist of the present invention. Materials for the organic EL element of the invention may be used in combination with other materials such as paints, catalysts, oxidants, antioxidants, light stabilizers, antistatic agents, inorganic materials with high thermal conductivity, preservative agents, and lubricants, depending on applications of the element.

The thin films composed of materials for the organic EL element of the present invention may be deposited onto the entire or a part of a support substrate or a film under the film, and may be formed with unevenness for some purposes.

INDUSTRIAL APPLICABILITY

As described above, the present invention provides an organic electroluminescence element, an illumination device and a display device which have a low driving voltage, high luminous efficiency, long-term durability, reduced dark spots, and high retention of coating solution.

The invention claimed is:

1. An organic electroluminescence element comprising:
an anode;
a cathode; and
a luminous layer, wherein
the luminous layer includes:
a luminescent dopant having a reorganization energy of 0 eV to 0.7 eV in electron transition from a ground state ($S_0$) to a lowest excited triplet state ($T_1$); and
a host compound having a reorganization energy of 0 eV to 0.3 eV in electron transfer reaction between a ground state ($S_0$) and an anionic radical state (AR), and having a molecular weight within a range of 500 to 3000,
wherein the host compound is represented by one of Formula (1-A), Formula (1-B), Formula (2-A), Formula (3-A), Formula (3-B), and Formula (3-C):

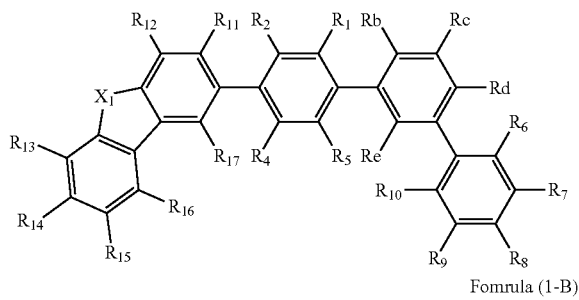

Formula (1-A)

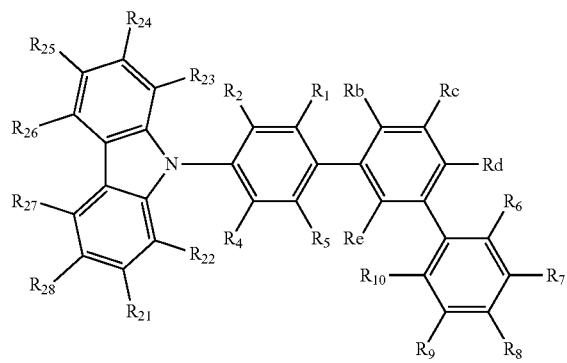

Formula (1-B)

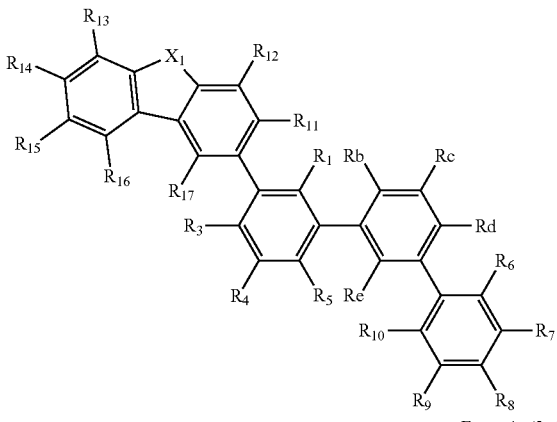

Formula (2-A)

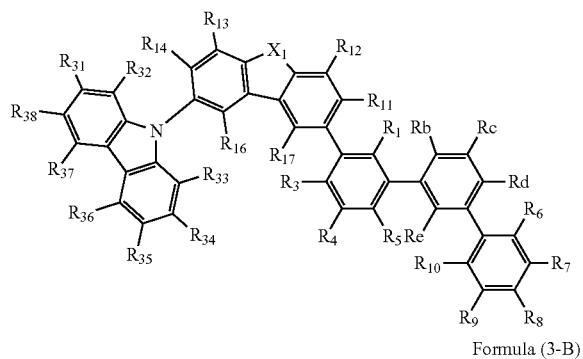

Formula (3-A)

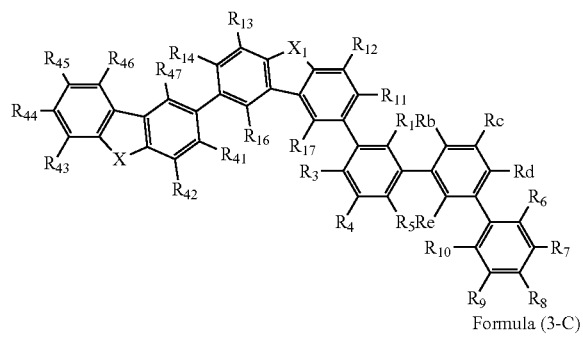

Formula (3-B)

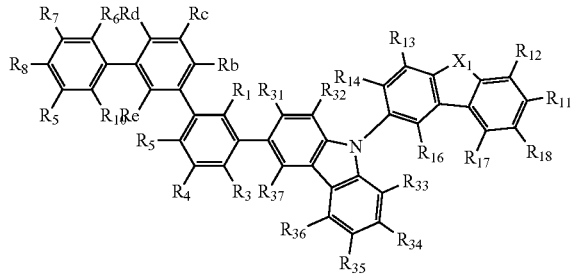

Formula (3-C)

where, in Formula (1-A), $R_1$, $R_2$, $R_4$ to $R_7$, $R_9$ to $R_{17}$, and Rb to Re each represent a hydrogen atom, an alkyl group or an aromatic group, and $R_8$ represents a hydrogen atom; $X_1$ represents an oxygen atom, a sulfur atom, or NRx; and Rx represents a hydrogen atom or a substituent group, in Formula (1-B), $R_1$, $R_2$, $R_4$ to $R_7$, $R_9$, $R_{10}$, $R_{21}$ to $R_{28}$, and Rb to Re each represent a hydrogen atom, an alkyl group or an aromatic group, at least one of $R_7$ and $R_9$ is a substituent group, and $R_8$ represents a hydrogen atom, in Formula (2-A), $R_1$, $R_3$ to $R_7$, $R_9$ to $R_{17}$, and Rb to Re each represent a hydrogen atom, an alkyl group or an aromatic group; $R_8$ represents a hydrogen atom; and $X_1$ has the same definition as $X_1$ in Formula (1-A), in Formula (3-A), $R_1$, $R_3$ to $R_7$, $R_9$ to $R_{14}$, $R_{16}$, $R_{17}$, $R_{31}$ to $R_{38}$, and Rb to Re each represent a hydrogen atom or a substituent group; $R_8$ represents a hydrogen atom; and $X_1$ has the same definition as $X_1$ in Formula (1-A), in Formula (3-B), $R_1$, $R_3$ to $R_7$, $R_9$ to $R_{14}$, $R_{16}$, $R_{17}$, $R_{41}$ to $R_{47}$, and Rb to Re each represent a hydrogen atom or a substituent group; $R_8$ represents a hydrogen atom; and X and $X_1$ have the same definition as $X_1$ in Formula (1-A), and in Formula (3-C), $R_1$, $R_3$ to $R_7$, $R_9$ to $R_{14}$, $R_{16}$ to $R_{18}$, $R_{31}$ to $R_{37}$, and Rb to Re each represent a hydrogen atom or a substituent group; $R_8$ represents a hydrogen atom; and $X_1$ has the same definition as $X_1$ in Formula (1-A).

2. The organic electroluminescence element of claim 1, wherein the luminescent dopant has the reorganization energy of 0 eV to 0.5 eV in the electron transition from the ground state ($S_0$) to the lowest excited triplet state ($T_1$).

3. The organic electroluminescence element of claim 1, wherein the host compound has the reorganization energy of 0 eV to 0.15 eV in the electron transfer reaction between the ground state ($S_0$) and the anionic radical state (AR).

4. The organic electroluminescence element of claim 1, wherein the luminescent dopant has the reorganization energy of 0 eV to 0.5 eV in the electron transition from the ground state ($S_0$) to the lowest excited triplet state ($T_1$).

5. The organic electroluminescence element of claim 1, wherein the luminescent dopant is a phosphorescent compound.

6. The organic electroluminescence element of claim 5, wherein the phosphorescent compound is represented by Formula (A1):

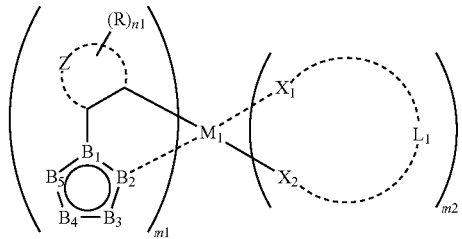

Formula (A1)

where R represents a substituent group; Z represents a nonmetallic atomic group necessary for formation of a five- to seven-member ring; n1 represents an integer of 0 to 5; $B_1$ to $B_5$ each represent a carbon atom, CRa, a nitrogen atom, NRb, an oxygen atom, or a sulfur atom, with the proviso that at least one of $B_1$ to $B_5$ represents a nitrogen atom; Ra and Rb each represent a hydrogen atom or a substituent group; $B_1$ to $B_5$ are five atoms forming an aromatic nitrogen-containing heterocycle; $B_5$ and Z may be bonded to each other to form a ring; $M_1$ represents a metal belonging to any one of Groups 8 to 10 in the periodic table; $X_1$ and $X_2$ each represent a carbon atom, a nitrogen atom, or an oxygen atom; $L_1$ represents an atomic group forming a bidentate ligand together with $X_1$ and $X_2$; and m1 represents an integer of 1 to 3 and m2 represents an integer of 0 to 2, with the proviso that m1+m2 is 2 or 3.

7. The organic electroluminescence element of claim 1, wherein the luminous layer is formed with a coating solution.

8. The organic electroluminescence element of claim 1, wherein the luminous layer emits white light.

9. An illumination device comprising the organic electroluminescence element of claim 1.

10. A display device comprising the organic electroluminescence element of claim 1.

* * * * *